US009356151B2

(12) United States Patent
Tour et al.

(10) Patent No.: US 9,356,151 B2
(45) Date of Patent: May 31, 2016

(54) FABRICATION OF GRAPHENE NANORIBBONS AND NANOWIRES USING A MENISCUS AS AN ETCH MASK

(71) Applicants: James M. Tour, Bellaire, TX (US); Vera Abramova, Houston, TX (US); Alexander Slesarev, Houston, TX (US)

(72) Inventors: James M. Tour, Bellaire, TX (US); Vera Abramova, Houston, TX (US); Alexander Slesarev, Houston, TX (US)

(73) Assignee: WILLIAM MARSH RICE UNIVERSITY, Houston, TX (US)

( * ) Notice: Subject to any disclaimer, the term of this patent is extended or adjusted under 35 U.S.C. 154(b) by 195 days.

(21) Appl. No.: 14/171,642

(22) Filed: Feb. 3, 2014

(65) Prior Publication Data

US 2014/0220773 A1     Aug. 7, 2014

Related U.S. Application Data

(60) Provisional application No. 61/759,730, filed on Feb. 1, 2013.

(51) Int. Cl.
| | |
|---|---|
| *H01L 21/44* | (2006.01) |
| *H01L 29/786* | (2006.01) |
| *C01B 31/04* | (2006.01) |
| *H01L 21/3065* | (2006.01) |
| *H01L 21/311* | (2006.01) |
| *H01L 21/3213* | (2006.01) |
| *H01L 29/66* | (2006.01) |
| *B82Y 40/00* | (2011.01) |

(52) U.S. Cl.
CPC ...... *H01L 29/78684* (2013.01); *C01B 31/0438* (2013.01); *C01B 31/0484* (2013.01); *H01L 21/3065* (2013.01); *H01L 21/31116* (2013.01); *H01L 21/32131* (2013.01); *H01L 29/66742* (2013.01); *H01L 29/78606* (2013.01); *H01L 29/78696* (2013.01); *B82Y 40/00* (2013.01)

(58) Field of Classification Search
None
See application file for complete search history.

(56) References Cited

U.S. PATENT DOCUMENTS

| 5,695,658 A * | 12/1997 | Alwan | G03F 7/164 216/11 |
|---|---|---|---|
| 2011/0298132 A1* | 12/2011 | Naeemi | B82Y 10/00 257/746 |

(Continued)

OTHER PUBLICATIONS

Franz et al., Residual free reactive ion etching of the Bell contact Ti/Pt/Au, Mater. Sci. in Semiconductor Processing 5, 45-50 (2002).

(Continued)

*Primary Examiner* — Evan Pert
*Assistant Examiner* — Shaka White
(74) *Attorney, Agent, or Firm* — Winstead PC

(57) ABSTRACT

In some embodiments, the present disclosure pertains to methods of preparing graphene nanoribbons from a graphene film associated with a meniscus, where the method comprises patterning the graphene film while the meniscus acts as a mask above a region of the graphene film, and where the patterning results in formation of graphene nanoribbons from the meniscus-masked region of the graphene film. Additional embodiments of the present disclosure pertain to methods of preparing wires from a film associated with a meniscus, where the method comprises patterning the film while the meniscus acts as a mask above a region of the film, and where the patterning results in formation of a wire from the meniscus-masked region of the film. Additional embodiments of the present disclosure pertain to chemical methods of preparing wires from water-reactive materials.

63 Claims, 31 Drawing Sheets

(56) References Cited

U.S. PATENT DOCUMENTS

| | | | | |
|---|---|---|---|---|
| 2013/0015581 A1* | 1/2013 | Wann | ............... | H01L 23/53276 257/751 |
| 2014/0051229 A1* | 2/2014 | Dimitrakopoulos | ... | B82Y 10/00 438/458 |

OTHER PUBLICATIONS

Novoselov et al., Electric Field Effect in Atomically Thin Carbon Films, Science 2004, 306, 666-669.

Han et al., Energy Band-Gap Engineering of Graphene Nanoribbons, Phys. Rev. Lett. 2007, 98, 206805.

Kosynkin et al., Longitudinal Unzipping of Carbon Nanotubes to Form Graphene Nanoribbons, Nature 2009, 458, 872-826.

Kosynkin et al., Highly Conductive Graphene Nanoribbons by Longitudinal Splitting of Carbon Nanotubes Using Potassium Vapor, ACS Nano 2011, 5, 968-974.

Li et al., Chemically Derived, Ultrasmooth Graphene Nanoribbon Semiconductors, Science 2008, 319, 1229-1232.

Fursina et al., Nanogaps with Very Large Aspect Ratios for Electrical Measurements, Appl. Phys. Lett. 2008, 92, 113102.

Stampfer et al., Energy Gaps in Etched Graphene Nanoribbons, Phys. Rev. Lett. 2009, 102, 056403.

Han et al., Electron Transport in Disordered Graphene Nanoribbons, Phys. Rev. Lett. 2010, 104, 056801.

Williams et al., Etch Rates for Micromachining Processing—Part II. J. Microelectromech, Systems 2003, 12, 761-778.

Li et al., Large-Area Synthesis of High-Quality and Uniform Graphene Films on Copper Foils, Science 2009, 324, 1312-1314.

Ferrari et al., Raman Spectrum of Graphene and Graphene Layers, Phys. Rev. Lett. 2006, 97, 187401.

Thiel et al., The Interaction of Water with Solid Surfaces-Fundamental Aspects, Surf. Sci. Rep. 1987, 7, 211-385.

Famá et al., Sputtering of Ice by Low-Energy Ions, Surf. Sci. 2008, 602, 156-161.

Kalbac et al., The Influence of Strong Electron and Hole Doping on the Raman Intensity of Chemical Vapor-Deposition Graphene, ACS Nano 2010, 4, 6055-6063.

Mohiuddin et al., Uniaxial Strain in Graphene by Raman Spectroscopy: G Peak Splitting, Grüneisen Parameters, and Sample Orientation, Phys. Rev. B 2009, 79, 205433.

Dresselhaus et al., Perspectives on Carbon Nanotubes and Graphene Raman Spectroscopy, Nano Lett. 2010, 10, 751-758.

Son et al., Energy Gaps in Graphene Nanoribbons, Phys. Rev. Lett. 2006, 97, 216803.

Yang et al., Quasiparticle Energies and Band Gaps in Graphene Nanoribbons, Phys. Rev. Lett. 2007, 99, 186801.

Masubuchi et al., Fabrication of Graphene Nanoribbon by Local Anodic Oxidation Lithography using Atomic Force Microscope, Appl. Phys. Lett. 2009, 94, 082107.

Tapasztó et al., Tailoring the Atomic Structure of Graphene Nanoribbons by Scanning Tunneling Microscope Lithography, Nat. Nanotechnol. 2008, 3, 397-401.

Bai et al., Rational Fabrication of Graphene Nanoribbons Using a Nanowire Etch Mask, Nano Lett. 2009, 9, 2083-2087.

Shi et al., Graphene Edge Lithography, Nano Lett. 2012, 12, 4642-4646.

Jiao et al., Densely Aligned Graphene Nanoribbons at ~35 nm Pitch, Nano Res. 2012, 5, 292-296.

Liu et al., Epitaxial Graphene Nanoribbon Array Fabrication Using BCP-Assisted Nanolithography, ACS Nano 2012, 6, 6786-6792.

Liang et al.,Transport Characteristics of Multichannel Transistors Made from Densely Aligned Sub-10 nm Half-Pitch Graphene Nanoribbons, ACS Nano 2012, 6, 9700-9710.

Jiao et al., Narrow Graphene Nanoribbons from Carbon Nanotubes, Nature 2009, 458, 877-880.

Sprinkle et al., Scalable Templated Growth of Graphene Nanoribbons on SiC., Nat. Nanotechnol. 2010, 5, 727-731.

Kato et al., Site- and Alignment-Controlled Growth of Graphene Nanoribbons from Nickel Nanobars, Nat. Nanotechnol. 2012, 7, 651-656.

Cai et al., Atomically Precise Bottom-Up Fabrication of Graphene Nanoribbons, Nature 2010, 466, 470-473.

Oostinga et al., Magnetotransport Through Graphene Nanoribbons, Phys. Rev. B 2010, 81, 193408.

Das et al., Monitoring Dopants by Raman Scattering in an Electrochemically Top-Gated Graphene Transistor, Nat. Nanotechnol. 2008, 3, 210-215.

Ryu et al., Raman Spectroscopy of Lithographically Patterned Graphene Nanoribbons, ACS Nano 2011, 5, 4123-4130.

Xue et al., Scanning Tunneling Microscopy and Spectroscopy of Ultra-Flat Graphene on Hexagonal Boron Nitride, Nat. Mater. 2011, 10, 282-285.

Bischoff et al., Reactive-Ion-Etched Graphene Nanoribbons on a Hexagonal Boron Nitride Substrate, Appl. Phys. Lett. 2012, 101, 203103.

Gallagher et al., Disorder-Induced Gap Behavior in Graphene Nanoribbons, Phys. Rev. B 2010, 81, 115409.

Sols et al., Coulomb Blockade in Graphene Nanoribbons, Phys. Rev. Lett. 2007, 99, 166803.

Park et al., Energy Gaps and Stark Effect in Boron Nitride Nanoribbons, Nano Lett. 2008, 8, 2200-2203.

Brunauer et al., Adsorption of Gases in Multimolecular Layers, J. Am. Chem. Soc. 1938, 60, 309-319.

Hendriksen et al., Heats of Adsorption of Water on a- and g-Alumina, J. of Catalysis 1972, 24, 82-87.

Rafiee et al., Wetting Transparency of Graphene, Nat. Mater. 2012, 11, 217-222.

Gibson et al., Sputtering of Ordered Ice Ih Adsorbed on Rh(111) Using Hyperthermal Neutral Ar Atoms, J. Phys. Chem. C 2009, 113, 13325-13330.

Gorbachev et al., Hunting for Monolayer Boron Nitride: Optical and Raman Signatures, Small 2011, 7, 465-468.

Krauss et al., Raman Scattering at Pure Graphene Zigzag Edges, Nano Lett. 2010, 10, 4544-4548.

Cançado et al., Anisotropy of the Raman Spectra of Nanographite Ribbons, Phys. Rev. Lett. 2004, 93, 047403.

Malard et al., Raman Spectroscopy in Graphene, Phys. Rep. 2009, 473, 51-87.

Gillen et al., Vibrational Properties of Graphene Nanoribbons by First-Principles Calculations, Phys. Rev. B 2009, 80, 155418.

Yang et al., Observation of Raman G-Peak Split for Graphene Nanoribbons with Hydrogen-Terminated Zigzag Edges, Nano Lett. 2011, 11, 4083-4088.

Shylau et al., Capacitance of Graphene Nanoribbons, Phys. Rev. B 2009, 80, 205402.

Gannett et al., Boron Nitride Substrates for High Mobility Chemical Vapor Deposited Graphene, Appl. Phys. Lett. 2011, 98, 242105.

\* cited by examiner

A

B

A

B

FABRICATION OF GRAPHENE NANORIBBONS AND NANOWIRES USING A MENISCUS AS AN ETCH MASK

CROSS-REFERENCE TO RELATED APPLICATIONS

This application claims priority to U.S. Provisional Patent Application No. 61/759,730, filed on Feb. 1, 2013. The entirety of the aforementioned application is incorporated herein by reference.

STATEMENT REGARDING FEDERALLY SPONSORED RESEARCH

This invention was made with government support under Grant No. FA9550-09-1-0581, awarded by the U.S. Department of Defense; Grant No. N00014-09-1-1066, awarded by the U.S. Department of Defense; and Grant No. FA9550-12-1-0035, awarded by the U.S. Department of Defense. The government has certain rights in the invention.

BACKGROUND

Current methods of fabricating narrow graphene nanoribbons and narrow nanowires at precise locations on a surface suffer from numerous limitations, including the ability to control width, shape, size, and pattern. Therefore, a need exists for more scalable and controllable methods of fabricating graphene nanoribbons and nanowires.

SUMMARY

In some embodiments, the present disclosure pertains to methods of preparing graphene nanoribbons from a graphene film that is associated with a meniscus. In some embodiments, the method comprises patterning the graphene film while the meniscus acts as a mask above a region of the graphene film (i.e., a meniscus-masked region). In some embodiments, the patterning results in formation of graphene nanoribbons from the meniscus-masked region of the graphene film. In some embodiments, the meniscus-masked region of the graphene film is located near the edges of the graphene film. In some embodiments, the patterning of the graphene film separates the meniscus-masked region from the graphene film. In some embodiments, the patterning of the graphene film occurs by etching the graphene film.

In more specific embodiments, the present disclosure pertains to methods of preparing graphene nanoribbons by one or more of the following steps: (1) associating a surface with a graphene film; (2) forming a pattern on the graphene film by selectively covering regions of the graphene film with a first protective layer; (3) etching the uncovered regions of the graphene film on the surface to lead to the formation of an etched pattern on the surface, where the etched pattern includes edges surrounded by graphene film; (4) depositing a second protective layer (e.g., a metal layer) on the etched pattern, where the second protective layer becomes associated with the graphene film surrounding the edges of the etched pattern; (5) removing the first protective layer, where the removing of the first protective layer leads to the formation of a meniscus-masked region between the second protective layer and the graphene film; and (6) patterning the graphene film on the surface, where the patterning retains the meniscus-masked region of the graphene film on the surface, and where the meniscus masked region follows the edges of the etched pattern and forms graphene nanoribbons. In some embodiments, the methods of the present disclosure also include a step of removing the second protective layer from the surface.

In further embodiments, the present disclosure pertains to methods of preparing wires (e.g., nanowires) from a film (e.g., a metallic film) that is associated with a meniscus. In some embodiments, the method comprises patterning the film while the meniscus acts as a mask above a region of the film (i.e., a meniscus-masked region). In some embodiments, the patterning results in formation of a wire from the meniscus-masked region of the film. In some embodiments, the meniscus-masked region of the film is located near the edges of the film. In some embodiments, the patterning of the film separates the meniscus-masked region from the film. In some embodiments, the patterning of the film occurs by etching the film.

In more specific embodiments, the present disclosure pertains to methods of preparing wires by one or more of the following steps: (1) associating a surface with a film; (2) forming a pattern on the film by selectively covering regions of the film with a first protective layer; (3) etching the uncovered regions of the film on the surface to lead to the formation of an etched pattern on the surface, where the etched pattern includes edges surrounded by film; (4) depositing a second protective layer (e.g., a metal) on the etched pattern, where the second protective layer becomes associated with the film surrounding the edges of the etched pattern; (5) removing the first protective layer, where the removing of the first protective layer leads to the formation of a meniscus-masked region between the second protective layer and the film; (6) patterning the film on the surface, where the patterning retains the meniscus-masked region of the film on the surface that represents the formed wire, and where the formed wire follows the edges of the etched pattern. In some embodiments, the methods of the present disclosure also include a step of removing the second protective layer from the surface.

In some embodiments, the wires formed by the methods of the present disclosure may be conducting, semiconducting or insulating. In some embodiments, the properties of the formed wires can depend on the film material used.

Additional embodiments of the present disclosure pertain to alternative chemical methods of preparing wires. In some embodiments, such methods include the following steps: (1) depositing a hydrophilic material (e.g., a metal, such as Au) on a surface to lead to the formation of a hydrophilic layer (e.g., a hydrophilic mask layer) on the surface; and (2) exposing the surface to a water-reactive material (e.g., $TiCl_4$) to form a second layer that follows the edges of the hydrophilic layer on the surface. In some embodiments, the water-reactive material is in gaseous form. In some embodiments, the second layer represents the formed wire. In some embodiments, the second layer forms through a chemical reaction between the water reactive material and the liquid (e.g., water) adsorbed between the hydrophilic layer and the substrate. In some embodiments, the methods of the present disclosure also include a step of annealing of the surface to result in the solidification of the formed wire (e.g., by further chemical transformation). In further embodiments, the methods of the present disclosure also include a step of removing the hydrophilic layer from the surface.

BRIEF DESCRIPTION OF FIGS.

FIG. 1 provides schemes of methods for fabricating graphene nanoribbons (GNRs) (FIG. 1A) and wires (FIGS. 1B-C).

FIG. 2 provides data and illustrations relating to the fabrication of GNRs and wires by meniscus-mask lithography (MML). FIG. 2A shows an MML-based scheme for fabrication of GNRs and wires. FIGS. 2B-I show scanning electron microscopy (SEM) images of individual GNRs at different magnifications, including ox-GNRs on Si/SiO$_2$ (FIGS. 2B and F), ox-GNRs on BN (FIGS. 2C and G); ar-GNRs on Si/SiO$_2$ (FIGS. 2D and H), and ar-GNRs on BN (FIGS. 2E and I). The scale bar for images in FIGS. 2F-I is 100 nm. FIG. 2J shows an SEM image of a Pt wire on Si/SiO$_2$. FIG. 2K shows an SEM image of the letter R patterned with ar-GNRs. The inset in FIG. 2K is a magnified image of a part of the ar-GNR comprising the letter R. The mean width is 9.2±1.1 nm. FIG. 2L shows a scheme of an alternative chemical method of fabricating wires.

FIG. 3 shows the Raman spectra and room temperature transport measurements of GNRs prepared by the MML-based fabrication schemes. FIG. 3A shows the following Raman spectra: ar-GNR on Si/SiO$_2$ in blue (top), ox-GNR on Si/SiO$_2$ in red (middle), and the starting CVD graphene in black (bottom). The spectra are normalized so that the G peak height is approximately the same for all three spectra. FIG. 3B is a scheme of the device used for transport measurements. FIG. 3C is an SEM image of an ar-GNR device on a BN substrate. The GNR is situated vertically between the horizontal top and bottom electrodes. FIG. 3D shows room temperature gating curves (for source-drain voltage 0.1 V) for individual ar-GNR FETs on Si/SiO$_2$ (in black) and BN (in red) substrates. σ is the planar conductivity and n is the linear charge carrier concentration (positive for electrons).

FIG. 4 shows data relating to temperature-dependent electronic properties for typical ar-GNR FETs. Gating curves at different temperatures for GNR FETs on Si/SiO$_2$ substrate (FIG. 4A) or BN substrate (FIG. 4B). The green line at $10^{-12}$ A in (FIG. 4B) depicts the approximate instrument noise level. The source-drain voltage was 0.1 V. $I_{sd}$ is source-drain current, $V_g$ is gate voltage, σ is planar conductivity and n is linear charge carrier concentration (positive for electrons). FIG. 4C shows temperature dependence of minimal conductivity averaged for 6 devices for each substrate type.

FIG. 5 shows the atomic force microscopy (AFM) image (height mode) of GNRs and the height profile perpendicular to the GNR axis. Height range in the image is 15 nm.

FIG. 6 provides width distributions for GNRs fabricated via the MML technique described, including ar-GNRs on Si/SiO$_2$ substrate (FIG. 6A); ar-GNRs on BN substrate (FIG. 6B); ox-GNRs on Si/SiO$_2$ substrate (FIG. 6C); and ox-GNRs on BN substrate (FIG. 6D).

FIG. 7 shows fabricated platinum wires. FIG. 7A shows low magnification SEM image of the platinum wires. The inset in FIG. 7A shows the width distribution for Pt wires, with a bin size of 2 nm. FIG. 7B shows the high magnification SEM image of the Pt wires. FIG. 7C shows the AFM height image of Pt wires. The scale range is 75 nm. The inset in FIG. 7C shows the height profile averaged perpendicular to the wire axis.

FIG. 8 shows transport properties of Pt wires. FIG. 8A shows an SEM image of an individual device with the magnified wire image in the inset. FIG. 8B shows overall SEM image of a device set. FIG. 8C shows two terminal (black) and four terminal (red) measurements for the same device.

FIG. 9 shows GNRs patterned in different shapes. FIG. 9A shows 2 μm separated lines (inset is a magnified GNR). FIG. 9B shows a 90° spiral. FIG. 9C shows a 90° angle formed by GNRs.

Figure 14:
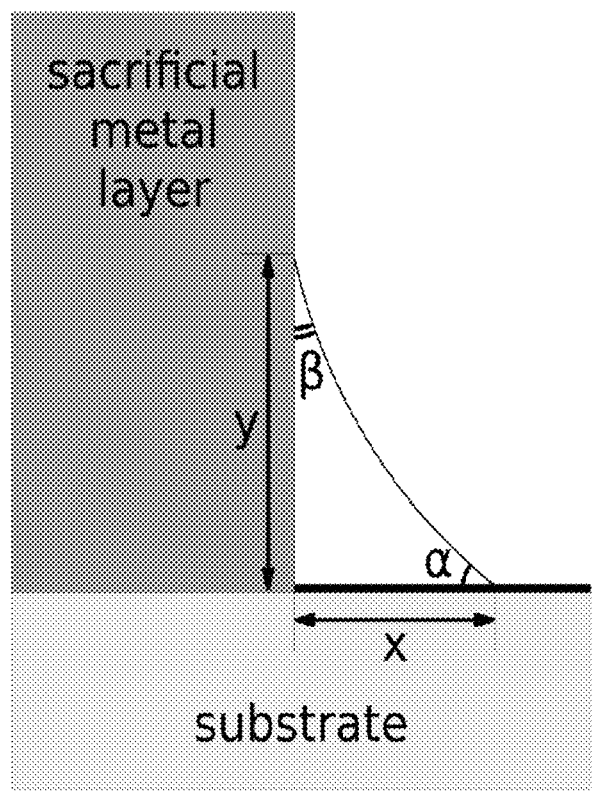

FIG. 14 provides a scheme of the continuum model meniscus cross-section that is orthogonal to the GNR/nanowire direction. In this scheme, x and y are meniscus linear parameters. α and β are contact angles.

Figure 15:
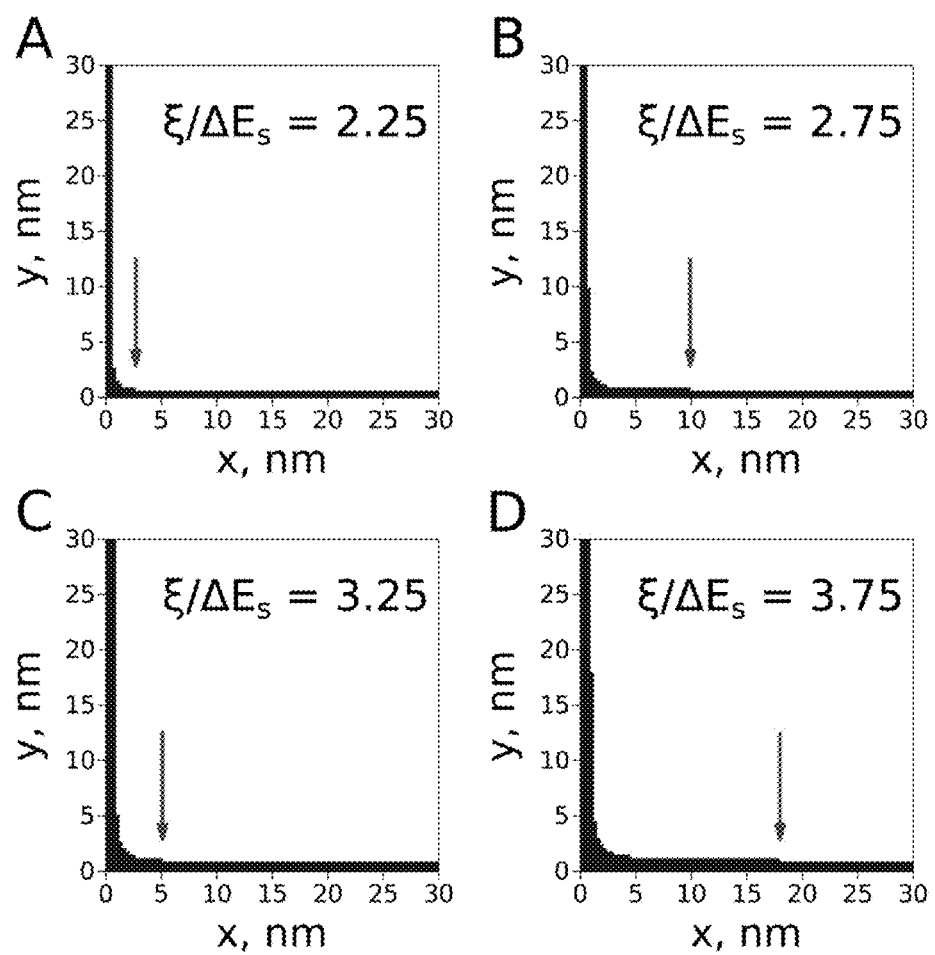

FIG. 15 shows modeling of adsorbed water profiles (obtained from equation 6 in Example 1.10.2) for different values of $\xi/\Delta E_s$, including $\xi/\Delta E_s=2.25$ layers (FIG. 15A), $\xi/\Delta E_s=2.75$ layers (FIG. 15B), $\xi/\Delta E_s=3.25$ layers (FIG. 15C), and $\xi/\Delta E_s=3.75$ layers (FIG. 15D). Red arrows denote where a first additional water layer appears.

Figure 16:
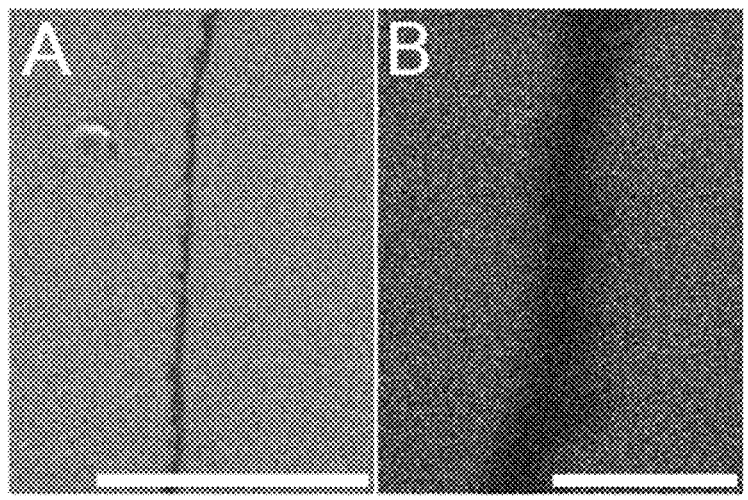

FIG. 16 shows SEM images of GNRs fabricated via photolithography. The scale bars are 1 μm in FIG. 16A and 100 nm in FIG. 16B.

Figure 17:
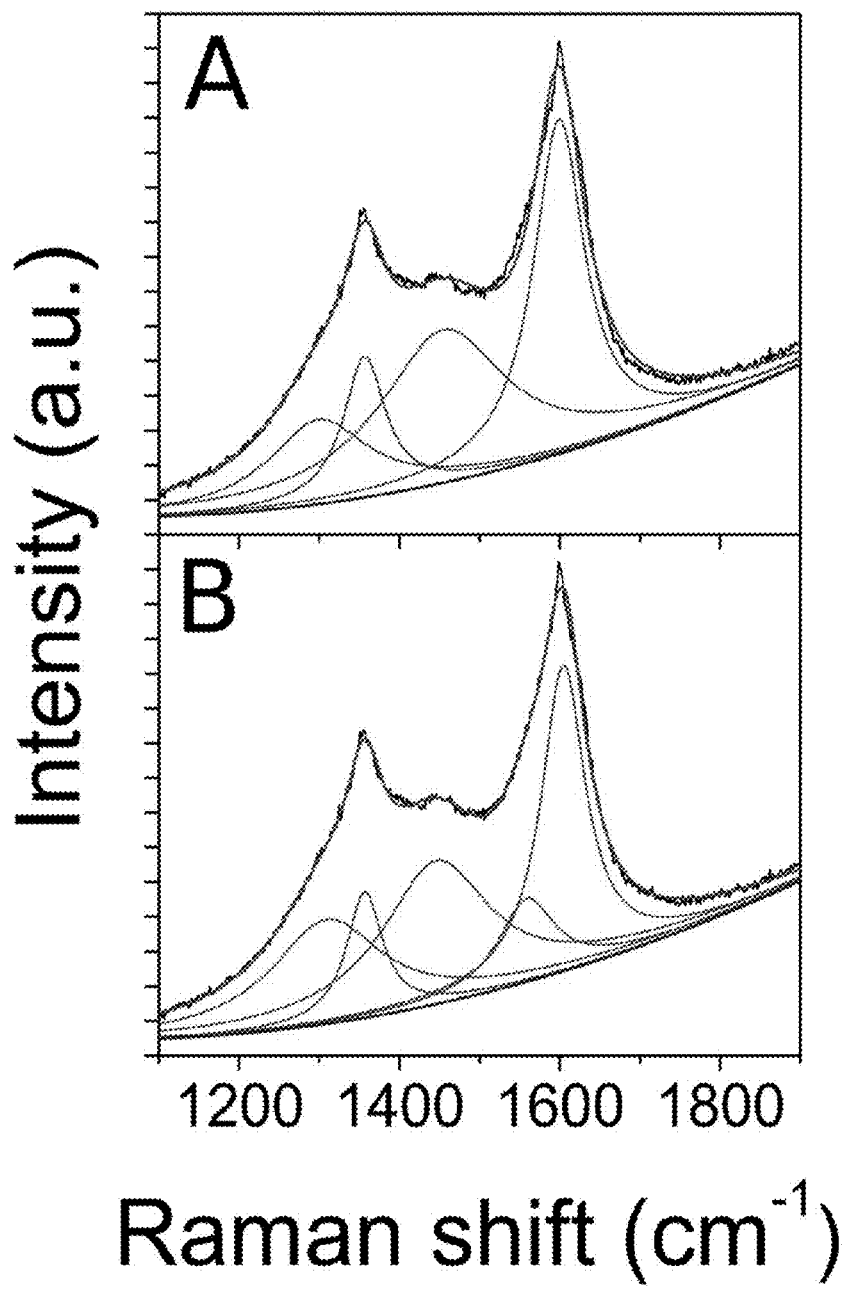

FIG. 17 shows 4-peak (FIG. 17A) and 5-peak (FIG. 17B) deconvolutions of the spectral region around the G and D peaks for ar-GNRs on a Si/SiO$_2$ substrate.

Figure 18:
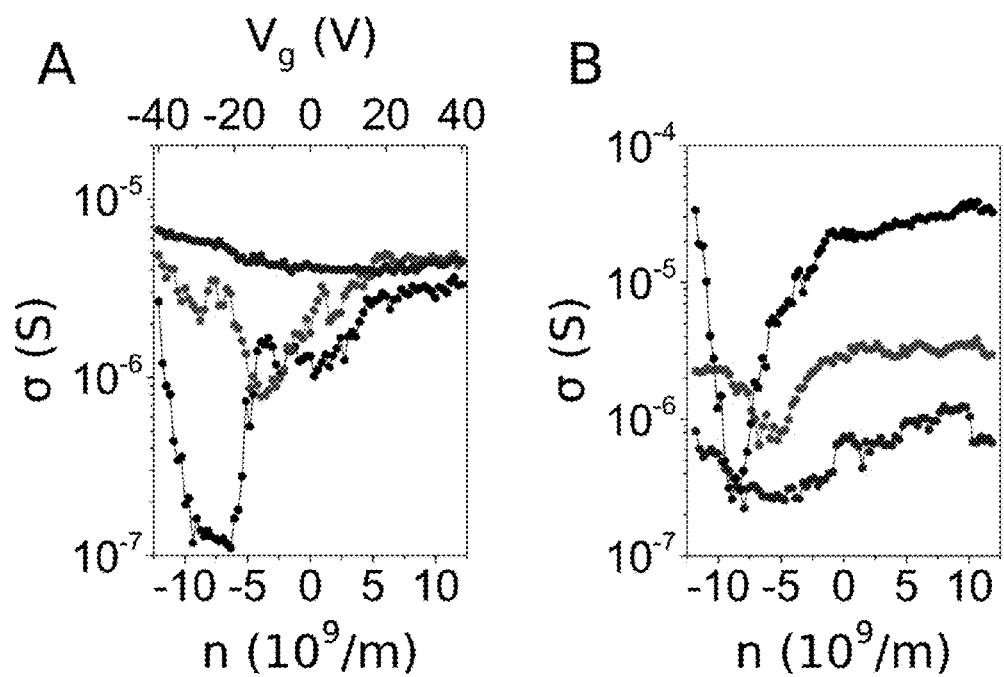

FIG. 18 shows the electronic properties of individual ox-GNRs on Si/SiO$_2$ (FIG. 18A) and BN substrates (FIG. 18B). Different colors denote different devices.

Figure 19:
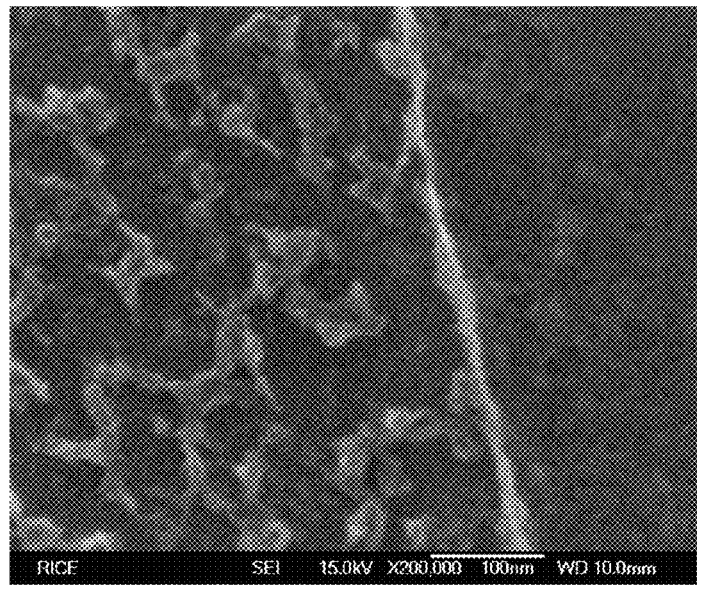
Figure 19:
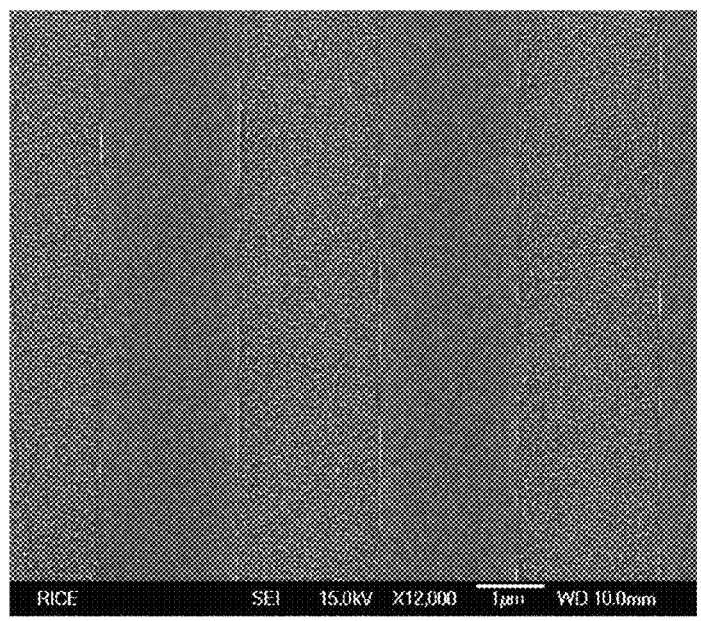

FIG. 19 shows SEM images of fabricated W nanowires at different magnifications.

Figure 20:
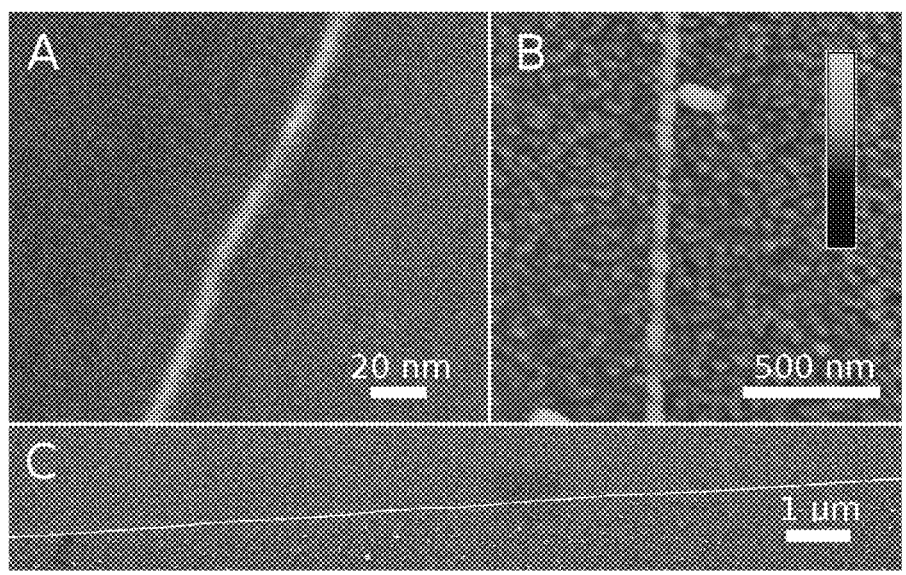

FIG. 20 shows images of Au nanowires, including a high magnification SEM image (FIG. 20A), an atomic force microscopy (AFM) image with a height range of 50 nm (FIG. 20B), and a low magnification SEM image (FIG. 20C).

Figure 21:
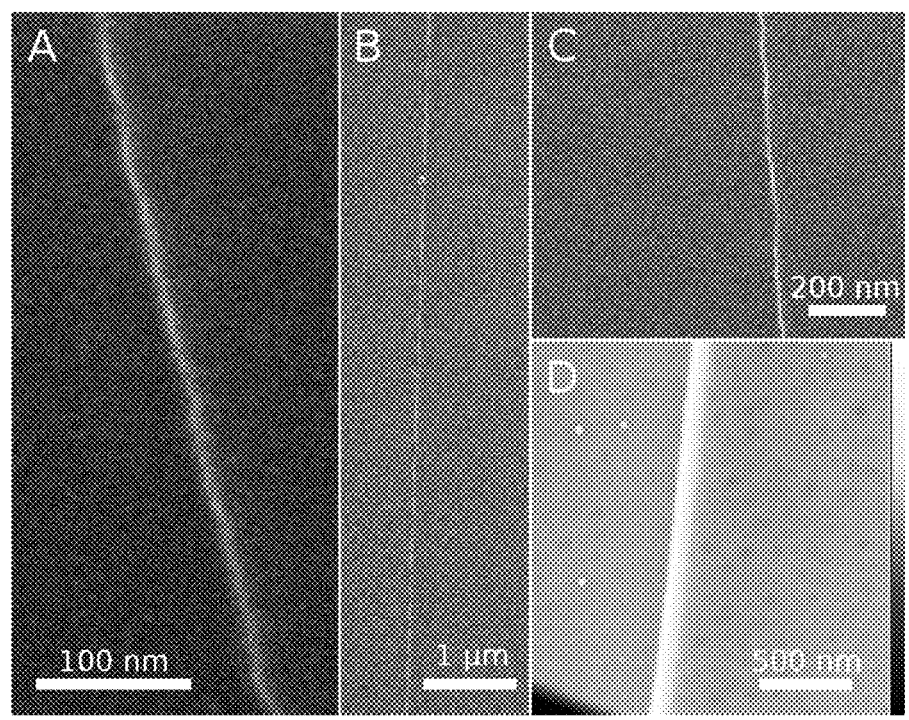

FIG. 21 shows images of Si nanowires, including SEM images (FIGS. 21A-C) and an AFM image with a height range of 50 nm (FIG. 21D).

Figure 22:
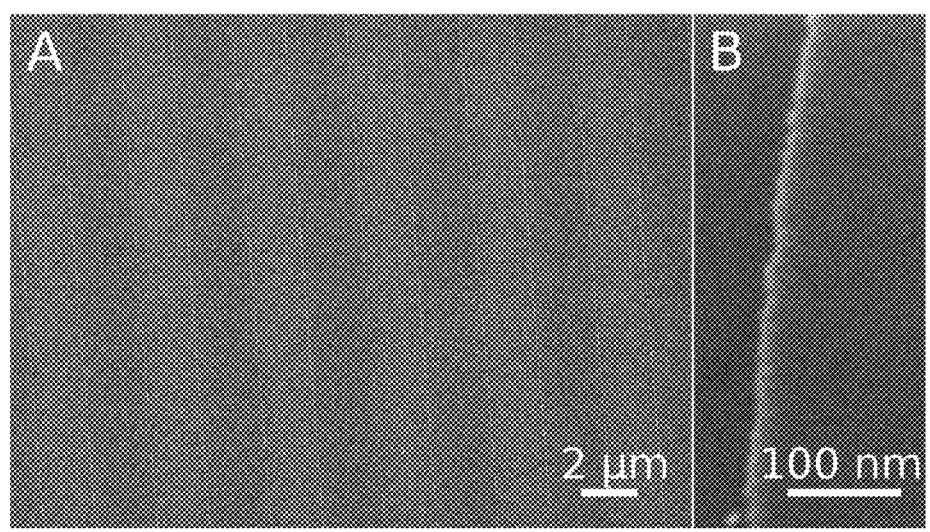

FIG. 22 shows SEM images of SiO$_2$ nanowires.

Figure 23:
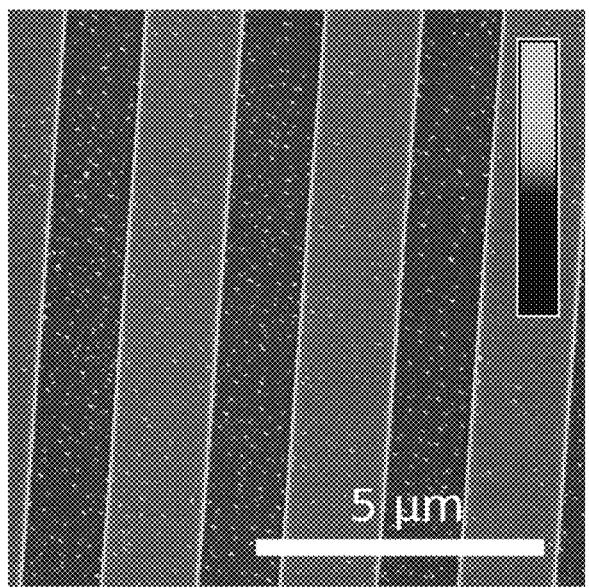

FIG. 23 shows AFM images of SiO$_2$ nanowires.

Figure 24:
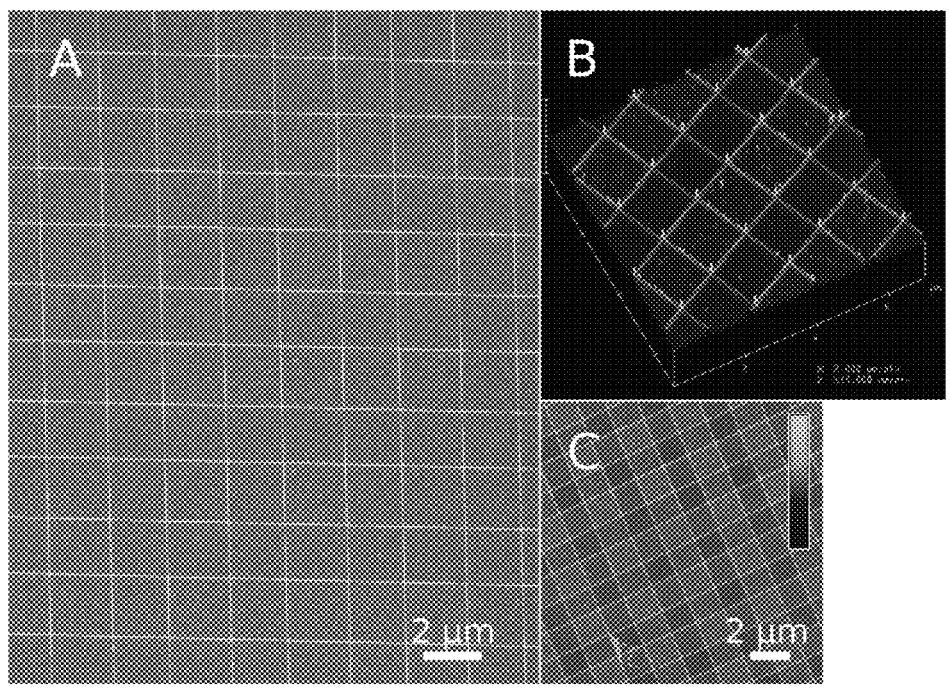

FIG. 24 shows images of SiO$_2$ nanowire crossbars, including an SEM image (FIG. 24A), an AFM 3D model of the surface (FIG. 24B), and an AFM image with a height range of 50 nm (FIG. 24C).

Figure 25:
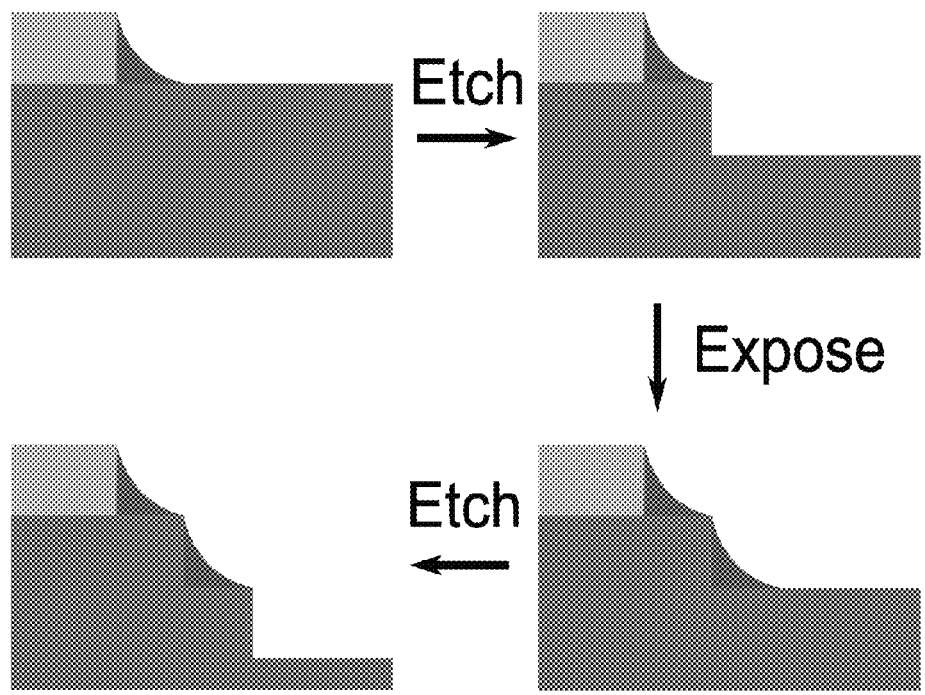

FIG. 25 illustrates the formation of steps in multistep SiO$_2$ nanowires.

Figure 26:
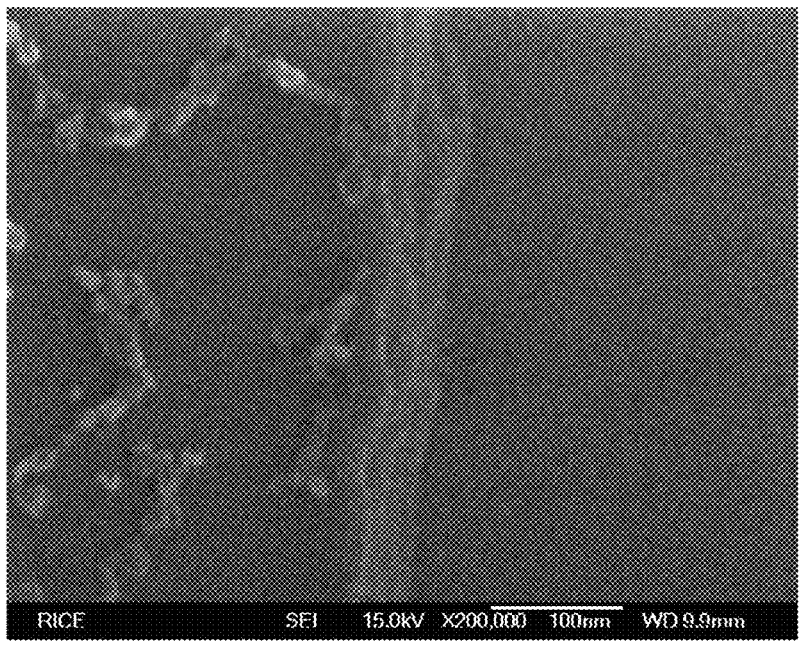

FIG. 26 shows an SEM image of a SiO$_2$ nanowire with four steps. The etching was interrupted on the second RIE stage.

Figure 27:
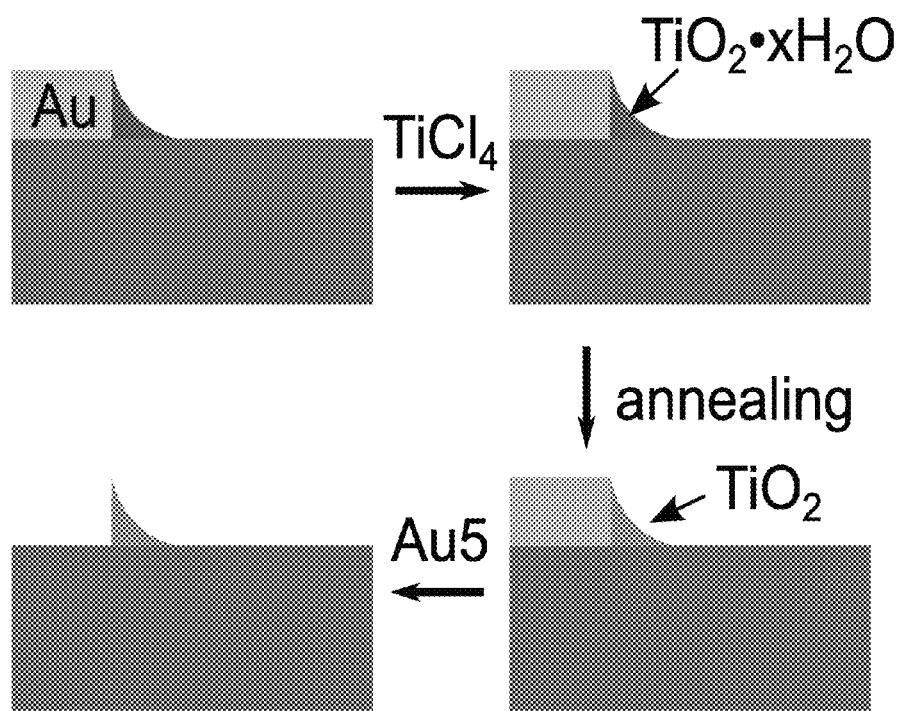

FIG. 27 provides a scheme relating to the fabrication of TiO$_2$ nanowires by chemical conversion of meniscus water.

Figure 28:
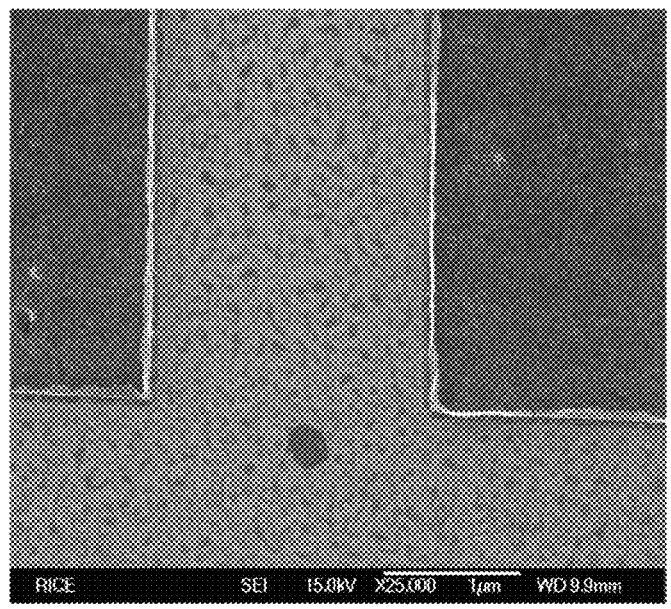
Figure 28:

FIG. 28 provides SEM images of TiO$_2$ nanowires formed by TiCl$_4$ decomposition in meniscus.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component"

encompass both elements or components comprising one unit and elements or components that include more than one unit unless specifically stated otherwise.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Fabrication of narrow high aspect ratio objects allows both miniaturization and control of size-dependent properties of materials. For instance, the patterning of graphene or wires can yield sub-10 nm objects with varied band gaps that depend on their width and edge configurations.

There are a number of graphene nanoribbon (GNR) fabrication methods, including: graphene patterning using various lithography methods; shadowing techniques including shadowing by co-polymer masks; processing of carbon nanotubes and graphite; growth on pre-patterned substrates; and direct organic synthesis. Similar methods exist for fabricating wires. However, only a few methods enable both scalable fabrication and controlled positioning of graphene nanoribbons and wires. Such characteristics are currently required for industrial use in microelectronics and nanoelectronics. Various embodiments of the present disclosure address the above limitations.

In some embodiments, the present disclosure pertains to methods of preparing graphene nanoribbons. In some embodiments, the present disclosure pertains to methods of preparing various types of wires, such as nanowires.

Methods of Preparing Graphene Nanoribbons

In some embodiments, the present disclosure pertains to methods of preparing graphene nanoribbons from a graphene film that is associated with a meniscus. In some embodiments, the meniscus is a liquid meniscus, such as a water-based meniscus. In some embodiments, the meniscus acts as a mask (i.e., cover) above a region of the graphene film. In some embodiments, the region on the graphene film that is masked by the meniscus is referred to as a meniscus-masked region.

In some embodiments, the methods of the present disclosure include a step of patterning the graphene film while the meniscus acts as a mask above a region of the graphene film. In some embodiments, the patterning results in formation of graphene nanoribbons from the meniscus-masked region of the graphene film. In some embodiments, the meniscus-masked region of the graphene film is located near one or more edges of the graphene film. In some embodiments, the meniscus-masked region of the graphene film is located near an edge of a graphene film, where the edge is associated with a layer (e.g., a protective layer, such as a metal layer). In some embodiments, the patterning of the graphene film separates the meniscus-masked region from the graphene film.

In some embodiments, the patterning of the graphene film occurs by etching the graphene film. In some embodiments, etching occurs by a method selected from the group consisting of reactive ion etching, physical sputtering, gas phase chemical etching, and combinations thereof. In some embodiments, the etching occurs in the presence of one or more gases.

In some embodiments, the one or more gases are selected from the group consisting of $CF_4$, $CHF_3$, $SF_6$, $Cl_2$, $BCl_3$, oxygen, argon, hydrogen, nitrogen, halogens, and combinations thereof. In some embodiments, the one or more gases that are used for etching can control the content of edge termination moieties on the formed graphene nanoribbons. For instance, in some embodiments, atoms from one or more of the gases can functionalize the edges of the formed graphene nanoribbons.

In some embodiments, the meniscus is a liquid selected from the group consisting of water, organic solvents, polymers, salts, and combinations thereof. In some embodiments, the meniscus is water.

Figure 1A:
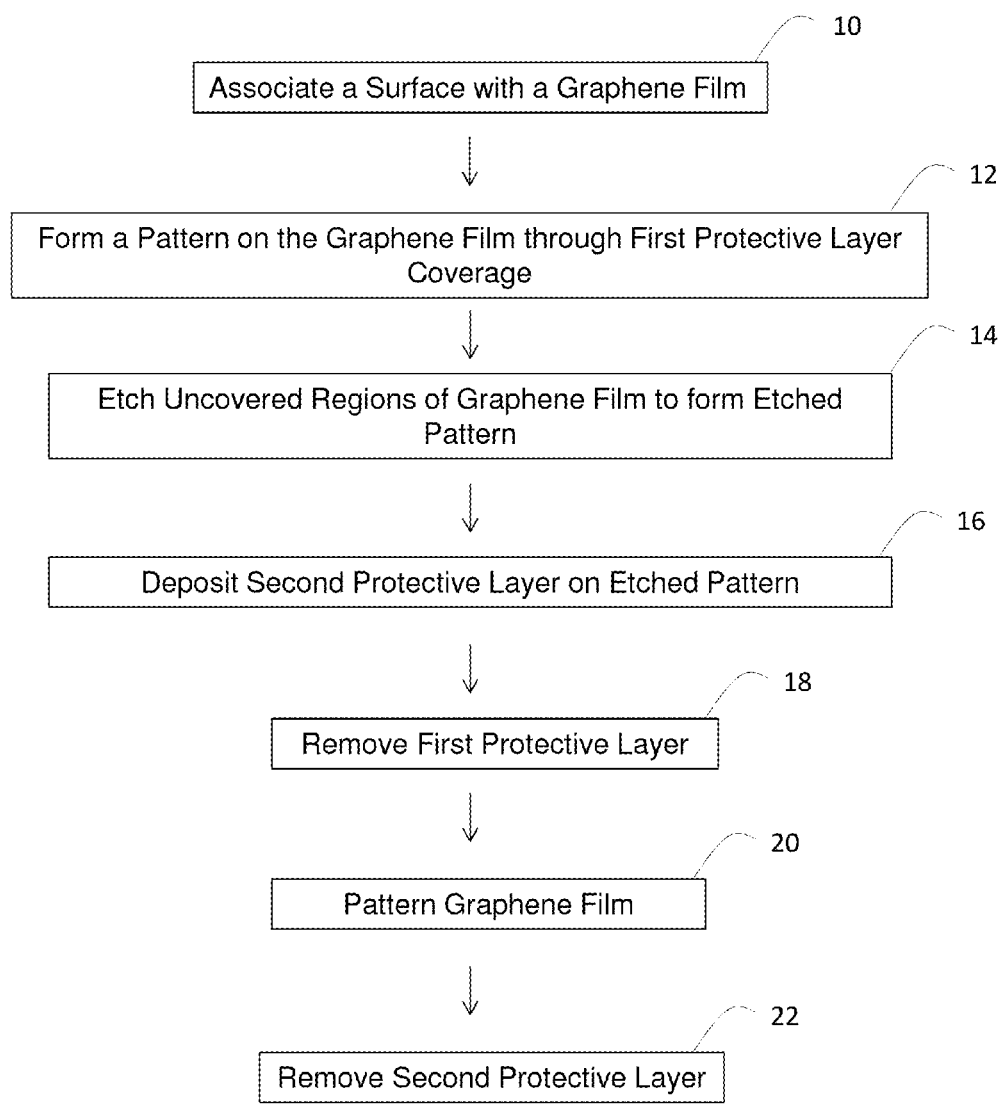

Various steps and methods may be utilized to prepare graphene nanoribbons from a graphene film that is associated with a meniscus. With reference to the scheme in FIG. 1A and the illustration in FIG. 2A, non-limiting examples of methods of preparing graphene nanoribbons can include one or more of the following steps: (1) associating a surface 10 with a graphene film 12 (step 10 in FIG. 1A and image 1 in FIG. 2A); (2) forming a pattern 13 on the graphene film 12 by selectively covering regions of the graphene film 12 with a first protective layer 14, where the selective coverage leaves uncovered regions of graphene film 12 on the surface 10 (step 12 in FIG. 1A and image 1 in FIG. 2A); (3) etching the uncovered regions of the graphene film 12 on the surface 10, where the etching leads to formation of an etched pattern 15 on the surface 10, and where the etched pattern 15 includes edges 16 surrounded by graphene film 12 (step 14 in FIG. 1A and image 2 in FIG. 2A); (4) depositing a second protective layer 17 (e.g., a metal layer) on the etched pattern 15, where the second protective layer 17 becomes associated with the graphene film 12 that surrounds the edges 16 of the etched pattern 15 (step 16 in FIG. 1A and image 3 in FIG. 2A); (5) removing the first protective layer 14 (step 18 in FIG. 1A and image 4 in FIG. 2A), where the removing of the first protective layer leads to the formation of a meniscus-masked region 18 between the second protective layer 17 and the graphene film 12; and (6) patterning the graphene film 12 on the surface 10, where the patterning retains the meniscus-masked region of the graphene film 20 on the surface 10 that follows the edges 16 of the etched pattern 15 (step 20 in FIG. 1A and image 5 in FIG. 2A). In some embodiments, the methods of the present disclosure also include a step of (7) removing the second protective layer 17 from the surface 10 (step 22 in FIG. 1A and image 5 in FIG. 2A).

As illustrated in image 6 of FIG. 2A, the methods of the present disclosure result in formation of graphene nanoribbons 22 from the meniscus-masked region of graphene film 20. In some embodiments, the formed graphene nanoribbons 22 follow the edges 16 of etched pattern 15 on surface 10. Without being bound by theory or mechanism, Applicants envision that, upon removing the first protective layer 14 (step 18 in FIG. 1A and image 4 in FIG. 2A), water or other liquids adsorb near the edges 16 of etched pattern 15 to lead to the formation of a meniscus between second protective layer 17 and graphene film 12. This results in the formation of a meniscus-masked region 18 on graphene film 12. Without again being bound by theory, Applicants envision that the meniscus can protect the meniscus-masked region 18 of graphene film 12 from destruction during a subsequent patterning step (step 20 in FIG. 1A and image 5 in FIG. 2A). Thereafter, meniscus-masked region 18 of graphene film 12 forms graphene nanoribbons 22 (image 6 in FIG. 2A).

As set forth in more detail herein, the methods of the present disclosure have numerous embodiments. In particular, each of the aforementioned steps can be carried in various ways to lead to the formation of different types of graphene nanoribbons.

Association of a Surface with a Graphene Film

Various methods may be utilized to associate surfaces with graphene films. In some embodiments, the association occurs by placing a pre-formed graphene film on the surface. In some embodiments, the association occurs by forming a graphene film on the surface. In some embodiments, a graphene film is formed on the surface through chemical vapor deposition (CVD). Additional methods of forming graphene films on various surfaces can also be envisioned.

In addition, various types of graphene films may be associated with surfaces. In some embodiments, the graphene film is a mono-layer graphene film. In some embodiments, the graphene film is a multi-layer graphene film, such as a bi-layer or tri-layer graphene film. In some embodiments, the graphene film is a mono-crystalline graphene film. In some embodiments, the graphene film is a polycrystalline graphene film.

The graphene films of the present disclosure may be associated with various types of surfaces. In some embodiments, the surfaces include a silicon wafer. In some embodiments, the silicon wafers contain combinations of Si and $SiO_2$ (Si/$SiO_2$). In some embodiments, the silicon wafers include p-doped Si wafers, such as silicon wafers with 300 nm thermal oxide layer from Silicon Quest International (denoted as Si/$SiO_2$ substrates). In some embodiments, the silicon wafers have a $Si_3N_4$ layer on their surfaces.

In some embodiments, the surface is a sapphire wafer. In some embodiments, the surface is a highly oriented pyrolithic graphite. In some embodiments, the surface is glass.

In some embodiments, the surfaces utilized to form graphene nanoribbons may be patterned. In more specific embodiments, the surfaces include pre-patterned silicon-on-insulator (SOI) wafers.

In some embodiments, the surfaces utilized in the methods of the present disclosure include surfaces containing boron nitride (BN). The use of additional surfaces can also be envisioned.

Formation of a Pattern on the Graphene Film

Various methods may also be used to form patterns on a graphene film. In general, a pattern is formed on a graphene film by selectively covering regions of the graphene film with a first protective layer (e.g., first protective layer 14 in FIG. 2A). Generally, such selective coverage leaves uncovered regions of graphene film on the surface (e.g., regions 13 in FIG. 2A). Such regions represent a pattern on the graphene film.

The methods of the present disclosure may utilize various types of first protective layers to form patterns on graphene films. For instance, in some embodiments, the first protective layer is in the form of a mask. In some embodiments, the mask may contain stripes and gaps that form a pattern. For instance, in some embodiments, a mask may be patterned with 4 μm×100 μm stripes separated by 4 μm gaps. Additional mask patterns can also be envisioned.

The first protective layers of the present disclosure may be derived from various compositions. In some embodiments, the first protective layers may be hydrophobic. In some embodiments, the first protective layer is hydrophilic. In some embodiments, the first protective layer is hydrophobic while the second protective layer is hydrophilic. In some embodiments, the first protective layer is hydrophilic while the second protective layer is hydrophobic. In some embodiments, both the first and the second protective layers are hydrophilic.

In some embodiments, the first protective layers of the present disclosure may be polymers, such as hydrophobic polymers. In some embodiments, the first protective layers of the present disclosure may include one or more polymers selected from the group consisting of poly(methacrylates), poly(esters), poly(ethers), poly(olefins), poly(styrenes), and combinations thereof. In some embodiments, the first protective layers of the present disclosure may include poly(methyl methacrylate) (PMMA).

In some embodiments, the first protective layers of the present disclosure may include a metal layer. In some embodiments, the metal layer may include one or more metals. In some embodiments, the one or more metals may include, without limitation, Pd, Pt, Cr, Al, Au, and combinations thereof. In some embodiments, the first protective layers of the present disclosure may be derived from the same composition as the second protective layer. The utilization of additional first protective layers can also be envisioned.

The first protective layers of the present disclosure may have various thicknesses. For instance, in some embodiments, the first protective layers of the present disclosure have thicknesses ranging from about 20 nm to about 2000 nm. In some embodiments, the first protective layers of the present disclosure have thicknesses ranging from about 20 nm to about 60 nm. In some embodiments, the first protective layers of the present disclosure have a thickness of about 30 nm. In some embodiments, the first protective layers of the present disclosure have thicknesses ranging from about 250 nm to about 2000 nm. In some embodiments, the first protective layers of the present disclosure have thicknesses of about 250 nm. In some embodiments, the first protective layers of the present disclosure have thicknesses of about 400 nm. In some embodiments, the first protective layers of the present disclosure have thicknesses of about 2000 nm.

Formation of Etched Patterns on a Surface

In general, an etched pattern forms on uncovered regions of a graphene film on a surface by etching the uncovered regions (e.g., formation of etched pattern 15 on surface 10, as shown in image 2 of FIG. 2A). Generally, an etched pattern includes edges that are surround by un-etched graphene films (e.g., edges 16 surrounded by graphene film 12, as also shown image 2 of FIG. 2A). In some embodiments, the graphene film is completely removed from the etched pattern. In some embodiments, the graphene film is partially removed from the etched pattern.

Various etching methods may be utilized to form etched patterns on a surface. For instance, in some embodiments, the etching occurs by at least one of reactive ion etching, physical sputtering, gas phase chemical etching, and combinations thereof. In some embodiments, etched patterns are formed on a surface through layer-by-layer graphene removal by various methods, such as metal sputtering.

In more specific embodiments, the etching occurs by reactive ion etching. In some embodiments, the reactive ion etching occurs under the flow of one or more gases. In some embodiments, the gases may include, without limitation, $CF_4$, $CHF_3$, $SF_6$, $Cl_2$, $BCl_3$, oxygen, argon, hydrogen, nitrogen, halogens, and combinations thereof. In some embodiments, reactive ion etching occurs under the flow of argon. In some embodiments, reactive ion etching occurs under the flow of $CF_4$. In some embodiments, reactive ion etching occurs under the flow of oxygen. In some embodiments, reactive ion etching occurs under the flow of nitrogen. In some embodiments, reactive ion etching occurs under the flow of an argon-hydrogen mixture.

In some embodiments, the gas that is used for etching can control the content of edge termination moieties on the formed graphene nanoribbons. For instance, in some embodiments, one or more atoms from gases that are used during etching can functionalize the edges of formed graphene nanoribbons. For example, if a gas used during an etching step contains oxygen, then the edges of the formed graphene nanoribbons can have oxygen groups. Likewise, if a gas used during an etching step contains hydrogen, then the edges of the formed graphene nanoribbons can have hydrogen groups. Likewise, if a gas used during an etching step contains halogens, then the edges of the graphene nanoribbons can contain halogens.

The methods of the present disclosure may utilize various types of etching parameters. For instance, in some embodiments, etching may last anywhere from about 20 seconds to about 120 seconds. In some embodiments, etching may last for about 20 seconds, about 60 seconds, about 90 seconds, or about 120 seconds.

In some embodiments, etching occurs under a gas flow rate (e.g., argon, $CF_4$, $CHF_3$, $SF_6$, $Cl_2$, $BCl_3$, hydrogen, nitrogen, or oxygen). In some embodiments, the gas flow rate ranges from about 15 sccm to about 100 sccm. In some embodiments, the gas flow rate may be about 15 sccm, about 20 sccm, about 50 sccm, or about 100 sccm. In some embodiments, the gas flow rate may be from about 50 sccm to about 100 sccm.

In some embodiments, the etching occurs under various gas pressures. In some embodiments, the gas pressure may range from about 15 mTorr to about 200 mTorr. In some embodiments, the gas pressure may be about 15 mTorr, about 100 mTorr, or about 20 mTorr.

In addition, the etched patterns may have various shapes. For instance, in some embodiments, the etched patterns may be in the form of lines, letters, cross-bars, and combinations thereof. Additional etched pattern shapes can also be envisioned.

Deposition of a Second Protective Layer

In general, second protective layers form on a surface (e.g., etched pattern of a surface) when a protective material is deposited on a surface (e.g., depositing of a protective material on etched pattern 15 of surface 10 to form second protective layer 17, as shown in image 3 of FIG. 2A). In some embodiments, this results in the association of the second protective layer with the graphene films that surround the edges of an etched pattern on a surface (e.g., association of second protective layer 17 with graphene film 12 near edges 16, as shown in image 3 in FIG. 2A). In some embodiments, the second protective layer becomes associated with the graphene film surrounding the edges of the etched pattern through direct contact with the graphene film.

Various methods may be utilized to deposit second protective layers on surfaces. In some embodiments, second protective layers are deposited on surfaces by depositing one or more protective materials on the surface. In some embodiments, the depositing of protective materials on a surface occurs by sputtering. In some embodiments, the depositing of protective materials on a surface occurs by spraying. In some embodiments, the depositing of protective materials on a surface occurs by e-beam evaporation. In some embodiments, the depositing of protective materials on a surface occurs by spin-coating. Additional modes of depositing protective materials on surfaces can also be envisioned.

In addition, various protective materials may be utilized to form second protective layers on surfaces. For instance, in some embodiments, the protective materials may include one or more metals. In some embodiments, the metals may include, without limitation, Pd, Pt, Cr, Al, Au, and combinations thereof. In some embodiments, the protective material is Al. In some embodiments, the protective material is Au. The use of additional protective materials can also be envisioned.

In some embodiments, the second protective layers of the present disclosure may include one or more polymers. In some embodiments, the polymers may include, without limitation, poly(methacrylates), poly(esters), poly(ethers), poly (olefins), poly(styrenes), and combinations thereof. In some embodiments, the second protective layers of the present disclosure may include poly(methyl methacrylate) (PMMA). In some embodiments, the second protective layers of the present disclosure may have the same composition as the first protective layer. The utilization of additional materials as second protective layers can also be envisioned.

The formed second protective layers of the present disclosure may have various thicknesses. For instance, in some embodiments, the second protective layers of the present disclosure may have a thickness ranging from about 20 nm to about 60 nm. In some embodiments, the second protective layers of the present disclosure have a thickness of about 30 nm. In some embodiments, the second protective layers of the present disclosure have thicknesses ranging from about 250 nm to about 2000 nm. In some embodiments, the second protective layers of the present disclosure have thicknesses of about 250 nm. In some embodiments, the second protective layers of the present disclosure have thickness of about 2000 nm. Additional second protective layer thicknesses can also be envisioned.

Removal of First Protective Layer

In general, a first protective layer is removed from a graphene film after the deposition of a second protective layer on an etched pattern of a surface (e.g., removal of first protective layer 14 from graphene film 12 on surface 10, as shown in images 3-4 in FIG. 2A). Various methods may be utilized to remove a first protective layer from a graphene film.

In some embodiments, the removing of the first protective layer from a graphene film occurs by lifting off the first protective layer from a surface. In some embodiments, the first protective layer is lifted off by the use of an object, such as tweezers. In some embodiments, the removal of the first protective layer occurs by etching. In some embodiments, the removal of the first protective layer occurs by dissolving. Additional methods of removing a first protective layer from a graphene film on a surface can also be envisioned.

In some embodiments, the removal of the first protective layer from a graphene film on a surface leads to adsorption of a liquid (e.g., water) near the edges of an etched pattern that surround the graphene film (e.g., adsorption of water near edges 16 of etched pattern 15, as shown in image 4 in FIG. 2A). In some embodiments, such adsorption of a liquid (e.g., water) can in turn lead to the formation of a meniscus-masked region between the second protective layer on the etched pattern and the graphene film associated with the second protective layer (e.g., formation of meniscus-masked region 18 between second protective layer 17 and graphene film 12, as shown in image 4 in FIG. 2A).

In more specific embodiments, the formed meniscus in the meniscus-masked region is a flat meniscus that reaches the top of a second protective layer. In some embodiments, the meniscus may extend to the horizontal plane. In more specific embodiments, the meniscus may extend for more than about 50 nm on the horizontal plane. In some embodiments, the meniscus can protect a portion of the graphene film during the patterning of the graphene film.

Patterning of the Graphene Film

In general, the patterning of the graphene film refers to a step where a graphene film is patterned after it becomes associated with a meniscus that forms a meniscus-masked region on the graphene film. In some embodiments, the patterning results in formation of graphene nanoribbons from the meniscus-masked region of the graphene film. In some embodiments, the patterning of the graphene film separates the meniscus-masked region of the graphene film from the rest of the graphene film.

In some embodiments, the patterning of a graphene film on a surface occurs after the removal of the first protective layer from an etched pattern on the surface (e.g., patterning of graphene film 12 on surface 10 after removal of first protective layer 14, as shown in images 3-5 of FIG. 2A).

In some embodiments, the patterning of the graphene film occurs by etching the graphene film. In such embodiments, the patterning the graphene film may also be referred to as re-etching the graphene film.

The patterning of the graphene film by re-etching may also occur by the same methods described previously. For instance, in some embodiments, the re-etching occurs by at least one of reactive ion etching, physical sputtering, gas phase chemical etching, and combinations thereof. In some embodiments, graphene layers are removed through layer-by-layer graphene removal by various methods, such as metal sputtering. In more specific embodiments, the re-etching occurs by reactive ion etching. In some embodiments, the reactive ion etching occurs under the flow of one or more gases.

In some embodiments, the gases may include, without limitation, $CF_4$, $CHF_3$, $SF_6$, $Cl_2$, $BCl_3$, oxygen, argon, hydrogen, nitrogen, halogens, and combinations thereof. In some embodiments, reactive ion etching occurs under the flow of argon. In some embodiments, reactive ion etching occurs under the flow of $CF_4$. In some embodiments, reactive ion etching occurs under the flow of oxygen. In some embodiments, reactive ion etching occurs under the flow of nitrogen. In some embodiments, reactive ion etching occurs under the flow of an argon-hydrogen mixture.

In some embodiments, the gas that is used for etching can control the content of edge termination moieties on the formed graphene nanoribbons. For instance, in some embodiments, one or more atoms from gases that are used during etching can functionalize the edges of formed graphene nanoribbons. For example, if a gas used during an etching step contains oxygen, then the edges of the formed graphene nanoribbons can have oxygen groups. Likewise, if a gas used during an etching step contains hydrogen, then the edges of the formed graphene nanoribbons can have hydrogen groups. Likewise, if a gas used during an etching step contains halogens, then the edges of the graphene nanoribbons can contain halogens.

The methods of the present disclosure may utilize various types of re-etching parameters. For instance, in some embodiments, re-etching may last anywhere from about 20 seconds to about 90 seconds. In some embodiments, the re-etching may last for about 20 seconds, about 60 seconds, or about 90 seconds.

In some embodiments, the first etching time and the re-etching time may be different. For instance, in some embodiments, the re-etching time may last longer than the first etching time. In more specific embodiments, the re-etching time may last for about 90 seconds while the first etching time lasts for about 20 seconds.

In some embodiments, re-etching occurs under a gas flow rate (e.g., $CF_4$, $CHF_3$, $SF_6$, $Cl_2$, $BCl_3$, argon, hydrogen, nitrogen, or oxygen). In some embodiments, the gas flow rate ranges from about 15 sccm to about 100 sccm. In some embodiments, the gas flow rate may be about 15 sccm, about 20 sccm, about 50 sccm, or about 100 sccm.

In some embodiments, the re-etching occurs under various gas pressures. In some embodiments, the gas pressure may range from about 15 mTorr to about 200 mTorr. In some embodiments, the gas pressure may be about 15 mTorr, about 100 mTorr, or about 20 mTorr.

In some embodiments, the patterning retains a meniscus-masked region of a graphene film on a surface (e.g., retainment of meniscus-masked region 18 as graphene film 20 on surface 10, as shown in images 4-5 of FIG. 2A). In some embodiments, the meniscus-masked region of the graphene film follows the edges of the etched pattern (e.g., meniscus masked region 18 as graphene film 20 following edges 16 of etched pattern 15, as shown in image 5 of FIG. 2A). In some embodiments, the meniscus-masked region of a graphene film forms a graphene nanoribbon that also follows the edges of an etched pattern (e.g., formation of graphene nanoribbon 22, as shown in image 6 of FIG. 2A).

Removal of Second Protective Layer

In some embodiments, a second protective layer is optionally removed from a surface after the patterning of a graphene film (e.g., removal of second protective layer 17 from surface 10 after patterning of the graphene film, as shown in images 5-6 of FIG. 2A). Various methods may be utilized to remove second protective layers from a surface. In some embodiments, the second protective layer is removed from a surface by physical removal of the second protective layer. In some embodiments, the second protective layer is removed from a surface by wet etching. In some embodiments, wet etching involves exposure of the surface to one or more acids. In some embodiments, the one or more acids include, without limitation, nitric acid, phosphoric acid, sulfuric acid, acetic acid, and combinations thereof. In more specific embodiments, the second protective layer is removed from a surface by wet etching the surface with a mixture of phosphoric acid (e.g., 80% by volume), nitric acid (e.g., 5% by volume), acetic acid (e.g., 5% by volume), and water (e.g., 10% by volume). In some embodiments the second protective layer is removed with aqua regia. In some embodiments the second protective layer is removed by an Au5 ($I_2$:KI:water in a ratio of 1:4:40 by weight) wet etchant. Additional methods by which to remove second protective layers from surfaces can also be envisioned.

Formed Graphene Nanoribbons

The methods of the present disclosure can be used to produce various types of graphene nanoribbons. For instance, in some embodiments, the methods of the present disclosure can be used to produce graphene nanoribbons with various widths. In some embodiments, the formed graphene nanoribbons have widths ranging from about 0.5 nm to about 250 nm. In some embodiments, the formed graphene nanoribbons have widths ranging from about 5 nm to about 30 nm. In some embodiments, the formed graphene nanoribbons have widths ranging from about 19 nm to about 27 nm. In some embodiments, the formed graphene nanoribbons have widths ranging from about 10 nm to about 20 nm. In some embodiments, the formed graphene nanoribbons have widths ranging from about 12 nm to about 15 nm. In some embodiments, the graphene nanoribbons have widths ranging from about 5 nm to about 7 nm.

In some embodiments, the widths of the graphene nanoribbons are controllable as a function of one or more growth parameters. In some embodiments, the controllable growth parameters include second protective layer thickness.

In some embodiments, the controllable growth parameters include patterning (e.g., re-etching) time. In some embodiments, an increase in the patterning time results in a decrease in the width of the graphene nanoribbons, and a decrease in the patterning time results in an increase in the width of the graphene nanoribbons.

Therefore, in further embodiments, the methods of the present disclosure also include a step of controlling the width of the graphene nanoribbons. For instance, in some embodiments, the width of the graphene nanoribbons are controlled by adjusting the patterning time, where increasing the patterning time results in a decrease in the width of the graphene nanoribbons, and decreasing the patterning time results in an increase in the width of the graphene nanoribbons. In some embodiments the width is controlled by changing the material of the meniscus. In some embodiments the width is controlled by changing the surface wettability. In some embodiments the surface is chemically modified to achieve different wettability.

In some embodiments, the widths of the graphene nanoribbons are controllable as a function of the size of the meniscus. In some embodiments, the size of the meniscus can be controlled by changing or adjusting the contents of the solvents used during graphene nanoribbons formation. For instance, in some embodiments, graphene nanoribbon formation can occur in the presence of water alone, water and organic solvents (e.g., alcohol, ethanol, methanol, propanol, ethylene glycol, diglyme, etc.), water and polymer mixtures (e.g., poly(ethylene glycol)), water and salt mixtures (e.g., sodium chloride), or no water and organic solvents only (e.g., ethanol, methanol, propanol, ethylene glycol, diglyme, etc.), light oils with or without water (e.g., dodecane), silicone oils with or without water (e.g., polydimethylsiloxane), and combinations thereof. Without being bound by theory, the above combinations can change the size of the meniscus and thereby control the width of the formed graphene nanoribbons. In some embodiments the width of the formed graphene nanoribbons is controlled by changing the surface wettability. In some embodiments the surface is chemically modified to achieve a desired wettability.

The formed graphene nanoribbons of the present disclosure can also have various lengths. In some embodiments, the graphene nanoribbons have lengths ranging from about 10 nm to about 100 m. In some embodiments, the graphene nanoribbons have lengths ranging from about 10 nm to about 1 µm. In some embodiments, the graphene nanoribbons have lengths ranging from about 10 nm to about 100 nm.

The formed graphene nanoribbons of the present disclosure can also have various aspect ratios. For instance, in some embodiments, the formed graphene nanoribbons of the present disclosure have aspect ratios of at least about 2000. In some embodiments, the formed graphene nanoribbons of the present disclosure have aspect ratios of more than about 2000.

In some embodiments, the formed graphene nanoribbons of the present disclosure are functionalized with a plurality of functional groups. In some embodiments, the functional groups include, without limitation, oxide groups, carboxyl groups, hydroxyl groups, esters, amine-based functional groups, silicon-based functional groups, and combinations thereof. In more specific embodiments, the graphene nanoribbons are functionalized with oxide groups.

In some embodiments where pure or diluted etching gases are used (e.g., pure or diluted argon or nitrogen-based gases, such as ammonia), the formed graphene nanoribbons could be functionalized with one or more atoms from the gases. For instance, in some embodiments where etching occurs in the presence of nitrogen-based gases, the formed graphene nanoribbons could be functionalized with nitrogen atoms (e.g., nitrogen terminal groups on edges of formed graphene nanoribbons). In some embodiments where etching occurs in the presence of silicon-containing gases (e.g., $SiCl_4$), the formed graphene nanoribbons could be functionalized with silicon atoms (e.g., silicon terminal groups on edges of formed graphene nanoribbons). In some embodiments where etching occurs in the presence of hydrogen-containing gases (e.g., $H_2$), the formed graphene nanoribbons could be functionalized with hydrogen atoms (e.g., hydrogen terminal groups on edges of formed graphene nanoribbons). In some embodiments where etching occurs in the presence of halogen-containing gases (e.g., $CF_4$), the formed graphene nanoribbons could be functionalized with halogen atoms (e.g., halogen terminal groups on edges of the formed graphene nanoribbons).

In some embodiments, functional groups are located on the edges of graphene nanoribbons. In some embodiments, functional groups are located on the surfaces of graphene nanoribbons. In some embodiments, functional groups are located on the surfaces and edges of graphene nanoribbons.

The formed graphene nanoribbons of the present disclosure can also have various types of shapes. For instance, in some embodiments, the formed graphene nanoribbons of the present disclosure can be in the form of lines, letters, crossbars, or intersecting wires. Additional shapes can also be envisioned.

Methods of Preparing Wires

In further embodiments, the present disclosure pertains to methods of preparing wires from a film that is associated with a meniscus. In some embodiments, the meniscus is a liquid meniscus, such as a water-based meniscus. In some embodiments, the meniscus acts as a mask (i.e., a cover) above a region of the film. In some embodiments, the region on the film that is masked by the meniscus is referred to as a meniscus-masked region.

In some embodiments, the methods of the present disclosure include a step of patterning the film while the meniscus acts as a mask above a region of the film (i.e., a meniscus masked region). In some embodiments, the patterning results in formation of a wire from the meniscus-masked region of the film. In some embodiments, the meniscus-masked region of the film is located near one or more edges of the film. In some embodiments, the meniscus-masked region of the film is located near an edge of a film, where the edge is associated with a layer (e.g., a protective layer, such as a metal layer). In some embodiments, the patterning of the film separates the meniscus-masked region from the rest of the film.

In some embodiments, the patterning of the film occurs by etching the film. In some embodiments, etching occurs by a method selected from the group consisting of reactive ion etching, physical sputtering, gas phase chemical etching, and combinations thereof. In some embodiments, the etching occurs in the presence of one or more gases. In some embodiments, the one or more gases are selected from the group consisting of $CF_4$, $CHF_3$, $SF_6$, $Cl_2$, $BCl_3$, oxygen, argon, hydrogen, nitrogen, halogens, and combinations thereof.

In some embodiments, the meniscus is a liquid selected from the group consisting of water, organic solvents, polymers, salts, and combinations thereof. In some embodiments, the meniscus is water.

Figure 1B:
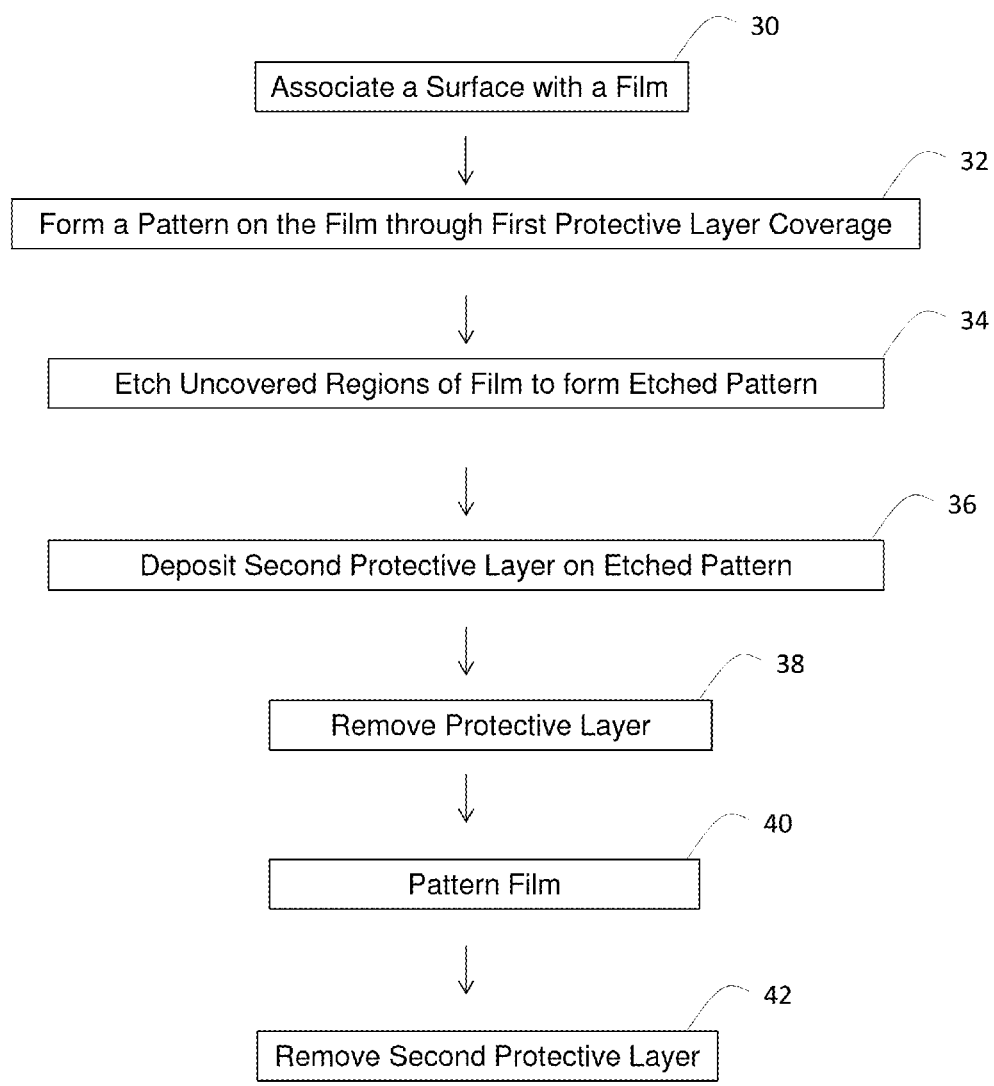

Various steps and methods may be utilized to prepare various types of wires from various types of films that are associated with a meniscus. The illustration in FIG. 2A can also be utilized along with the scheme in FIG. 1B to describe non-limiting examples of methods to prepare wires through one or more of the following steps: (1) associating a surface 10 with a film 12 (step 30 in FIG. 1B and image 1 in FIG. 2A); (2) forming a pattern 13 on the film 12 by selectively covering regions of the film 12 with a first protective layer 14, where the selective coverage leaves uncovered regions of film 12 on the surface 10 (step 32 in FIG. 1B and image 1 in FIG. 2A); (3) etching the uncovered regions of the film 12 on the surface 10, where the etching leads to formation of an etched pattern 15 on the surface 10, and where the etched pattern 15 includes edges 16 surrounded by film 12 (step 34 in FIG. 1B and image 2 in FIG. 2A); (4) depositing a second protective layer 17 on the etched pattern 15, where the second protective layer 17 becomes associated with the film 12 surrounding the edges 16 of the etched pattern 15 (step 36 in FIG. 1B and image 3 in FIG. 2A); (5) removing the first protective layer 14, where the removing of the first protective layer 14 leads to the formation of the meniscus-masked region 18 between the second protective layer 17 and the film 12 (step 38 in FIG. 1B and image 4 in FIG. 2A); (6) patterning the film 12 on the surface 10, where the patterning retains meniscus-masked region 18 of the film 20 on the surface 10 that represents the formed wire, and where the formed wire follows the edges 16 of the etched pattern 15 (step 40 in FIG. 1B and image 5 in FIG. 2A). In some embodiments, the methods of the present disclosure also include a step of (7) removing the second protective layer 17 from the surface 10 (step 42 in FIG. 1B and image 5 in FIG. 2A).

As illustrated in image 5 of FIG. 2A, the methods of the present disclosure result in formation of wires 22 that follow the edges 16 of etched pattern 15 on surface 10. Without being bound by theory or mechanism, Applicants envision that, upon removing the first protective layer 14 (step 38 in FIG. 1B and image 4 in FIG. 2A), water or other liquids adsorb near the edges 16 of etched pattern 15 to lead to the formation of a meniscus between second protective layer 17 and film 12. Without again being bound by theory, Applicants envision that the meniscus can protect the meniscus-masked region 18 of the film from destruction during a subsequent patterning step (step 40 in FIG. 1B and image 5 in FIG. 2A). FIG. 2J shows one such Pt wire formed in this manner.

As set forth in more detail herein, the methods of forming wires in accordance with the aforementioned steps also have numerous embodiments. In particular, each of the aforementioned steps can be carried in various ways to lead to the formation of different types of wires.

Association of a Surface with a Film

In the present disclosure, films generally refer to materials that can be converted into wires. In some embodiments, the films are hydrophilic. In some embodiments, the films are plastic films. In some embodiments, the films are metallic films. In some embodiments, the films include one or more metals, metal nitrides, metal oxides, metal chalcogenides, and combinations thereof. In some embodiments, the films of the present disclosure include one or more metals. In some embodiments, the films are selected from the group consisting of W, Au, Al, Cr, Pt, Cu, Ni, Si, TiN, $WS_2$, $WSe_2$, $MoS_2$, BN, GaN, AlN, $TiO_2$, ZnO, $SiO_2$, $SiO_x$ (e.g., where x is less than 2 and greater than 0.5), and combinations thereof. The use of other film materials (including other metals) can also be envisioned.

The films of the present disclosure can also have various thicknesses. For instance, in some embodiments, the films of the present disclosure have thicknesses that range from about 5 nm to about 100 μm. In some embodiments, the films of the present disclosure have thicknesses that range from about 5 nm to about 100 μm. In some embodiments, the films of the present disclosure have thicknesses that range from about 5 nm to about 15 nm. In some embodiments, the films of the present disclosure have thicknesses of about 10 nm.

The films utilized in the methods of the present disclosure can also have various layers. For instance, in some embodiments, the film is a mono-layer film. In some embodiments, the film is a multi-layer film, such as a bi-layer film or a tri-layer film.

Various methods may be utilized to associate surfaces with films. In some embodiments, the association occurs by placing a pre-formed film on a surface. In some embodiments, the association occurs by forming a film on a surface. In some embodiments, a film is formed on a surface by sputtering particles onto the surface. In some embodiments, a film is formed on a surface by e-beam evaporation of the film onto the surface. In some embodiments, a film is formed on a surface by thermal evaporation of the film onto the surface. Additional methods of forming films on various surfaces can also be envisioned.

The films of the present disclosure may also be associated with various types of surfaces. In some embodiments, the surfaces include a silicon wafer, as previously described. In some embodiments, the silicon wafers contain combinations of Si and $SiO_2$ ($Si/SiO_2$). In some embodiments, the silicon wafers include p-doped Si wafers, such as silicon wafers with 300 nm thermal oxide layer from Silicon Quest International, denoted as $Si/SiO_2$ substrates. In some embodiments, the silicon wafers may include silicon-on-insulator (SOI) wafers. In some embodiments, the silicon wafers have a $Si_3N_4$ layer on their surfaces. In some embodiments, the surface is a sapphire wafer. In some embodiments, the surface is a highly oriented pyrolithic graphite. In some embodiments, the surface is glass.

In some embodiments, the surfaces utilized to form wires may be patterned. In more specific embodiments, the surfaces include pre-patterned silicon-on-insulator (SOI) wafers.

In some embodiments, the surfaces utilized in the methods of the present disclosure include surfaces containing boron nitride (BN). The use of additional surfaces can also be envisioned.

Formation of a Pattern on the Film

Various methods may also be used to form patterns on a film. In some embodiments, a pattern can be formed on a film by selectively covering regions of the film with a first protective layer (e.g., first protective layer 14 in FIG. 2A). Generally, such selective coverage leaves uncovered regions of film on the surface (e.g., regions 13 in FIG. 2A). In some embodiments, such regions represent a pattern.

The methods of the present disclosure may utilize various types of first protective layers to form patterns on films. For instance, in some embodiments, the first protective layer is in the form of a mask. In some embodiments, the mask may contain stripes and gaps that form a pattern, as previously described.

The first protective layers of the present disclosure may also be derived from various compositions. In some embodiments, the first protective layers may be hydrophobic. In some embodiments, the first protective layer is hydrophilic. In some embodiments, the first protective layer is hydrophobic while the second protective layer is hydrophilic. In some embodiments, the first protective layer is hydrophilic while the second protective layer is hydrophobic. In some embodiments both the first and the second protective layers are hydrophilic.

In some embodiments, the first protective layers of the present disclosure may be polymers, such as hydrophobic polymers. In some embodiments, the first protective layers of the present disclosure may include one or more polymers. In some embodiments, the polymers may include, without limitation, poly(methacrylates), poly(esters), poly(ethers), poly(olefins), poly(styrenes), and combinations thereof. In some embodiments, the first protective layers of the present disclosure may include poly(methyl methacrylate) (PMMA). The utilization of additional first protective layers can also be envisioned.

In some embodiments, the first protective layers of the present disclosure may include a metal layer. In some embodiments, the metal layer may include one or more metals. In some embodiments, the one or more metals may include, without limitation, Pd, Pt, Cr, Al, Au, and combinations thereof. In some embodiments, the first protective layers of the present disclosure may be derived from the same composition as the second protective layer. The utilization of additional first protective layers can also be envisioned.

The first protective layers of the present disclosure may have various thicknesses. For instance, in some embodiments, the first protective layers of the present disclosure have thicknesses ranging from about 20 nm to about 2000 nm. In some embodiments, the first protective layers of the present disclosure have thicknesses ranging from about 20 nm to about 60 nm. In some embodiments, the first protective layers of the present disclosure have a thickness of about 30 nm. In some embodiments, the first protective layers of the present disclosure have thicknesses ranging from about 250 nm to about 2000 nm. In some embodiments, the first protective layers of the present disclosure have thicknesses of about 250 nm. In some embodiments, the first protective layers of the present disclosure have thicknesses of about 400 nm. In some embodiments, the first protective layers of the present disclosure have thicknesses of about 2000 nm.

Formation of Etched Patterns on a Surface

In general, an etched pattern forms on uncovered regions of a film on a surface by etching the uncovered regions (e.g., formation of etched pattern 15 on surface 10, as shown in image 2 of FIG. 2A). Generally, an etched pattern includes edges that are surrounded by un-etched films (e.g., edges 16 surrounded by film 12, as also shown image 2 of FIG. 2A). In some embodiments, the film is completely removed from the etched pattern. In some embodiments, the film is partially removed from the etched pattern.

As previously described, various etching methods may be utilized to form etched patterns on a surface. For instance, in some embodiments, the etching occurs by at least one of reactive ion etching, physical sputtering, gas phase chemical etching, and combinations thereof.

In more specific embodiments, the etching occurs by reactive ion etching. In some embodiments, the reactive ion etching occurs under the flow of one or more gases. In some embodiments, the gases may include, without limitation, $CF_4$, $CHF_3$, $SF_6$, $Cl_2$, $BCl_3$, oxygen, argon, hydrogen, nitrogen, halogens, and combinations thereof. In some embodiments, reactive ion etching occurs under the flow of argon. In some embodiments, reactive ion etching occurs under the flow of $CF_4$. In some embodiments, reactive ion etching occurs under the flow of oxygen. In some embodiments, reactive ion etching occurs under the flow of nitrogen. In some embodiments, reactive ion etching occurs under the flow of an argon-hydrogen mixture.

Various types of etching parameters may also be utilized. For instance, in some embodiments, etching may last anywhere from about 20 seconds to about 120 seconds. In some embodiments, etching may last for about 20 seconds, about 60 seconds, or about 120 seconds.

In some embodiments, etching occurs under a gas flow rate (e.g., argon, $CF_4$, $CHF_3$, $SF_6$, $Cl_2$, $BCl_3$, hydrogen, nitrogen, or oxygen). In some embodiments, the gas flow rate ranges from about 15 sccm to about 100 sccm. In some embodiments, the gas flow rate may be about 15 sccm, about 20 sccm, or about 100 sccm.

In some embodiments, the etching occurs under various gas pressures. In some embodiments, the gas pressure may range from about 15 mTorr to about 200 mTorr. In some embodiments, the gas pressure may be about 15 mTorr, about 100 mTorr, or about 20 mTorr.

In addition, the etched pattern may have various shapes. For instance, in some embodiments, the etched patterns may be in the form of lines, letters, cross-bars, and combinations thereof. Additional etched pattern shapes can also be envisioned.

Deposition of Second Protective Layer

As discussed previously, second protective layers form on a surface (e.g., etched patterns of a surface) when a protective material is deposited on a surface (e.g., depositing of a protective material on etched pattern 15 of surface 10 to form second protective layer 17, as shown in image 3 of FIG. 2A). In some embodiments, this results in the association of the second protective layer with the films that surround the edges of the etched pattern (e.g., association of second protective layer 17 with film 12 near edges 16, as shown in image 3 in FIG. 2A). In some embodiments, the second protective layer becomes associated with the film surrounding the edges of the etched pattern through direct contact with the film.

As also discussed previously, various methods may be utilized to deposit second protective layers on surfaces. In some embodiments, second protective layers are deposited on surfaces by depositing one or more protective materials on the surface. In some embodiments, the depositing of protective materials on a surface occurs by sputtering. In some embodiments, the depositing of protective materials on a surface occurs by spraying. In some embodiments, the depositing of protective materials on a surface occurs by e-beam evaporation. In some embodiments, the depositing of protective materials on a surface occurs by spin-coating. Additional modes of depositing protective materials on surfaces can also be envisioned.

In addition, various protective materials may be utilized to form second protective layers on surfaces (e.g., etched patterns of surfaces). For instance, in some embodiments, the protective materials may include one or more metals. In some embodiments, the metal may include, without limitation, Pd, Pt, Cr, Al, Au, and combinations thereof. In some embodiments, the protective material is Al. The use of additional protective materials can also be envisioned.

In some embodiments, the second protective layers of the present disclosure may include one or more polymers. In some embodiments, the polymers include, without limitation, poly(methacrylates), poly(esters), poly(ethers), poly(olefins), poly(styrenes), and combinations thereof. In some embodiments, the second protective layers of the present disclosure may include poly(methyl methacrylate) (PMMA). In some embodiments, the second protective layers of the present disclosure may have the same composition as the first protective layer. The utilization of additional materials as second protective layers can also be envisioned.

The formed protective layers of the present disclosure may have various thicknesses. For instance, in some embodiments, the second protective layers of the present disclosure may have a thickness ranging from about 20 nm to about 60 nm. In some embodiments, the second protective layers of the present disclosure have a thickness of about 30 nm. In some embodiments, the second protective layers of the present disclosure have thicknesses ranging from about 250 nm to about 2000 nm. In some embodiments, the second protective layers of the present disclosure have thicknesses of about 250 nm. In some embodiments, the second protective layers of the present disclosure have thickness of about 2000 nm. Additional second protective layer thicknesses can also be envisioned.

Removal of First Protective Layer

In general, a first protective layer is removed from a film after the formation of a second protective layer on an etched pattern of a surface (e.g., removal of first protective layer 14 from film 12 on surface 10, as shown in images 3-4 in FIG. 2A). As described previously, various methods may be utilized to remove a first protective layer from a film.

For instance, in some embodiments, the removing of the first protective layer occurs by lifting off the first protective layer from a surface. In some embodiments, the first protective layer is lifted off by the use of an object, such as tweezers. In some embodiments, the removal of the first protective layer occurs by etching. In some embodiments, the removal of the first protective layer occurs by dissolving. Additional methods of removing a first protective layer from a film on a surface can also be envisioned.

In some embodiments, the removal of the first protective layer from a film on a surface leads to adsorption of one or more liquids (e.g., water) near the edges of an etched pattern that surround the film that was previously covered by the first protective layer (e.g., adsorption of water near edges 16 of etched pattern 15, as shown in image 4 in FIG. 2A). In some embodiments, such adsorption of one or more liquids (e.g., water) can in turn lead to the formation of a meniscus-masked region between the second protective layer on the etched pattern and the film associated with the second protective layer (e.g., formation of meniscus-masked region 18 between second protective layer 17 and film 12, as shown in image 4 in FIG. 2A). In more specific embodiments, the formed meniscus is a flat meniscus that reaches the top of the second protective layer. In some embodiments, the meniscus may extend to the horizontal plane. In more specific embodiments, the meniscus may extend for more than about 50 nm on the horizontal plane. In some embodiments, the meniscus can protect a portion of the film during the patterning of the film.

Patterning of the Film

In general, the patterning of the film refers to a step where a film is patterned after it becomes associated with a meniscus that forms a meniscus-masked region on the film. In some embodiments, the patterning results in formation of wires from the meniscus-masked region of the film. In some embodiments, the patterning of the film separates the meniscus-masked region of the film from the rest of the film.

In some embodiments, the patterning of a film on a surface occurs after the removal of the first protective layer from an etched pattern on the surface (e.g., patterning of film 12 on surface 10 after removal of first protective layer 14, as shown in images 3-5 of FIG. 2A).

In some embodiments, the patterning of the film occurs by etching the film. In such embodiments, the patterning the film may also be referred to as re-etching or second etching of the film.

The patterning of the film by re-etching may also occur by the same methods described previously. For instance, in some embodiments, the re-etching occurs by at least one of reactive ion etching, physical sputtering, gas phase chemical etching, and combinations thereof. In more specific embodiments, the re-etching occurs by reactive ion etching. In some embodiments, the reactive ion etching occurs under the flow of one or more gases. In some embodiments, the gases may include, without limitation, $CF_4$, $CHF_3$, $SF_6$, $Cl_2$, $BCl_3$, oxygen, argon, hydrogen, nitrogen, halogens, and combinations thereof.

The methods of the present disclosure may utilize various types of re-etching parameters. For instance, in some embodiments, re-etching may last anywhere from about 20 seconds to about 90 seconds. In some embodiments, the re-etching may last for about 20 seconds, about 60 seconds, or about 90 seconds.

In some embodiments, the first etching time and the re-etching times may be different. For instance, in some embodiments, the re-etching time may last longer than the first etching time. In more specific embodiments, the re-etching time may last for about 120 seconds while the first etching time lasts for about 20 seconds.

In some embodiments, re-etching occurs under a gas flow rate (e.g., $CF_4$, $CHF_3$, $SF_6$, $Cl_2$, $BCl_3$, argon, hydrogen, nitrogen, or oxygen). In some embodiments, the gas flow rate ranges from about 15 sccm to about 100 sccm. In some embodiments, the gas flow rate may be about 15 sccm, about 20 sccm, about 50 sccm, or about 100 sccm.

In some embodiments, the re-etching occurs under various gas pressures. In some embodiments, the gas pressure may range from about 15 mTorr to about 200 mTorr. In some embodiments, the gas pressure may be about 15 mTorr, about 100 mTorr, or about 20 mTorr.

In some embodiments, the patterning retains a meniscus-masked region of a film on a surface (e.g., retainment of meniscus-masked region 18 of the film on surface 10, as shown in images 4-5 of FIG. 2A). In some embodiments, the meniscus-masked region 18 of the film follows the edges of the etched pattern (e.g., meniscus-masked region 18 following edges 16 of etched pattern 15, as shown in images 4-5 of FIG. 2A). In some embodiments, the meniscus-masked region of the film represents the formed wire.

In some embodiments, the re-etching step is repeated a plurality of times while exposing the sample to air between etchings to result in the formation of a wire with a step-wise gradient. See, e.g., FIG. 25. For instance, in some embodiments, the second etching step may be repeated 4 times in order to form 4 steps on the formed wire.

In some embodiments, the film layer is exposed to air or moisture prior to repeating a re-etching step. Without being bound by theory, Applicants envision that the exposure of the film layer to air or moisture can result in the formation of another meniscus on the side of a partially etched film layer. Applicants envision that the meniscus can in turn protect the film layer during a subsequent patterning step to form a wire with a step-wise gradient.

Removal of Second Protective Layer

In some embodiments, a second protective layer is optionally removed from a surface after the patterning of the film (e.g., removal of second protective layer 17 from surface 10 after patterning of the film 12, as shown in images 4-5 of FIG. 2A). Various methods may be utilized to remove second protective layers from a surface. In some embodiments, the second protective layer is removed from a surface by physical removal of the second protective layer. In some embodiments, the second protective layer is removed from a surface by wet etching. In some embodiments, wet etching involves exposure of the surface to one or more acids. In some embodiments, the one or more acids include, without limitation, nitric acid, phosphoric acid, sulfuric acid, acetic acid, and combinations thereof. In more specific embodiments, the second protective layer is removed from a surface by wet etching the surface with a mixture of phosphoric acid (e.g., 80% by volume), nitric acid (e.g., 5% by volume), acetic acid (e.g., 5% by volume), and water (e.g., 10% by volume). In some embodiments the second protective layer is removed with aqua regia. In some embodiments the second protective layer is removed by an Au5 ($I_2$:KI:water in a ratio of 1:4:40 by weight) wet etchant. Additional methods by which to remove second protective layers from surfaces can also be envisioned.

Formed Wires

The methods of the present disclosure can be used to produce various types of wires. For instance, in some embodiments, the methods of the present disclosure can be used to produce wires with various widths. In some embodiments, the wires have widths ranging from about 0.5 nm to about 250 nm. In some embodiments, the formed wires have widths ranging from about 5 nm to about 20 nm. In some embodiments, the formed wires have widths ranging from about 7 nm to about 13 nm. In some embodiments, the formed wires have widths of about 10 nm.

The formed wires of the present disclosure can also have various thicknesses. For instance, in some embodiments, the wires have thicknesses ranging from about 5 nm to about 100 nm. In some embodiments, the formed wires have thicknesses ranging from about 20 nm to about 30 nm. In some embodiments, the formed wires have thicknesses of about 20 nm.

In some embodiments, the widths of the wires are controllable as a function of one or more growth parameters. In some embodiments, the growth parameters include second protective layer thickness. Therefore, in further embodiments, the methods of the present disclosure also include a step of controlling the width of the wires.

In some embodiments, the widths of the wires are controllable as a function of the size of the meniscus. In some embodiments, the size of the meniscus can be controlled by changing or adjusting the contents of the solvents used during wire formation. For instance, in some embodiments, wire formation can occur in the presence of water alone, water and organic solvents (e.g., alcohol ethanol, methanol, propanol, ethylene glycol, diglyme, etc.), water and polymer mixtures (e.g., poly(ethylene glycol)), water and salt mixtures (e.g., sodium chloride), or no water and pure organic solvents (e.g., ethanol, methanol, propanol, ethylene glycol, diglyme, etc.), light oils with or without water (e.g., dodecane), silicone oils with or without water (e.g., polydimethylsiloxane), and combinations thereof. Without being bound by theory, the above combinations can change the size of the meniscus and control the wire width. In some embodiments the width of the formed wires is controlled by changing the surface wettability. In some embodiments the surface is chemically modified to achieve a desired wettability.

The formed wires of the present disclosure can also have various lengths. In some embodiments, the wires have lengths ranging from about 10 nm to about 1 m. In some embodiments, the wires have lengths ranging from about 10 nm to about 1 µm. In some embodiments, the wires have lengths ranging from about 10 nm to about 100 nm.

The formed wires of the present disclosure can also have various compositions. In general, the composition of the formed wires resembles the compositions of the films utilized to make the wires. In some embodiments, the formed wires include metal wires. In some embodiments, the metal wires include one or more metals, metal nitrides, metal oxides, metal chalcogenides, and combinations thereof. In some embodiments, the wires include, without limitation, W, Au, Pt, Cu, Ni, Al, Cr, Si, TiN, $WS_2$, $WSe_2$, $MoS_2$, BN, GaN, AlN, $TiO_2$, ZnO, $SiO_2$, $SiO_x$ (e.g., where x is less than 2 and greater than 0.5), and combinations thereof. In some embodiments, the formed wires include at least one of W wires, Au wires, Pt wires, Ti wires, Si wires, $SiO_2$ wires, and combinations thereof. In some embodiments, the present disclosure may include plastic wires.

The formed wires of the present disclosure can also have various types of shapes. For instance, in some embodiments, the wires of the present disclosure can be in the form of lines, letters, cross-bars, or intersecting wires. Additional shapes can also be envisioned.

The formed wires of the present disclosure can also have various properties. For instance, in some embodiments, the formed wires of the present disclosure may be conducting, semiconducting, or insulating.

Chemical Methods of Preparing Wires

Figure 1C:
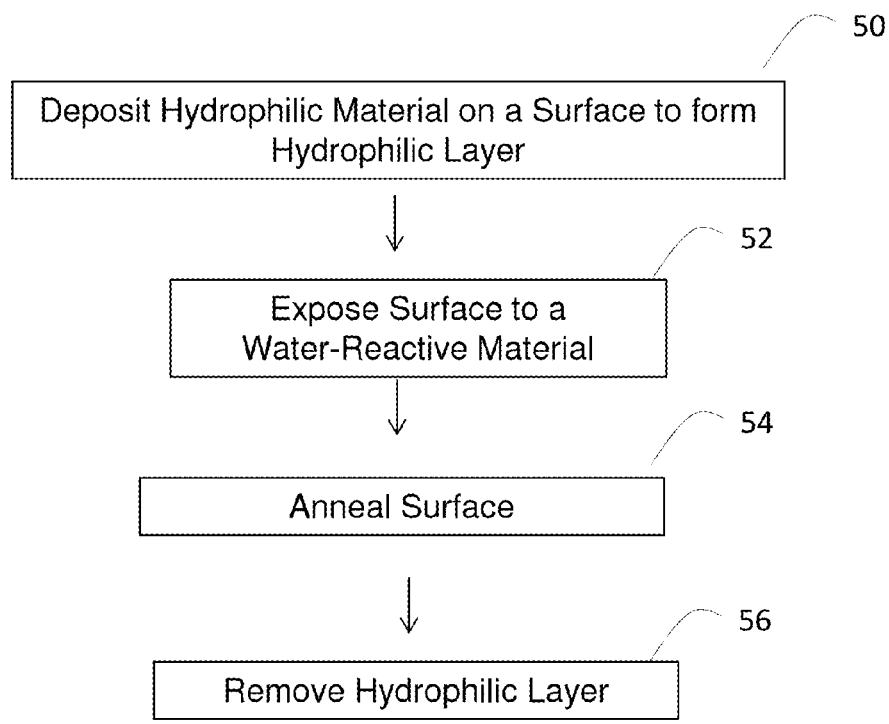

Further embodiments of the present disclosure pertain to alternative methods of preparing wires. Various embodiments of such methods can be described in the illustration shown in FIG. 2L and the scheme shown in FIG. 1C as follows: (1) depositing a hydrophilic material (e.g., a metal) on a surface 30, where the depositing leads to formation of a hydrophilic layer 37 (e.g., metal layer) on surface 30 (Step 50 in FIG. 1C and image 1 in FIG. 2L); and (2) exposing surface 30 to a water-reactive material (e.g., $TiCl_4$), where the exposing results in formation of second layer 44 (e.g., hydrated $TiO_2$ or other hydrated oxide) that follows edge 36 of hydrophilic layer 37 on surface 30, where second layer 44 represents the formed wire (Step 52 in FIG. 1C and images 1-2 in FIG. 2L). In some embodiments, the methods of the present disclosure also include a step of (3) annealing the surface 30 to result in the transformation of wire 44 (e.g., removal of water from a hydrated oxide 44 to get anhydrous oxide 46) (Step 54 in FIG. 1C and images 2-3 in FIG. 2L). In some embodiments, the methods of the present disclosure also include a step of (4) removing the hydrophilic layer 37 from the surface 30 (Step 56 in FIG. 1C and images 3-4 in FIG. 2L).

Without being bound by theory, it is envisioned that, in some embodiments, the formation of a liquid (e.g., water) meniscus 38 between hydrophilic layer 37 and surface 30 facilitates the hydrolysis of water reactive materials and facilitates the formation of wire 44 (FIG. 2L, images 1-2). It is also envisioned that, upon annealing, wire 44 may be further transformed (e.g., through dehydration).

As set forth in more detail herein, the methods of forming wires in accordance with the aforementioned steps also have numerous embodiments. In particular, each of the aforementioned steps can be carried in various ways to lead to the formation of different types of wires Formation of a Hydrophilic Layer on a Surface In general, hydrophilic layers can be formed on surfaces by depositing hydrophilic materials on the surface. Various methods may be utilized to deposit hydrophilic materials on surfaces. In some embodiments, the depositing of hydrophilic materials on a surface occurs by sputtering. In some embodiments, the depositing of hydrophilic materials on a surface occurs by spraying. In some embodiments, the depositing of hydrophilic materials on a surface occurs by e-beam evaporation. Additional modes of depositing hydrophilic materials on surfaces can also be envisioned.

In addition, various hydrophilic materials may be utilized to form hydrophilic layers on surfaces. For instance, in some embodiments, the hydrophilic materials may include one or more metals. In some embodiments, the metals may include, without limitation, Pd, Pt, Cr, Al, Au, and combinations thereof. In some embodiments, the hydrophilic material is Au. The use of additional hydrophilic materials can also be envisioned.

The formed hydrophilic layers of the present disclosure may have various thicknesses. For instance, in some embodiments, the hydrophilic layers of the present disclosure may have a thickness ranging from about 20 nm to about 60 nm. In some embodiments, the hydrophilic layers of the present disclosure have a thickness of about 30 nm. Additional hydrophilic layer thicknesses can also be envisioned.

In addition, the hydrophilic layers of the present disclosure may be associated with various types of surfaces. In some embodiments, the surfaces include a silicon wafer, as previously described. In some embodiments, the silicon wafers contain combinations of Si and $SiO_2$ ($Si/SiO_2$). In some embodiments, the silicon wafers include p-doped Si wafers, such as silicon wafers with 300 nm thermal oxide layer from Silicon Quest International, denoted as $Si/SiO_2$ substrates. In some embodiments, the silicon wafers may include silicon-on-insulator (SOI) wafers.

In some embodiments, the surfaces utilized to form wires may be pre-patterned. In more specific embodiments, the surfaces include pre-etched silicon-on-insulator (SOI) wafers.

In some embodiments, the surfaces utilized in the methods of the present disclosure include surfaces containing boron nitride (BN). The use of additional surfaces can also be envisioned.

Exposure of Surface to Water-Reactive Materials

Various methods may also be utilized to expose surfaces to water-reactive materials (e.g., gaseous and water reactive compounds, such as $TiCl_4$). In some embodiments, the water-reactive materials are exposed to surfaces by direct application under vacuum.

In addition, the surfaces of the present disclosure may be exposed to various types of water-reactive materials. In some embodiments, the water-reactive materials may include one or more compounds containing W, Au, Pt, Ti, Si, Zn, and combinations thereof. In some embodiments, the water-reactive materials may include Ti. In some embodiments, the water-reactive materials may include at least one of titanium tetrachloride ($TiCl_4$), diethyl zinc, tetraethoxysilane, and combinations thereof. In some embodiments, the water-reactive material is titanium tetrachloride. The use of additional water-reactive materials can also be envisioned.

The water-reactive materials of the present disclosure may be in various states. For instance, in some embodiments, the water reactive materials of the present disclosure may be in a gaseous state. In some embodiments, the water reactive materials of the present disclosure may be in a liquid state. In some embodiments, the water reactive materials of the present disclosure may be in a solid state. In some embodiments, the water reactive materials of the present disclosure may be in a combination of one or more states, including a liquid state, a solid state, and a gaseous state.

Annealing of the Surface

Various methods may also be utilized to anneal a surface. In some embodiments, the surface is annealed by exposing the surface to temperatures of at least about 100° C. In some embodiments, the annealing temperatures range from about 100° C. to about 1,000° C. In some embodiments, the annealing occurs at around 300° C.

In some embodiments, the annealing occurs in a furnace. In some embodiments, the annealing occurs at ambient pressure. In some embodiments, the annealing occurs in the presence of air.

Annealing can occur for various periods of time. For instance, in some embodiments, the annealing occurs for about 30 minutes to about 180 minutes. In some embodiments, the annealing occurs for about 90 minutes.

Removal of Hydrophilic Layer

As previously described, various methods may also be utilized to remove a hydrophilic layer from a surface. In some embodiments, the hydrophilic layer is removed from a surface by physical removal of the hydrophilic layer. In some embodiments, the hydrophilic layer is removed from a surface by wet etching. In some embodiments, wet etching involves exposure of the surface to one or more acids. In some embodiments, the one or more acids include, without limitation, nitric acid, phosphoric acid, sulfuric acid, acetic acid, and combinations thereof. In more specific embodiments, the hydrophilic layer is removed from a surface by wet etching the surface with a mixture of phosphoric acid (e.g., 80% by volume), nitric acid (e.g., 5% by volume), acetic acid (e.g., 5% by volume), and water (e.g., 10% by volume). In some embodiments the second protective layer is removed with aqua regia. In some embodiments the second protective layer is removed by an Au5 ($I_2$:KI:water in a ratio of 1:4:40 by weight) wet etchant. Additional methods by which to remove hydrophilic layers from surfaces can also be envisioned.

Formed Wires

The methods of the present disclosure can be used to produce various types of wires. For instance, in some embodiments, the methods of the present disclosure can be used to produce wires with various widths. In some embodiments, the wires have widths ranging from about 0.5 nm to about 250 nm. In some embodiments, the formed wires have widths ranging from about 5 nm to about 20 nm. In some embodiments, the formed wires have widths ranging from about 7 nm to about 13 nm. In some embodiments, the formed wires have widths of about 10 nm.

The formed wires of the present disclosure can also have various thicknesses. For instance, in some embodiments, the wires have thicknesses ranging from about 5 nm to about 100 nm. In some embodiments, the formed wires have thicknesses ranging from about 20 nm to about 30 nm. In some embodiments, the formed wires have thicknesses of about 20 nm.

The formed wires of the present disclosure can also have various lengths. In some embodiments, the wires have lengths ranging from about 10 nm to about 1 m. In some embodiments, the wires have lengths ranging from about 10 nm to about 1 μm. In some embodiments, the wires have lengths ranging from about 10 nm to about 100 nm.

The formed wires of the present disclosure can also have various types of shapes. For instance, in some embodiments, the wires of the present disclosure can be in the form of lines, letters, cross-bars, or intersecting wires. Additional shapes can also be envisioned.

The formed wires of the present disclosure can also have various contents. For instance, in some embodiments, the formed wires of the present disclosure may include compounds of at least one of W, Au, Pd, Pt, Cr, Al, Au, Ti, Si, Zn and combinations thereof. In some embodiments, the wires include Ti. In some embodiments of the present disclosure, the wires are $TiO_2$ wires.

Applications and Advantages

To the best of Applicants' knowledge, the methods of the present disclosure provide the first industrially applicable methods of planar fabrication and controlled positioning of high aspect-ratio nanowires and narrow graphene nanoribbons. Fabrication of narrow high aspect ratio objects allows both miniaturization and control of size-dependent properties of materials (e.g., semiconductors). Furthermore, patterning of any semiconducting materials into quasi-1D structures allows control over band structure.

Furthermore, the methods of the present disclosure do not require high resolution lithography tools. Rather, the graphene nanoribbons and wires could be written in any shape by the methods of the present disclosure.

Therefore, the graphene nanoribbons and wires formed by the methods of the present disclosure can find applications in numerous fields, including microelectronics, photovoltaics and photonic applications. Likewise, the graphene nanoribbons and wires formed by the methods of the present disclosure can be used as electrodes in molecular electronics devices.

In more specific embodiments, the graphene nanoribbons and wires formed by the methods of the present disclosure can be used in various electrical devices, including semiconductors, transistors (e.g., field-effect transistors (FETs)), and the like.

Additional Embodiments

Reference will now be made to more specific embodiments of the present disclosure and experimental results that provide support for such embodiments. However, Applicants note that the disclosure below is for illustrative purposes only and is not intended to limit the scope of the claimed subject matter in any way.

Example 1

Meniscus-Mask Lithography for Narrow Graphene Nanoribbons

This Example describes a new planar top-down method for the fabrication of precisely positioned, very narrow (sub-10 nm) and high aspect ratio (>2000) graphene nanoribbons (GNRs) that have been prepared from graphene sheets through a process called meniscus-mask lithography (MML). The method does not require demanding high resolution lithography tools. The mechanism involves masking by atmospheric water adsorbed at the edge of the lithography pattern written on top of the target material. The GNR electronic properties depend on the graphene etching method with argon reactive ion etching yielding remarkably consistent results. The influence of the most common substrates ($Si/SiO_2$ and BN) on the electronic properties of GNRs is demonstrated. The technique is also shown to be applicable for fabrication of narrow metallic wires, underscoring the generality of MML for narrow features on diverse materials.

The MML GNR fabrication sequence is demonstrated in FIG. 2A. In a typical process (Example 1.1), the lithography pattern 15 is written on the graphene film 12 in such a way that the desired GNR position corresponds to the pattern edge 16. After the pattern 15 is developed, the exposed graphene film 12 is etched via reactive ion etching (RIE). A sacrificial metal layer 17 is deposited and the pattern is lifted-off. Then the structure is once again exposed to RIE, and the sacrificial metal layer 17 is wet-etched. As a result, the graphene film 20 near the initial pattern edges remains unaffected, and the process leads to the formation of narrow GNRs 22 (FIGS. 2B-I, Example 1.2).

Two RIE regimes were tested for MML GNR fabrication: oxygen RIE that is conventionally used for graphene etching and Ar RIE that is milder since it removes graphene by physical sputtering only. The width was quite uniform over the ribbon length and between similarly fabricated samples (Example 1.3). For GNRs produced using oxygen RIE (ox-GNRs) on $Si/SiO_2$ and BN substrates, the mean widths were 13.6±1.0 nm and 14.2±1.0 nm, respectively. For GNRs produced using Ar RIE (ar-GNRs) the widths were smaller (i.e., 8.7±1.0 nm and 6.4±1.0 nm for $Si/SiO_2$ and BN substrates, respectively). The resulting GNRs demonstrated remarkably high aspect ratios (>2000), limited predominantly by the macroscopic defects in the original transferred graphene film.

Applicants have also demonstrated that the method described in this Example could be expanded to other materials. For instance, Applicants have substituted graphene with sputtered 15 nm platinum films. Thereafter, a similar fabrication sequence resulted in platinum nanowires with a mean width of 11.7±1.0 nm (FIG. 2J and Examples 1.3 to 1.5).

The GNRs can be fabricated by MML in different shapes (FIG. 2K and Example 1.6) with the only limitation being that they are located on the edge of the written pattern. In addition, Applicants have observed that the GNR width does not depend on the pattern shape. Furthermore, Applicants have observed that the fabrication resulted in identical GNRs on all sides of the pattern, thus excluding shadowing due to sample tilt during RIE as a possible formation mechanism.

Applicants have also observed that GNR widths are robust over a range of the lithography dosages used (Example 1.7). The GNR widths do not depend on the sacrificial metal used in the fabrication: the GNR widths for Pd, Pt and Al were nearly the same. Thus, without being bound by theory, the formation of the GNRs does not depend on the ability of the metal to form a native oxide layer. Without being bound by theory, Applicants envision that the mechanism of GNR formation is not related to oxide layer shadowing. In addition, GNR widths remained nearly the same for different Al layer thicknesses (Example 1.8).

Without again being bound by theory, Applicants envision that MML works for GNR formation by adsorbate protection (shown by blue arrows in FIG. 2A) of the graphene surface during the second RIE step. The adsorbate is most likely atmospheric water, confined to the wedge formed by the graphene and sacrificial metal. Such adsorbates could be stabilized by concave surface features (pores, wedges), and could sustain short low pressure procedures such as RIE. The mechanism was experimentally supported by the fact that no GNRs were formed when the sample was heated to 120° C. for 30 min prior to etching, nor when the sample was soaked in acetone prior to etching to ensure no contact with atmospheric moisture (Example 1.9).

The meniscus in the wedge formed by substrate and sacrificial metal mask is too small to be described with continuum models (Example 1.10.1). However, Applicants have shown that a few-layer thick adsorbate beading nearby the pattern edge could be explained using a simple first-order approximation molecular model of adsorption (Example 1.10.2). This few-layer meniscus has a size comparable to the width of observed GNRs and likely protects the underlying graphene area from RIE. For MML, the resolution is determined by the shape of the liquid meniscus. This might be controlled with the judicious choice of solvent or substrate treatment, enabling width variations in the final masked object.

Since the GNRs are formed at the edge of the pattern, the procedure does not require lithography setups to have very high resolution. Thus, similar fabrication procedures could be performed even with photolithography (Example 1.11). The GNR mean width of 23±4 nm was slightly higher than for GNRs fabricated using the e-beam lithography procedure. To Applicants' knowledge, this is first time that narrow GNRs have been fabricated by photolithography.

Raman spectra of GNRs (FIG. 3A) revealed characteristic 2D (~2700 $cm^{-1}$), G (~1584 $cm^{-1}$) and D (~1350 $cm^{-1}$) peaks both for ox-GNRs and ar-GNRs on $Si/SiO_2$ substrates. The G/2D intensity ratio for the GNRs increases as the GNR widths decreases. For undoped graphene, the G/2D ratio is ~0.3, whereas it is 1.0±0.2 and 4.3±0.5 for ox-GNRs and ar-GNRs, respectively. Without being bound by theory, such differences in G/2D ratios are likely attributed to intrinsic GNR properties. In all the GNR spectra, the G peak is considerably wider compared to that of the starting CVD graphene film, as expected for narrow GNRs. For ar-GNRs, the wide G peak could be interpreted as a doublet (Example 1.12).

The ar-GNRs are narrower than ox-GNRs. Hence, they might have a larger edge-effect. However, the D/G intensity ratio for ar-GNRs is lower (0.6±0.1) than for ox-GNRs (1.1±0.1), indicating that oxygen RIE leaves GNRs more disordered compared to Ar RIE. Assuming the protective adsorbates mechanism, the difference is likely caused by more defects in the narrow region near the edges for ox-GNRs compared to ar-GNRs.

To investigate the electronic properties of narrow GNRs, field-effect transistor (FET) devices were fabricated (FIGS. 3B-C) with Pd source and drain electrodes placed on the ribbons and a 300 nm thermal oxide coated $p^{++}$-Si substrate used as a back gate. The channel length was 0.8 to 3.5 µm. For each type of GNRs, at least 12 devices were studied (Example 1.13).

Figure 3:
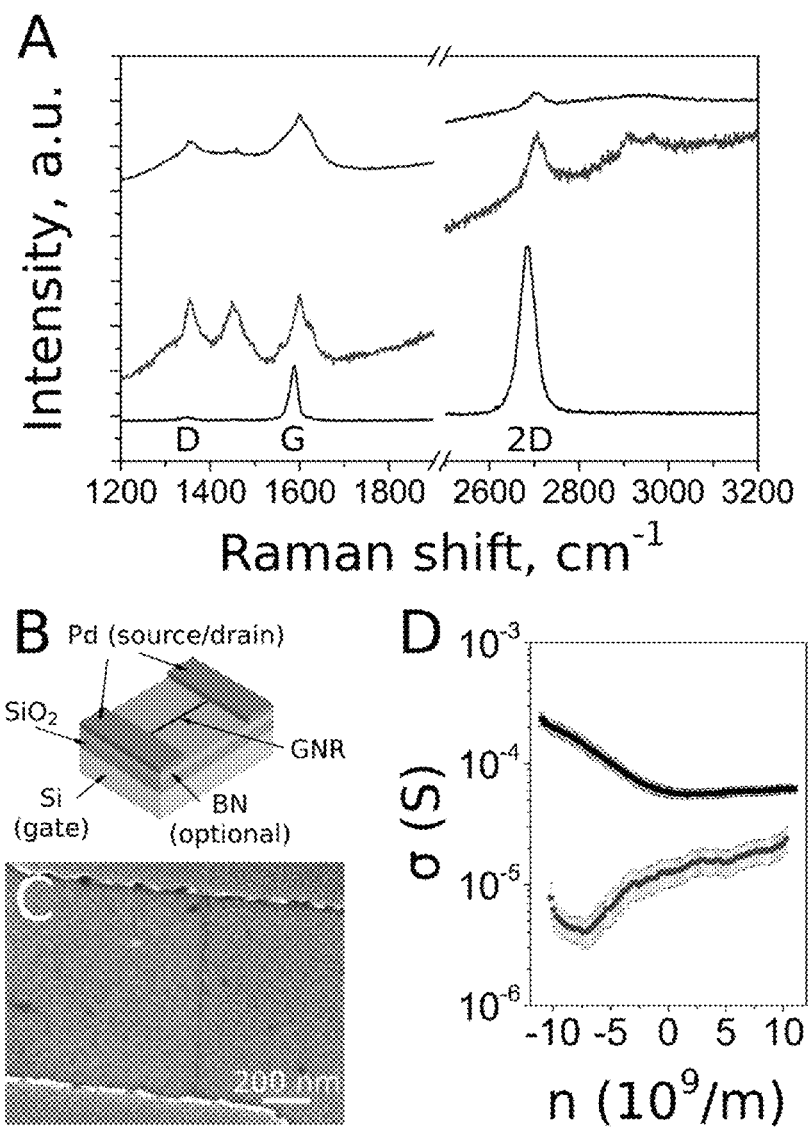

The $Si/SiO_2$ substrate is known to cause electron and hole puddles in graphene, resulting in charge trapping effects. The conventional method to avoid charge trapping in graphene devices is to use a BN flake as the substrate. The charge trapping effects due to $Si/SiO_2$ have been demonstrated in GNRs. Ar-GNR devices both on $Si/SiO_2$ and BN substrates (30 to 70 nm thick) demonstrated remarkably consistent behavior (FIG. 3D). Room temperature gating curves in FIG. 3D were averaged over 50 devices for $Si/SiO_2$ and over 12 devices for BN substrates. The conductivity was calculated using the widths of the GNRs as 8.7 nm on $Si/SiO_2$ and 6.4 nm on BN. In contrast to ar-GNRs, wider ox-GNRs on $Si/SiO_2$ substrates had strong variation in both ON/OFF ratios and charge neutrality point positions, while ox-GNRs on BN substrate had consistent charge neutrality point position, but still large ON/OFF variation (Example 1.13).

The room temperature ON/OFF ratio for ar-GNRs is rather modest at ~10. This contrasts with some reports on the electronic behavior of similarly narrow or even larger width GNRs that showed extremely high ON/OFF ratios (up to $10^7$) observed at room temperature. Applicants have estimated the holes mobility as ~14 $cm^2/V \cdot s$ for ar-GNRs on $Si/SiO_2$ substrate, which agrees well with published data on charge carrier mobilities in narrow GNRs.

When discussing the electronic properties of GNRs with defective edges, it is important to distinguish the true band gap from the so-called transport or mobility gap that originates from Coulomb blockade due to edge defects or substrate-induced alternating electron and hole puddles. Both BN and $Si/SiO_2$ substrates result in potential fluctuations over the GNR length. However, the lateral scale and the amplitude of those strongly differ. For $Si/SiO_2$, the characteristic size of the puddle is much smaller, and the fluctuations of potential amplitude are much higher compared to BN.

According to the Raman spectral data, ar-GNRs edges are less defective compared to ox-GNRs. The $Si/SiO_2$ substrate induces potential fluctuations that are comparable with fluctuations caused by edge defects in ox-GNRs (Example 1.13) while they dominate over potential fluctuations caused by edge defects in ar-GNRs. The electronic properties of ar-GNRs on $Si/SiO_2$ are determined predominantly by substrate interactions. In the case of the ar-GNRs on BN substrates, both potential fluctuations due to the edge defects and substrate interaction are rather small.

Since the ON/OFF ratio for ar-GNRs on BN is comparable to that observed for ar-GNRs on $Si/SiO_2$ substrates, it is likely that the true bandgap is dominating the behavior of ar-GNRs on the BN substrate (Example 1.13). The bandgap for the ar-GNRs could be estimated from theoretical studies. Accordingly, a 6.4-nm-wide zigzag-edged GNR yields an expected bandgap of ~0.12 eV. Bandgap estimation for armchair-edged GNRs is more difficult since the properties of ideal armchair GNRs differ strongly depending on the number of dimer lines in the GNR structure. Bandgap $E_g$ dependence on GNR width w could be summarized as $E_g=a/w$, where the coefficient a takes values between 0.2 and 1.5 eV·nm. This could exceed the potential fluctuations due to the BN substrate.

Figure 4:
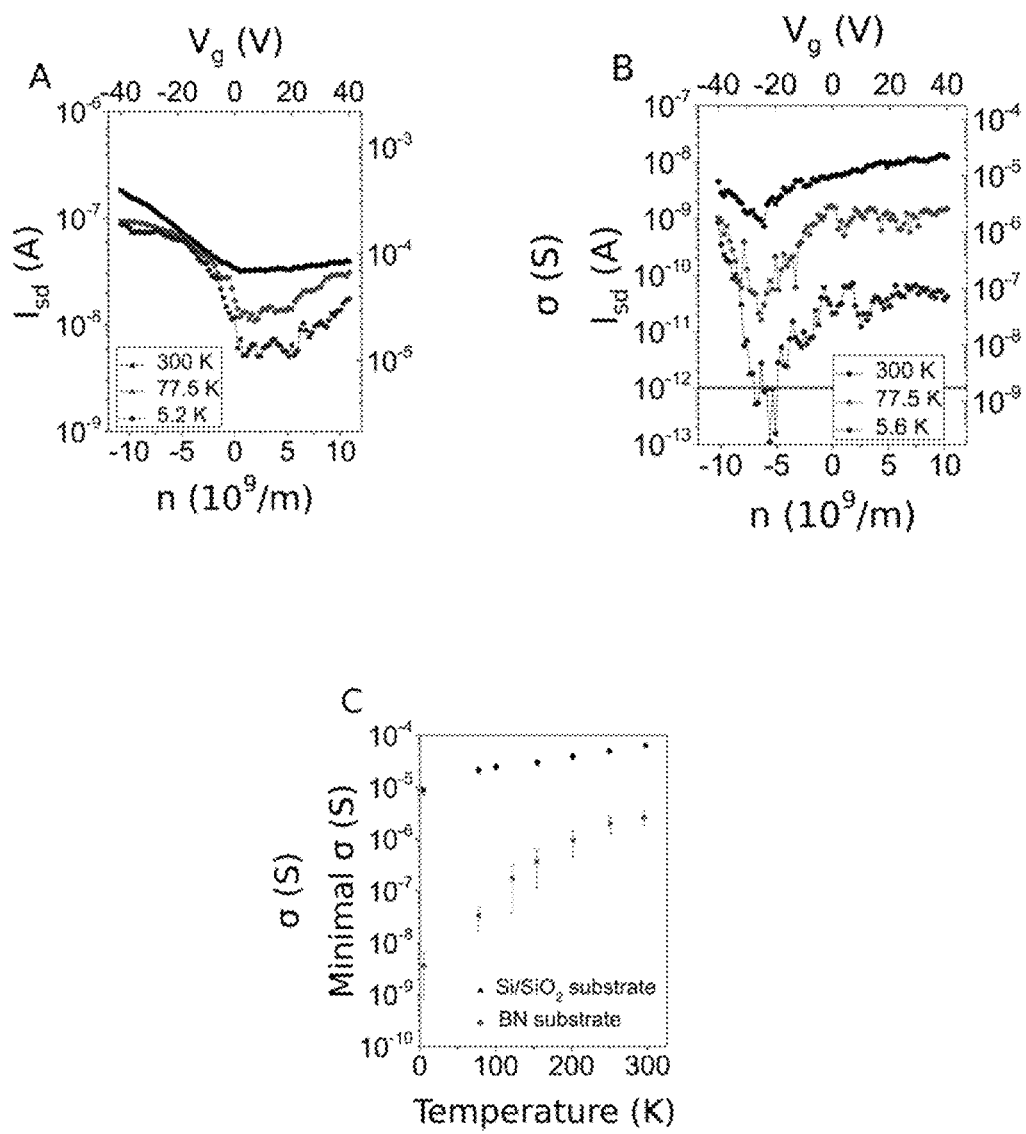

Low temperature transport properties of ar-GNRs on $Si/SiO_2$ and BN are shown in FIG. 4. For ar-GNRs on $Si/SiO_2$ (FIG. 4A), upon cooling from room temperature to 5 K, the ON/OFF ratio only increased from ~4 to ~20. Furthermore, the gating curves demonstrate (especially at 200 K and below) a clear plateau for low currents, which are significantly above the measurement limit of the instrument. Without being bound by theory, the plateau observed could be interpreted in terms of a transport gap. The source-drain voltage is high enough so that for all gate voltages corresponding to Coulomb blockade, the barrier size is small, which results in measurable tunneling current. The small change in minimal conductivity with temperature agrees with this conclusion and is consistent for all devices measured (FIG. 4C).

The gating curves for ar-GNRs on BN substrate are quite different. The lowest current (OFF) decreases about three orders of magnitude upon cooling from 300 K to 5 K. Near the temperature of liquid helium, the gating curve reaches the noise level (FIG. 4B, green line). The ON/OFF ratio for ar-GNRs on BN thus increases from ~10 to ~$10^3$, which together with the current dropping to a minimal measurable value, agrees with the presence of a true bandgap.

In sum, Applicants have demonstrated in this Example a new scalable top-down method for fabrication of high aspect ratio narrow objects by means of simple lithography that Applicants termed MML. Applicants have also shown the applicability of MML for preparation of very narrow GNRs of arbitrary configuration. Without being bound by theory, the apparent formation mechanism is graphene protection by adsorbates in the wedge formed by the sacrificial metal layer and the graphene on the edge of the lithography pattern. The Ar RIE process was found to result in fabrication of GNRs with consistent electronic properties. The ar-GNR on $Si/SiO_2$ behavior could be explained in terms of the transport gap, while the electronic properties of ar-GNRs on BN substrate could be explained by the presence of a true bandgap.

Example 1.1

Materials and Methods

Fabrication of GNRs was performed using CVD graphene as the starting films. Fabrication of platinum wires was performed starting from a 15 nm thick platinum film sputtered on the substrate using Denton Desk V Sputter system.

Room temperature reactive ion etching (RIE) with oxygen or argon was performed using a Trion RIE instrument and Oxford Plasma Lab 80 Plus RIE instrument. Varying temperature RIE processes with nitrogen were performed using a Trion Orion II Load Lock PECVD instrument.

Sacrificial metal layer was deposited either by sputtering (Al and Pt, Denton Desk V Sputter system) or by e-beam evaporation (Pd). Sacrificial layer thickness was 20 nm unless stated otherwise. For Al wet etching, the mixture of $H_3PO_4$/$HNO_3$/$CH_3COOH$/$H_2O$ (80/5/5/10 vol. %) was used. Sacrificial Pt and Pd layers were etched using aqua regia. Sacrificial Au layer was etched using Au5 wet etchant.

GNR FET devices were fabricated via conventional e-beam lithography with 40 nm e-beam evaporated Pd pads. Electrical measurements were performed under vacuum (chamber pressure less than $10^{-5}$ Torr) using a Desert Cryogenic probe 6 system. Prior to measurements the samples were held under vacuum for at least 4 d to ensure the desorption of atmospheric moisture from GNRs. The IV data were recorded using an Agilent 4155C semiconductor parameter analyzer. Gate voltage was varied in range −40 to +40 V. Sweeping was performed from negative to positive voltages. For recording gating curves, the source-drain voltage was set to 0.1 V. Low temperature measurements were performed in the range 5 to 300 K in the same system using a LakeShore 331 Temperature Controller with Si diode sensor.

The graphene growth procedure was an adjusted version of conventional CVD graphene synthesis (*Science* 2009, 324, 1312-1314). Prior to graphene growth, Cu foils (99.8% pure) were annealed at 1050° C. in an Ar/$H_2$ atmosphere (overall pressure ~8.0 Torr, Ar flow 500 sccm, $H_2$ flow 50 sccm) for 1 h. The growth process was performed at 1050° C. in a $H_2$/$CH_4$ atmosphere immediately after foil annealing (overall pressure ~1.0 Torr, $H_2$ flow 50 sccm, $CH_4$ flow 5 sccm). After growth step, the sample was cooled to room temperature in Ar/$H_2$ atmosphere (overall pressure ~8.0 Torr, Ar flow 500 sccm, $H_2$ flow 50 sccm) with a cooling rate of ~100° C./min. Graphene on Cu foil was covered by spin-coating with PMMA layer, and then the Cu foil was wet etched in $CuSO_4$/HCl etchant (20 g $CuSO_4 \cdot 5H_2O$, 50 mL HCl, 50 mL $H_2O$). Graphene with PMMA was washed several times in DI water prior to transfer onto the substrate. After placing on the substrate it was thoroughly dried, and then PMMA was removed in acetone. Annealing of the samples in reducing medium was performed at 350 to 500° C. in Ar/$H_2$ atmosphere with overall pressure ~8.0 Torr and with Ar and $H_2$ flows of 500 sccm and 50 sccm, respectively. Typical annealing time was 30 min.

Substrates used in this work were heavily p-doped Si wafers with 300 nm thermal oxide layer (Silicon Quest International). Those are denoted as Si/$SiO_2$ substrates. Prior to use, the substrates were thoroughly washed first with soap and then with piranha solution, rinsed with DI water, dried in nitrogen flow and treated in UV-ozone cleaner (Boekel, model 135500) for 30 min to ensure that the surfaces were clean. BN substrates were prepared by deposition of mechanically exfoliated ("Scotch tape") hexagonal BN flakes (Momentive, grade pt110) with a thickness of 30 to 70 nm onto Si/$SiO_2$ chips described above. Chips with BN flakes were annealed prior to graphene transfer at 500° C. in air for 3 h to remove residual glue and make flakes stick better to the substrate.

The conditions used for reactive ion etching are listed in Table 1 for graphene etching used in GNRs fabrication and for platinum etching used in platinum nanowires fabrication.

Table 1 summarizes reactive ion etching conditions used for graphene etching (for GNR fabrication) and Pt etching (for metal wire fabrication).

| | Graphene etching | | | Pt etching |
|---|---|---|---|---|
| | Oxygen RIE | Argon RIE | Nitrogen RIE | Argon RIE |
| Gas pressure | 100 mTorr | 100 mTorr | 200 mTorr | 15 mTorr |
| RIE power | 23 W | 31 W | 45 W | 150 W |
| Gas flow | 15 sccm | 20 sccm | 20 sccm | 50 sccm |
| Process time (unless otherwise | 20 s | 60 s | 20 s | 90 s |

SEM images were acquired with a JEOL 6500 SEM instrument in SE mode with an accelerating voltage of 15 kV. GNR widths were determined by fitting grayscale intensity profiles perpendicular to the GNR axes (acquired using ImageJ software) with Gauss peak. FWHM was used as a width estimate. Averaging was performed for at least 30 profiles in different images. SEM instrumental error was assumed to be ~1 nm.

E-Beam lithography was performed with a JEOL 6500 SEM instrument using 950 PMMA A resist at an e-beam current of 300 pA. Photolithography was performed with a SUSS Mask Aligner MJB4 using a S1813 photoresist. Photolithography masks were fabricated with a DWL66 mask maker. AFM measurements were performed using a Digital Instrument Nanoscope IIIA in tapping mode (with NanoSensors tips, type PPP-NCH-W). Raman spectra were collected using Renishaw in Via Raman microscope with a 514.5 nm laser. The laser polarization was set perpendicular to GNR axes and was kept constant through all experiments. The beam power was ~10 mW with laser beam spot ~1 to 3 μm in diameter. Data collection was performed with exposure time 60 to 1000 s.

To measure the conductivity of Pt wires, 40 nm thick sputtered Pt leads were placed on Pt wires via conventional e-beam lithography. Both 2-terminal and 4-terminal measurement geometries were tested.

Example 1.2

AFM Imaging of GNRs

Figure 5:
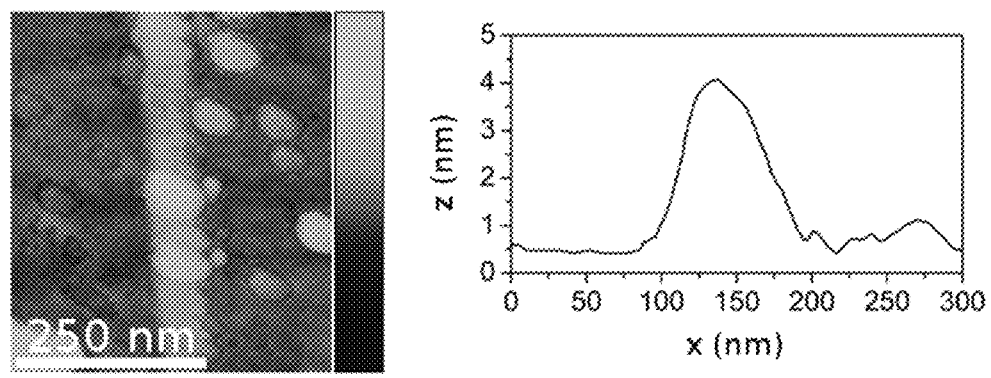

A typical AFM image of ox-GNR (FIG. 5) reveals that the height of elevated region (that supposedly corresponds to the GNR) is ~3.5 nm for BN substrate, and considerably exceeds both the expected height for single-layer graphene (0.5-1.0 nm) and layer-to-layer spacing in graphite.

Both $SiO_2$ and BN could be partially etched during RIE fabrication steps due to physical sputtering. Indeed, BN flakes patterned and etched on one side with the oxygen RIE protocol resulted in ~2 nm steps. This reasonably agrees with the observed ribbons height. For ar-GNRs this step was found to be even larger, ~8 nm for BN substrates. The elevation of the GNRs over the BN substrate explains the GNR pronouncement in the SEM images (FIGS. 2E, 2G, and 2I).

Thus, in the case of GNRs on BN substrates, it would be more correctly stated that GNRs are located on few-layer BN ribbons (i.e., ones that are formed by RIE and have top layer unaffected by RIE), further atop the BN flake. BN ribbons are not expected to interfere with transport measurements, and the devices without GNR on top were not electrically conductive. The GNR width found from AFM images considerably exceeds that from SEM images, apparently due to tip curvature effects.

Example 1.3

GNRs Width Distribution

Figure 6:
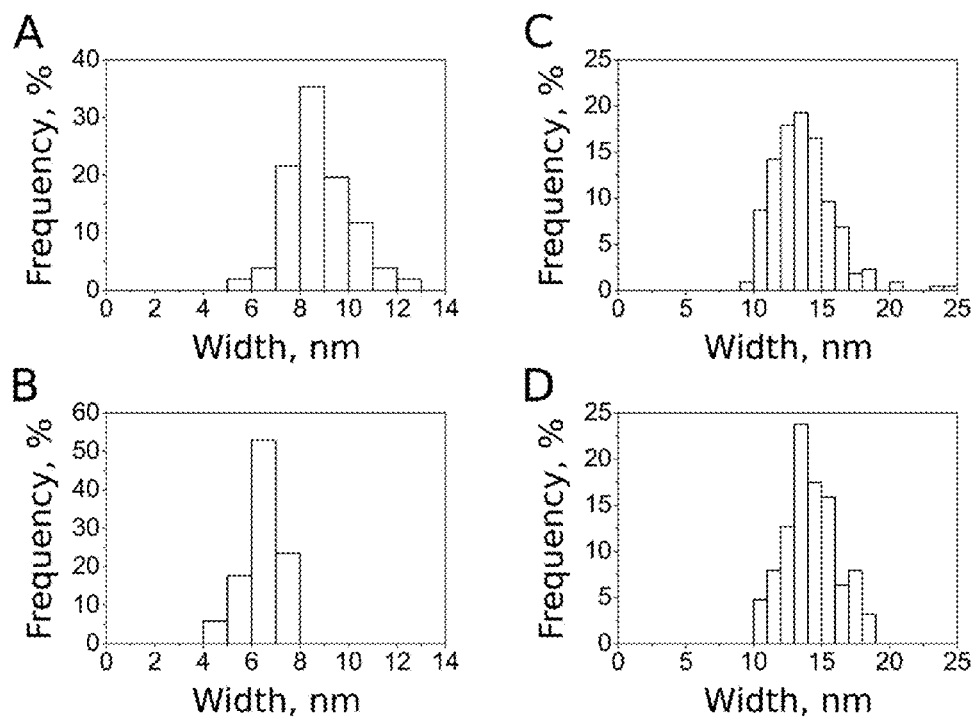

FIG. 6 shows the histograms describing GNR width distributions. The bin size is 1 nm. The number of grayscale intensity profiles analyzed was 218 for ox-GNRs on Si/$SiO_2$, 63 for ox-GNRs on BN, 51 for ar-GNRs on Si/$SiO_2$ and 34 for ar-GNRs on BN. Table 2 summarizes mean width and $1^{st}$ and $3^{rd}$ quartiles for each GNR type.

Table 2 summarizes statistical data summary for GNRs widths.

| | Mean width, nm | Width first quartile, nm | Width third quartile, nm |
|---|---|---|---|
| ar-GNRs on Si/SiO2 substrate | 8.7 ± 1.0 | 7.9 | 9.5 |
| ar-GNRs on BN substrate | 6.4 ± 1.0 | 6.1 | 6.9 |
| ox-GNRs on Si/SiO2 substrate | 13.6 ± 1.0 | 12.1 | 14.9 |
| ox-GNRs on BN substrate | 14.2 ± 1.0 | 12.9 | 15.6 |

Example 1.4

Expansion of Method to Platinum Wires Fabrication

The fabrication method could be readily expanded to other materials: the changes in the fabrication scheme (FIG. 2A) needed are the deposition of the desired material as a smooth uniform film and the adjustment of the RIE procedure. Applicants have fabricated platinum wires (FIG. 7) out of a ~15 nm thick sputtered platinum film using 20-μm-sided squares as a pattern and ~30 nm thick sacrificial Al layer.

According to SEM (FIGS. 7A-B), the wire length is limited mostly by pattern dimensions, and the mean wire width is 11.7±1.0 nm (see Table 3). AFM height image (FIG. 7C) shows that wires are quite uniform in height (~15 nm), which agrees with the starting film thickness. As in GNRs, the apparent wire width from AFM images exceeds that seen from high magnification SEM images, as a result of tip curvature effects.

Table 3 shows the statistical data summary for Pt nanowires widths.

| | Mean width, nm | Width first quartile, nm | Width third quartile, |
|---|---|---|---|
| Pt wires | 11.7 ± 1.0 | 9.5 | 13.8 |

Example 1.5

Transport Properties of Pt Wires

Figure 8:
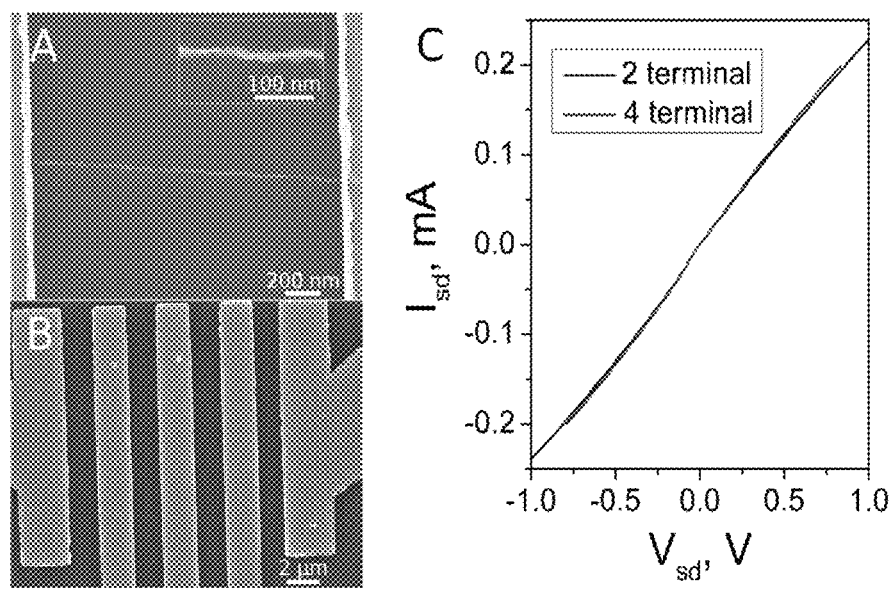

To study the transport properties of Pt wires, devices with ~2 μm source-drain distance were fabricated (FIGS. 8A and B). Both 2-terminal and 4-terminal measurements were performed and demonstrated converging results (FIG. 8C). The mean platinum resistivity derived from the transport measurements (assuming the wire width to be ~11.7 nm and the wire height to be ~15 nm) was calculated to be $(62\pm4)\times10^{-8}$ $\Omega$m, which is comparable to $10.5\times10^{-8}$ $\Omega$m for bulk Pt. The measured resistivity is actually higher most likely due to wire width non-uniformity and surface scattering effects.

Example 1.6

GNRs Patterned in Different Shapes

Figure 2:
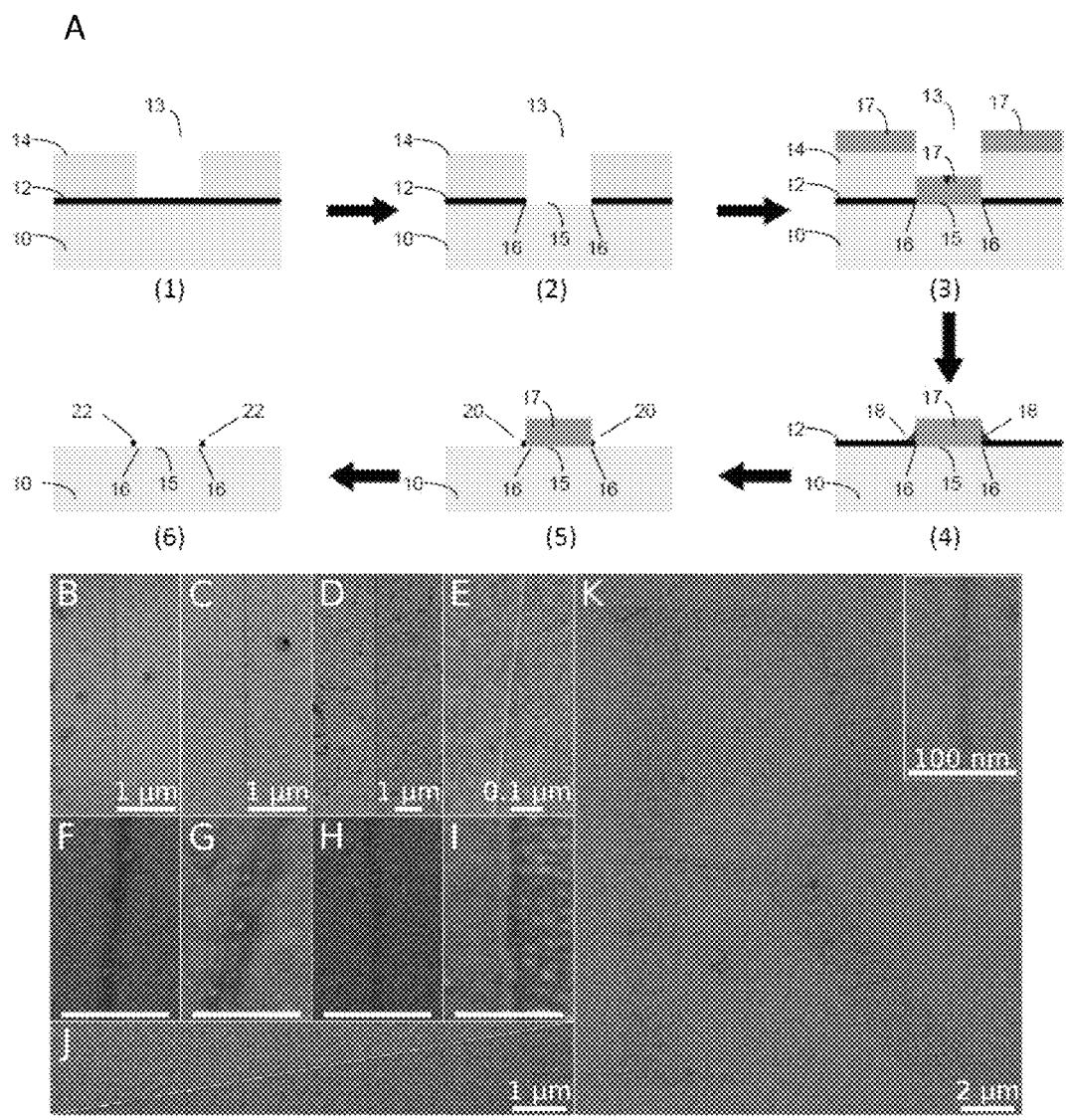
Figure 2:
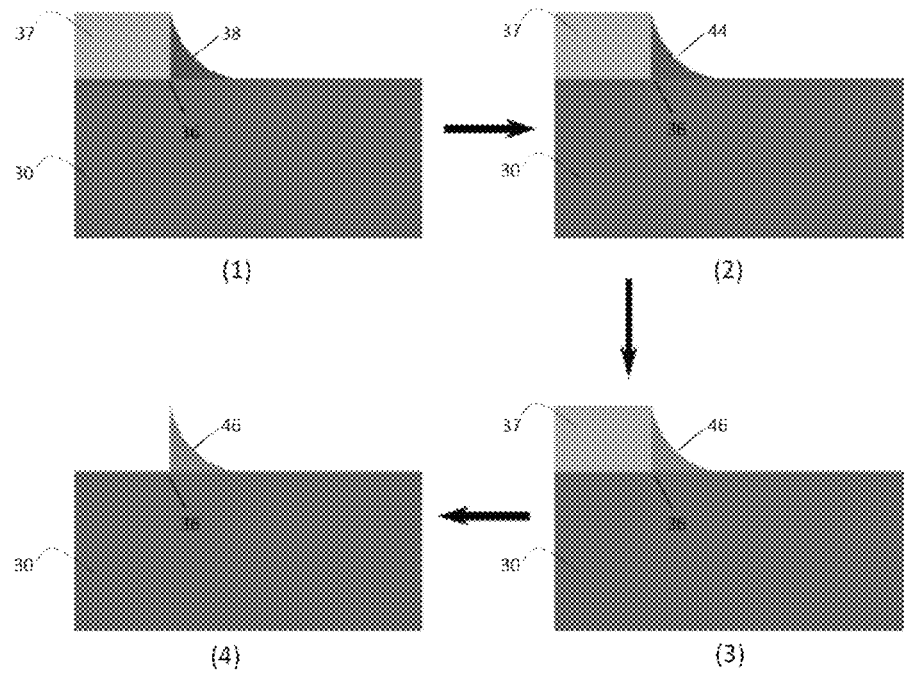
Figure 9:
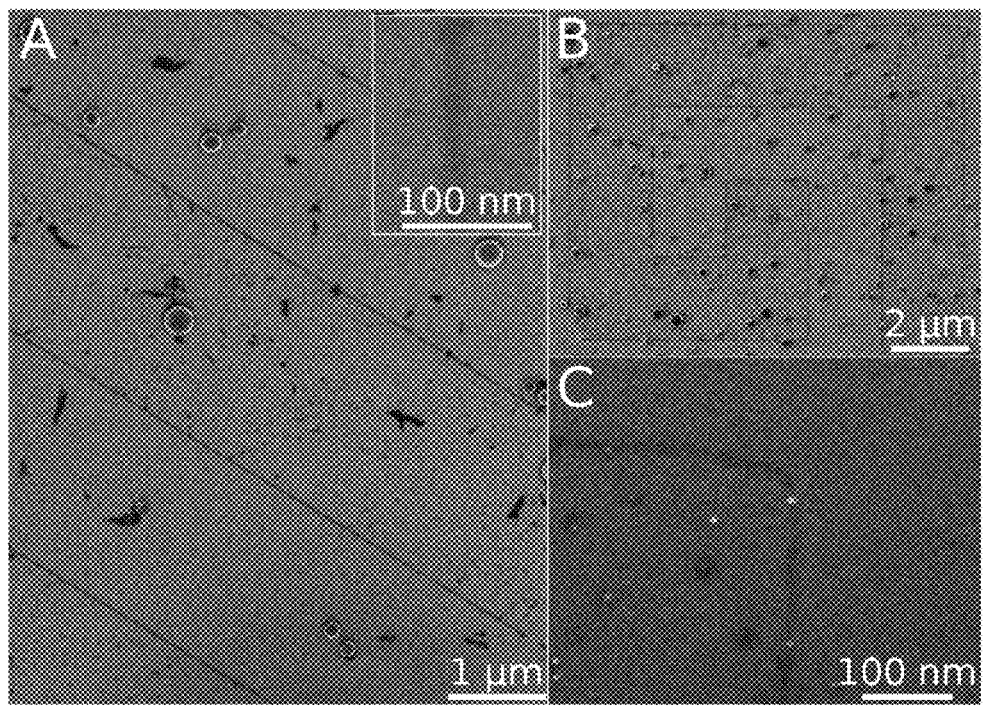

Following the fabrication method detailed in this Example, narrow GNRs could be written in any shape (FIGS. 2 and 9). For ox-GNRs on Si/SiO$_2$ substrates, the effect of pattern shape on GNRs width was tested, and no significant difference was found. For example, for GNRs written individually (FIG. 2B, the lithography patterns used were rectangles with sides 10-20 μm), the mean width was 13.6±1.0 nm. For multiple closely placed ox-GNRs (FIG. 9A, the lithography patterns used were 2 μm×100 μm stripes separated by 2 μm gaps), the mean width was 13.7±1.2 nm.

Example 1.7

Figure 10:
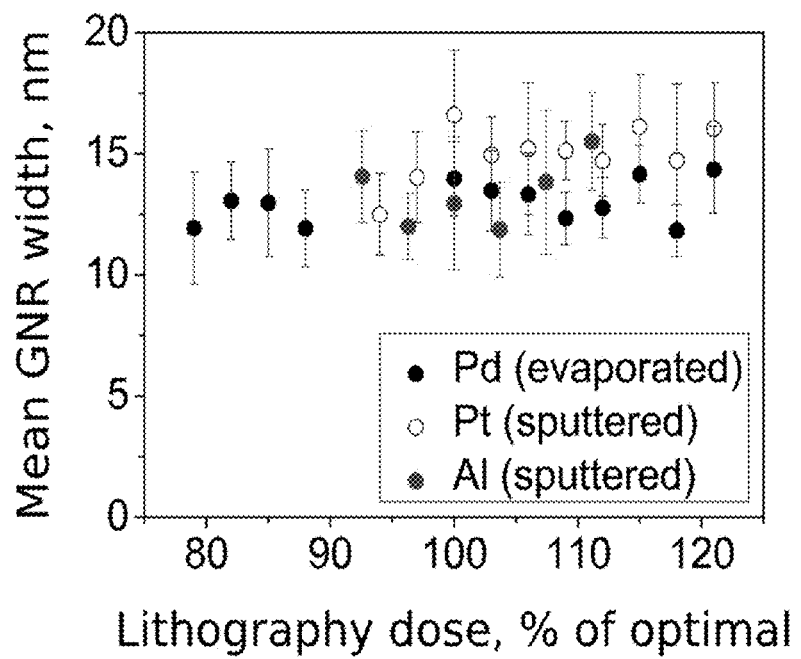
FIG. 10 shows mean GNR widths for Al, Pt and Pd sacrificial metal layers in a wide range of lithography dosages.

GNR Widths for Different Lithography Doses and Different Sacrificial Layer Metals The optimal dosage for the e-beam lithography setup used was found to be 270 μC/cm$^2$, as judged by comparing resulting and expected feature sizes. The study of GNR width dependence on sacrificial metal was performed for ox-GNRs on Si/SiO$_2$ substrates patterned with 2 μm×100 μm stripes separated by 2 μm gaps. GNR widths for exposure conditions during lithography steps ranging from slight underexposure to slight overexposure were measured for Al, Pt and Pd sacrificial layers. Pt and Pd metals were chosen as ones forming minimal if any native oxide layer. Different deposition methods (e-beam evaporation for Pd and sputtering for Pt) were used to exclude the role of specific stresses in the metal film caused by a deposition technique that could potentially result in a shadowing effect. In a wide range of lithography dosages, the GNR widths were found to be approximately constant and the same for Al, Pt and Pd metals (FIG. 10).

Example 1.8

GNRs Width Dependence on Sacrificial Metal Layer Thickness and Etching Time

Figure 11:
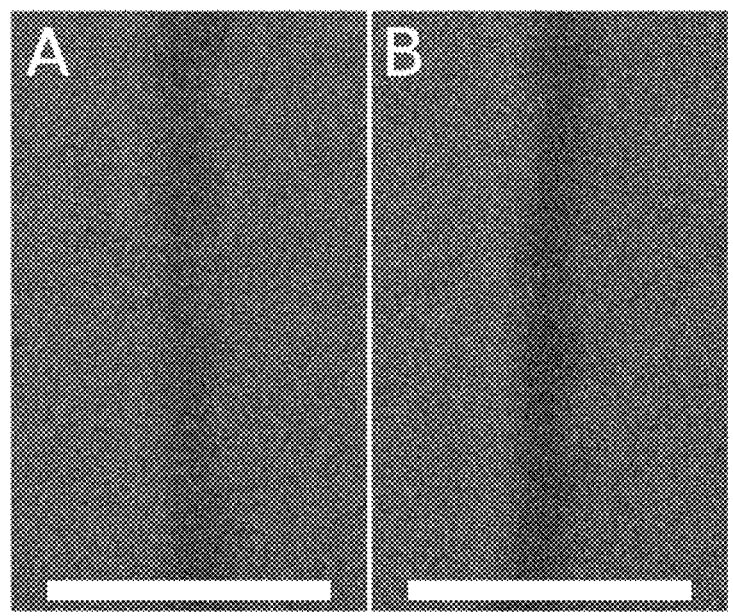
FIG. 11 shows SEM images of GNRs width dependence on thickness of Al metal layer, including 20 nm (FIG. 11A) and 60 nm (FIG. 11B) Al metal layers. Scale bar for both images is 100 nm.

The study of GNR width dependence on sacrificial metal thickness was performed for ox-GNRs on Si/SiO$_2$ substrate patterned by 2 μm×100 μm stripes separated by 2 μm gaps. Al sacrificial layers of different thicknesses (5 to 60 nm) were deposited. Otherwise standard processing resulted in 15.9±1.2 nm wide GNRs for 60 nm Al, and 13.7±1.2 nm for 20 nm Al (FIG. 11). Results for a 10 nm Al layer were not distinguishable from the 20 nm Al case, but for the 5 nm Al layer the continuous GNR regions were very small (<1 μm). The weak dependence of the GNR width on the deposited metal thickness excluded lithography pattern slope as the cause of GNR formations.

The increase in etching time could be expected to result in a GNR width decrease due to undercut effects. 40 s of oxygen RIE process (in contrast to the normal time of 20 s) and 90 s of argon RIE process (in contrast to the normal time of 60 s) resulted in GNRs with continuous regions of <1 μm.

Example 1.9

GNRs Formation by Adsorbates Protection Mechanism

Figure 12:
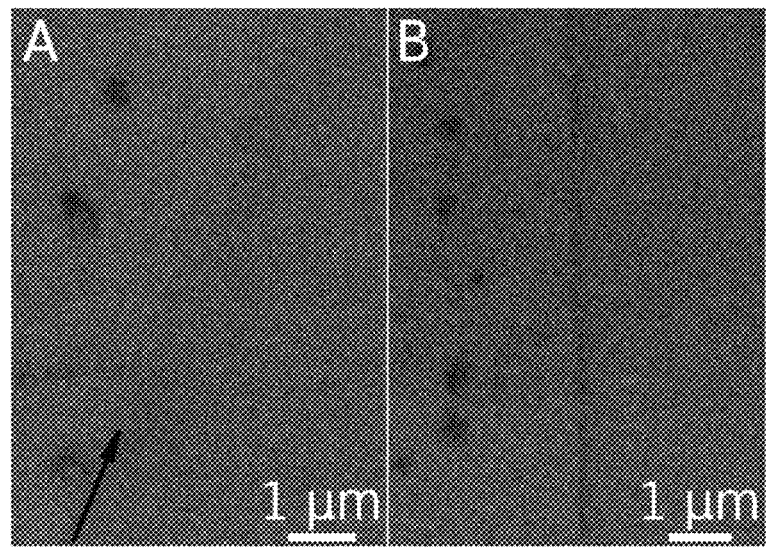
FIG. 12 shows samples processed with nitrogen reactive ion etching (RIE) after being heated and cooled under vacuum (FIG. 12A) and immediately after sample loading (FIG. 12B). The arrow in FIG. 12A shows the expected GNR position.

The following experiments were performed to support the proposed mechanism for GNR formation. In the first, two samples were patterned with 2 μm×100 μm stripes separated by 2 μm gaps. The first RIE step for both was performed with argon RIE via the standard procedure followed by deposition of a 20 nm sacrificial Al layer. One of the samples was (prior to further processing) heated to 120° C. in an RIE chamber under vacuum, held at that elevated temperature for 30 min (to ensure the removal of adsorbed water), cooled back to room temperature, and etched without exposing to ambient conditions (with N$_2$ RIE procedure). This sample did not have GNRs where they were expected to be found (FIG. 12A) had the sample been processed under standard conditions (FIG. 2A). However, a control sample that was processed at room temperature immediately after loading with the same N₂ etching procedure had formed GNRs (FIG. 12B). The region on the test sample in FIG. 12A where the GNRs could be expected to form is clearly seen, even though there are actually no GNRs. There is observable contrast difference between Si/SiO₂ substrate regions exposed to argon RIE and to nitrogen RIE.

Figure 13:
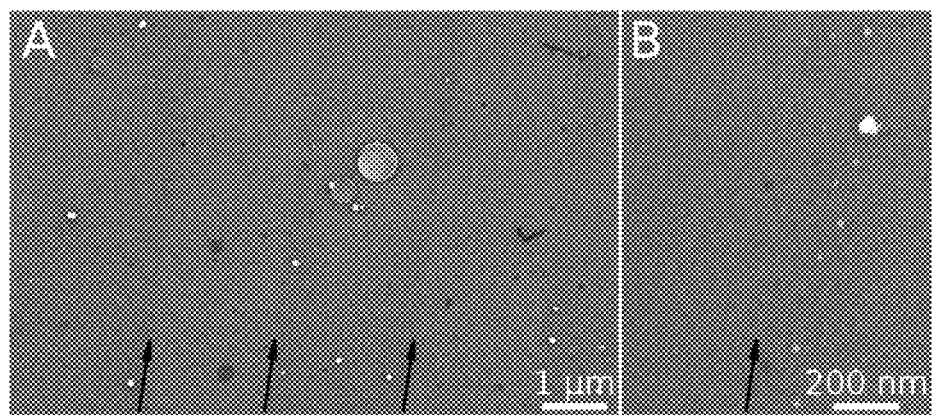
FIG. 13 shows SEM images of samples processed with RIE with water displaced by acetone at low magnification (FIG. 13A) and high magnification (FIG. 13B). Arrows show expected GNR positions.

For the second experiment, the sample was patterned with 2 μm×100 μm stripes separated by 2 μm gaps and had a 20 nm Al sacrificial layer deposited. First etching was performed with Ar RIE at standard conditions. After the lift-off step, the sample was soaked in acetone. Without exposure to ambient moisture, a small droplet of acetone remained on top of the sample. The sample was then placed in the RIE chamber, evacuated and processed using argon RIE. No GNRs were observable (FIG. 13). FIG. 13A shows that the traces of the initial pattern of stripes are clearly visible due to image contrast. However, there are no GNRs formed (FIG. 13B). This can be explained by the higher vapor pressure of acetone when compared to water. Without being bound by theory, it is envisioned that the acetone presumably evaporated from the sample, thereby allowing the RIE to etch away all of the unprotected graphene.

Example 1.10.1

GNRs Formation Mechanism (Continuum Models)

To support the proposed nanowire/GNR formation mechanism, the shape of the meniscus was estimated using theoretical modeling. The processes to model are the formation of the meniscus, behavior of the meniscus under reduced pressure, and interaction of meniscus liquid and RIE plasma. It should be noted that Applicants do not consider the formation of any meniscus on the first etching step, as the mask layer there is hydrophobic (PMMA). This assumption is supported by the experiments, where after alteration of only the second etching step, no formation of GNRs was observed. The meniscus is formed in a process of capillary condensation, described by Kelvin's Law for a cylindrical meniscus in eq 1:

$$\ln(p/p_0) = \frac{\gamma \cdot V_m}{r \cdot R \cdot T} \quad (1)$$

In Equation 1, $p/p_0$ is the relative humidity, γ is the surface tension (0.073 N/m for water at room temperature[4]), $V_m$ is the molar volume of liquid (18×10⁻⁶ m³), r is the radius of curvature for a cylindrical meniscus (negative for concave), R is the universal gas constant, and T is the temperature. Ambient humidity in this experiment varied at ~60%. Therefore, assuming $p/p_0$=0.6, Applicants get r≈−1 nm, which is probably at the limit of applicability of continuum models such as Kelvin's Law. Moreover, considering the evaporation of water under reduced pressure, the continuum model predicts that the meniscus size may decrease further, producing distances that can only be described by more microscopic approaches. Thus, microscopic molecular models are preferred to explain the observed process.

Even if one assumes r=1 nm, calculation of the meniscus base (x) gives inconsistent results (FIG. 14). If α and β are contact angles with substrate and with sacrificial metal layer correspondingly, then x=r(cos β−sin α). The receding contact angles were measured to be 21±1° for graphene on an Si/SiO₂ substrate and 10±1° for a sputtered aluminum film. Thus, x≈0.6 nm. Not only is this number out of the applicability range for continuum models, but it is much smaller than the width of experimentally observed GNRs.

It is also important to note that, for any reasonable meniscus geometry, no boiling occurs under reduced pressure. Indeed, the pressure drop on the meniscus surface is governed by Young-Laplace equation for a cylindrical surface in eq 2:

$$\Delta p = \frac{\gamma}{r} \quad (2)$$

In equation 2, $\Delta p = p_2 - p_1$ is the pressure drop, γ is surface tension, and r is radius of curvature of a cylindrical meniscus (negative for concave). The saturated vapor pressure for water at room temperature is $p_{sat}$=2.3 kPa. Assuming the pressure in the RIE chamber to be negligible ($p_2$=0), the condition for boiling of water is $p_{sat} > p_1 = -\Delta p$, which leads to r>30 μm for boiling to be observed. This value is larger than any reasonable value estimated here, and using the wetting parameters and geometry described above, it corresponds to an almost flat meniscus reaching the top of the sacrificial metal layer and extending for >50 nm on the horizontal plane.

Example 1.10.2

Microscopic Molecular Models

As continuum models seem to be less applicable to the case under investigation, Applicants also tried to use the following microscopic molecular models to describe the observed effects. It is known that there are several layers of water molecules adsorbed on any hydrophilic surface at reasonable atmospheric humidity. The thickness of this adsorptive film could be estimated by utilizing the BET equation. However, Applicants will not use the BET equation in this Example because the BET model assumes that binding energies in all water layers except the one closest to the surface are the same, which most probably is not the case for water.

It is natural to expect some increase of water thickness close to the wedges, where two planes of adsorbed few-layer water meet at a certain angle. One can analyze the possibility of existence of an adsorbed film under reduced pressure, assuming that this film is much more stable and possibly thicker at ambient conditions such that it appears before the pumpdown procedure.

It is also important to note that any adsorbed water film is actually thermodynamically unstable under vacuum due to the entropic force for molecular evaporation. It suggests that the geometry of the "meniscus" is determined solely by kinetics of evaporation. The evaporation rate could be described using the Arrhenius Law eq 3:

$$\text{rate} = A \cdot e^{\frac{\Delta E}{RT}} \quad (3)$$

In equation 3, A is a constant, R is universal gas constant, T is temperature, and ΔE is the additional energy of adsorbed water molecules due to interaction with the solid surface (that is, for bulk water ΔE=0). For bulk water, the evaporation rate is sufficiently high to consider this process immediate relative to the characteristic pump down time (few min). On the other hand, for an adsorbed water film of certain thickness, the evaporation rate becomes low enough to consider this layer stable over the timescale of fabrication as described. As the method did not demonstrate instability for small pump down time variations (within few min), the geometry of the adsorbed film under vacuum is apparently determined by the evaporation rate decrease. The characteristic energy, $\Delta E_s$, is defined to be the energy at which the evaporation rate decreases to a negligible value and the evaporation process effectively stops. This threshold energy $\Delta E_s$ is expected to be higher than the equilibrium energy of surface molecules adsorbed at regular (>1%) humidity levels, as the evaporation rate at this equilibrium should be equal to the condensation rate, which is expected to be much higher than the evaporation rate of the kinetically stable adsorbate.

The estimation of $\Delta E$ as a function of distance from the solid surface is a complex problem which is not yet fully understood theoretically for such molecules as water, but one can reasonably use the first order approximation of this unknown potential in eq 4:

$$\Delta E = \frac{\xi}{\rho} + \bar{o}\left(\frac{1}{\rho^2}\right) \quad (4)$$

In equation 4, $\xi$ is constant and $\rho$ is distance (x or y) between the flat surface and the molecule. This approximation agrees with experimental data for oxides surfaces similar to native oxide on an aluminum sacrificial metal layer as described here. The approximation also has the order corresponding to the interaction between the dipole and polarized surface. Thus, the energy of water molecule adsorbed in the wedge can be written in the following approximate form in eq 5:

$$\Delta E \approx \frac{\xi_x}{x} + \frac{\xi_y}{y} \quad (5)$$

In equation 5, x and y are the distances from the molecule to the walls which for estimation purposes are expressed in number of water monolayers. In addition, $\xi_x$ and $\xi_y$ are the corresponding potential equation constants. The latter could be estimated from data on adhesion energies and are expected to be on the order of $10^4$ J×layer/mol ($1.5 \times 10^4$ to $3 \times 10^4$ J×layer/mol for alumina by fitting of experimental data. These values are expected to be close for different native oxide surfaces, and it was shown earlier that a single layer of graphene negligibly changes the wetting properties of the underlying surface. Thus, for all processes described in this Example, Applicants assume for simplicity $\xi_x = \xi_y = \xi$. In addition, limiting $\Delta E > \Delta E_s$, Applicants determine the conditions for non-evaporated water molecules on the surface with eq 6:

$$\frac{1}{x} + \frac{1}{y} = \frac{\Delta E_s}{\xi} \quad (6)$$

In equation 6, $\Delta E_s$ should be at least higher than the thermal energy. In addition, $\Delta E_s > RT = 2.4$ kJ/mol gives the upper limit of $\xi/\Delta E_s$ to approximately 10 layers. This assumes that there are at least 2 layers of water on flat surfaces under vacuum, far from the wedge in eq 6

$$\lim_{x \to \infty} y = 2.$$

Thus, Applicants estimate the lower limit as $\xi/\Delta E_s \approx 2$ layers.

The shape of adsorbed layer for different values of $\xi/\Delta E_s$ is shown in FIG. 15. Depending on parameters used for calculations, there is a point at the distance of few tens layers from the wedge vertex, where the thickness of the water film increases above the thickness of the water film on the flat surface. Without being bound by theory, Applicants speculate that this position is determined by interaction potentials and defines the nanowire/GNR shape on the second etching step.

Applicants theorize that this difference in adsorbed water layer thickness may control the etching process. Unfortunately, the removal of water by sputtering at ambient temperature by low energy ions is not well studied. For instance, it was shown that for neutral Ar atoms with 20 eV energy, the sputtering yield of few-layer amorphous solid water at low temperature is on the order of $10^{-3}$ and decreases as the water layer thickness increases (*J. Phys. Chem. C* 2009, 113, 13325-13330). Additional data could be used to extrapolate the sputtering yield of amorphous solid water with $Ar^+$ ions: at energies ~20 eV it is ~0.1, and the actual yield may be another order of magnitude smaller if Applicants account for absorption of some kinetic energy by vibrational states of the molecules (up to 5 eV per degree of freedom). Thus, the sputtering yield will decrease even further for thicker layers of water at room temperature, as in weakly bound state the molecules could more easily penetrate in the depth of the medium than ones bound into a crystalline lattice. Thus, even though the adsorbed water layer in the wedge is thin, it could be sputtered much more slowly than the underlying solid.

Example 1.11

GNR Fabrication Using Photolithography

The GNRs fabrication method demonstrated in this Example also works using photolithography patterning. A mask patterned with 4 µm×100 µm stripes separated by 4 µm gaps was made (the 4 µm feature size is very close to the mask aligner resolution limit). Oxygen RIE was used for graphene etching. The resulting GNRs were 23±4 nm wide (FIG. 16).

Example 1.12

Raman Spectra Analysis

The CVD graphene films used for GNR fabrication were analyzed with Raman spectroscopy to ensure that high quality monolayer graphene was used to produce the GNRs. Raman spectra were collected from the GNRs confined between the leads that were used for devices testing. Metal leads being exposed to the laser irradiation could partially account for the high background observed for GNRs. The additional peaks observed in GNRs Raman spectra around ~1300 cm$^{-1}$ and ~1450 cm$^{-1}$ are not related to GNRs, as they are observed from bare substrate as well. For GNRs on BN substrates, the spectral region around the usual position of the D peak was dominated by the strong characteristic BN peak at ~1366 cm$^{-1}$. Although there were pronounced 2D and G peaks, those spectra were not used for further analysis. Repeated Raman measurements on the same GNRs did not produce any significant changes in the spectra, leading to the conclusion that there was little overheating or decomposition of the sample under the laser irradiation. In addition, a decrease in the collection time and laser power did not significantly change the peak position, resulting only in a decrease in the signal-to-noise ratio. Raman spectra fitting was done with polynomial (up to power 5) background and Lorentz peaks. Fitting parameters were peak intensities, positions, FWHM and background polynomial coefficients. Peak intensity ratios, position and FWHM averaging was performed from analysis of at least 5 fits of Raman spectra collected from different GNRs.

The 2D peak (FIG. 3A) in GNRs is shifted to higher wavenumbers compared to the starting CVD graphene. For ox-GNRs, the average position is 2705.4±0.5 cm$^{-1}$. For ar-GNRs, the average position is 2702.7±0.4 cm$^{-1}$. For starting graphene, the 2D peak is located at ~2685 cm$^{-1}$. Though the increase of the G/2D ratio coupled with the 2D peak upshift could indicate some graphene p-doping, it is more likely to be associated with the intrinsic large edge-effect of narrow GNRs. For ar-GNRs, the D/G intensity ratio is lower than for ox-GNRs, although the latter are wider. D/G ratio difference between ar-GNRs and ox-GNRs could be attributed to the additional functional groups attached to the near-edge region due to reaction of oxygen with graphene during the oxygen RIE process. Ar plasma species are not thought to react chemically with graphene, and the functional groups on the edges of ar-GNRs are expected to appear only at the edge upon GNRs sample exposure to air after RIE.

Since GNRs were fabricated from polycrystalline CVD graphene and the RIE process was involved in edge formation, GNR edges are likely randomized. Therefore, the low D/G ratio should not be interpreted as zigzag edge domination. For ox-GNRs, the G-peak was shifted toward higher wavenumbers (1598.7±0.6 cm$^{-1}$) compared to the normal G peak position for non-doped CVD graphene (~1584 cm$^{-1}$). This could be attributed either to graphene doping or intrinsic GNR properties. In all GNR spectra, the G peak was considerably wider compared to that of the starting CVD graphene film, as expected for narrow GNRs. Interestingly, for ar-GNRs, the wide G peak could be interpreted as a doublet: a 5-peak deconvolution of the 1100-1900 cm$^{-1}$ region fits the data better than a 4-peak deconvolution (FIG. 17). Comparison of 4-peak and 5-peak fit was performed by fitting the data in region 1100-1900 cm$^{-1}$ with polynomial (up to power 2) background and 4 or 5 Lorentz peaks correspondingly. As summarized in Table 4, fitting was performed over background parameters, peak intensities, FWHM and positions.

Table 4 provides a summary for 4 peak fit and 5 peak fit for ar-GNRs on Si/SiO$_2$ substrate.

| 4 peak fit | | 5 peak fit | |
| --- | --- | --- | --- |
| Peak position | Peak FWHM | Peak position | Peak FWHM |
| 1356.6 ± 0.8 cm−1 | 64 ± 5 cm−1 | 1356.6 ± 0.6 cm−1 | 58 ± 8 cm−1 |
| 1599.0 ± 0.3 cm−1 | 77 ± 1 cm−1 | 1558 ± 3 cm−1 | 84 ± 11 cm−1 |
| | | 1604.3 ± 0.6 cm−1 | 67 ± 2 cm−1 |

Without being bound by theory, it is unlikely that the doublet is a combination of the G and D' peaks since in this case the G peak would be shifted to lower wavenumbers compared to undoped graphene, and doping should only shift it to higher wavenumbers. The shift of the G peak to lower wavenumbers could occur due to sample overheating. However, this was observed only for laser polarization parallel to the GNR axis. The possible interpretation for the observed doublet is the splitting of the G peak. In graphene, the G peak originates from phonon scattering in the degenerated iLO and iTO bands at the Brillouin zone center. This degeneracy could be uplifted, for example, by stress, causing the G peak to split. A similar effect causes G-peak splitting in carbon nanotubes. The measurable G peak splitting in narrow GNRs was predicted by first principle calculations. However, the actual value of the split observed here experimentally (~46 cm$^{-1}$) exceeds the expectations since similar splitting values were predicted for narrower GNRs. It should be noted that previously experimental observation of G peak splitting has been reported for H-terminated zigzag GNRs and graphene edges. However, in that case, it was interpreted as a superposition of peaks corresponding to zigzag edge regions and internal areas of the GNR.

Example 1.13

GNRs FETs Fabrication and Electronic Properties Study

Multiple FETs were fabricated and tested for each type of GNR. The yields of device fabrications were ~50%. The leading cause for FETs being non-conductive was missing GNR regions inherited from graphene film defects. For BN substrates, additional cause of device failures were leads broken on the BN flake edges. An important device fabrication step was sample annealing in a reductive Ar/H$_2$ atmosphere (at 350° C.) prior to patterning of the contacts. Without annealing, the GNRs do not adhere sufficiently well to the substrate and peel away during contacts fabrication. The total number of conductive devices analyzed was 24 for ox-GNRs on Si/SiO$_2$, 23 for ox-GNRs on BN, 50 for ar-GNRs on Si/SiO$_2$ and 12 for ar-GNRs on BN. All conductive devices were checked under SEM to ensure that only single GNRs were connecting the leads.

In order to properly compare GNRs on BN flakes of different thicknesses, the gating voltages for all devices were recalculated into linear charge concentration in the classical capacitance approximation using the BN flake thickness determined from AFM measurements (assuming that the SiO$_2$ layer thickness was 300 nm). Dielectric constants for SiO$_2$ and BN were assumed to be 3.9 and 4.0, respectively. Linear charge concentration was accepted since GNRs are quasi-1D objects. The negative concentration values correspond to holes, positive to electrons.

For GNRs on Si/SiO$_2$ substrate without BN flakes, linear charge carrier concentration was calculated as in eq 7:

$$n = V_g \cdot \frac{2\pi\varepsilon_0\varepsilon_{SiO_2}}{e \cdot \ln\left(\frac{4 \cdot d_{SiO_2}}{w}\right)} \tag{7}$$

For GNRs on BN substrate linear charge carrier concentration was calculated as in eq 8:

$$n = V_g \cdot \frac{2\pi\varepsilon_0}{e \cdot \left(\frac{1}{\varepsilon_{BN}}\ln\left(\frac{4d_{BN}(d_{SiO_2} + d_{BN})}{w(2d_{SiO_2} + d_{BN})}\right) + \frac{1}{\varepsilon_{SiO_2}}\ln\left(\frac{2d_{SiO_2} + d_{BN}}{d_{BN}}\right)\right)} \tag{8}$$

Here, $V_g$ is the gate voltage applied. $\varepsilon_0$ is vacuum permittivity. $\varepsilon_{SiO_2}$ and $\varepsilon_{BN}$ are dielectric constants of SiO$_2$ and BN, respectively. $d_{SiO_2}$ and $d_{BN}$ are SiO$_2$ and BN thicknesses, respectively.

The averaging for FIG. 3D was performed over all conductive ar-GNRs FETs on Si/SiO$_2$ and BN. The error in mean was estimated using 90% t-values. The averaging of low-temperature "OFF" current (FIG. 4C) was performed over two sets of 6 devices measured in range 77-300 K for ar-GNRs on both Si/SiO$_2$ and BN substrates. The error in mean for the "OFF" current was estimated using 90% t-values.

In contrast with ar-GNRs on both Si/SiO$_2$ and BN substrates, ox-GNRs demonstrate divergent electronic properties (FIG. 18). ox-GNRs on Si/SiO$_2$ substrates (FIG. 18A) demonstrate a strong variation in both ON/OFF ratios (almost two orders of magnitude). Furthermore, the position of the charge neutrality point ranges from 0 V to −30 V gate voltage values, which approximately corresponds to 0 to 8×10$^9$ m$^{-1}$ linear hole concentration range. For ox-GNRs on BN substrates (FIG. 18B), the charge neutrality point positions are much more consistent, with a linear hole concentration range of 5×10$^9$ to 9×10$^9$ m$^{-1}$. However, the ON/OFF variation is still substantial.

The charge neutrality point for devices on BN substrates was consistently shifted to negative gating voltages (high linear hole concentrations) both for ox-GNRs and ar-GNRs. Similar behavior was reported for CVD graphene devices on BN and was attributed to doping since a shift of the charge neutrality point towards zero was observed for CVD graphene devices after annealing in a reducing medium. For GNRs on BN substrate, however, the charge neutrality point remained unchanged after annealing. Apparently, dopants in this case are thermally fixed up to at least 500° C.

The results suggest that for ox-GNRs on Si/SiO$_2$ substrates, both the substrate and the edge defects produce potential fluctuations with close amplitudes. Their interaction results in randomization of both energy variation over the GNR length, leading to ON/OFF ratio variations, and the average potential, leading to charge neutrality point variations. In the case of the ox-GNRs on BN substrates, the potential fluctuations due to edge defects dominate the potential fluctuations due to interactions with the substrate. As a result, the overall potential profile is determined by edge defects. The average potential in this case is approximately constant over the GNR length. However, the potential variation changes from sample to sample, causing ON/OFF ratio variations. Since Si/SiO$_2$ substrate-induced potential fluctuations are comparable to fluctuations caused by edge defects in ox-GNRs, it is expected that the former will dominate over potential fluctuations caused by edge defects in ar-GNRs. Thus, the electronic properties of ar-GNRs on Si/SiO$_2$ substrates are determined predominantly by substrate interactions. The consistency of ON/OFF ratios and charge neutrality point positions could mean that the potential fluctuations caused by Si/SiO$_2$ substrates are much more uniform compared to those caused by defects introduced during oxygen RIE.

In the case of the ar-GNRs on BN substrates, both the potential fluctuations due to the edge defects and substrate interaction are rather small. The following options are considered: (1) potential fluctuations due to edge defects dominate; (2) potential fluctuations due to substrate dominate; (3) both types have close amplitudes and dominate over the bandgap, if it exists; (4) there is a true bandgap that dominates over both types of potential fluctuations. Option 3 is unlikely since in this case there would be ON/OFF and charge neutrality point variations similar to those observed for ox-GNRs on Si/SiO$_2$ substrates. Both options 1 and 2 would yield the ON/OFF ratios to be lower than those observed for ar-GNRs on Si/SiO$_2$ substrates. The reason for this is that the fluctuations in potential due to SiO$_2$ puddles are larger than for BN puddles or ar-GNR edge puddles. The ON/OFF ratios at room temperature for ar-GNRs on BN are, however, similar to ar-GNRs on Si/SiO$_2$ substrate. Thus, the option that the ar-GNRs on BN possess a true bandgap is the most probable. It should be noted that in the case of comparable bandgap and potential fluctuations caused by edge defects and/or the BN substrate, transport properties could not be expected to be as consistent.

Example 2

Fabrication of Nanowires

In this Example, Applicants demonstrate the fabrication of various nanowires by a modified method outlined in Example 1. In particular, by substituting graphene films with thin films of one or more materials, Applicants were able to utilize the methods outlined in Example 1 to generate various types of nanowires.

Figure 7:
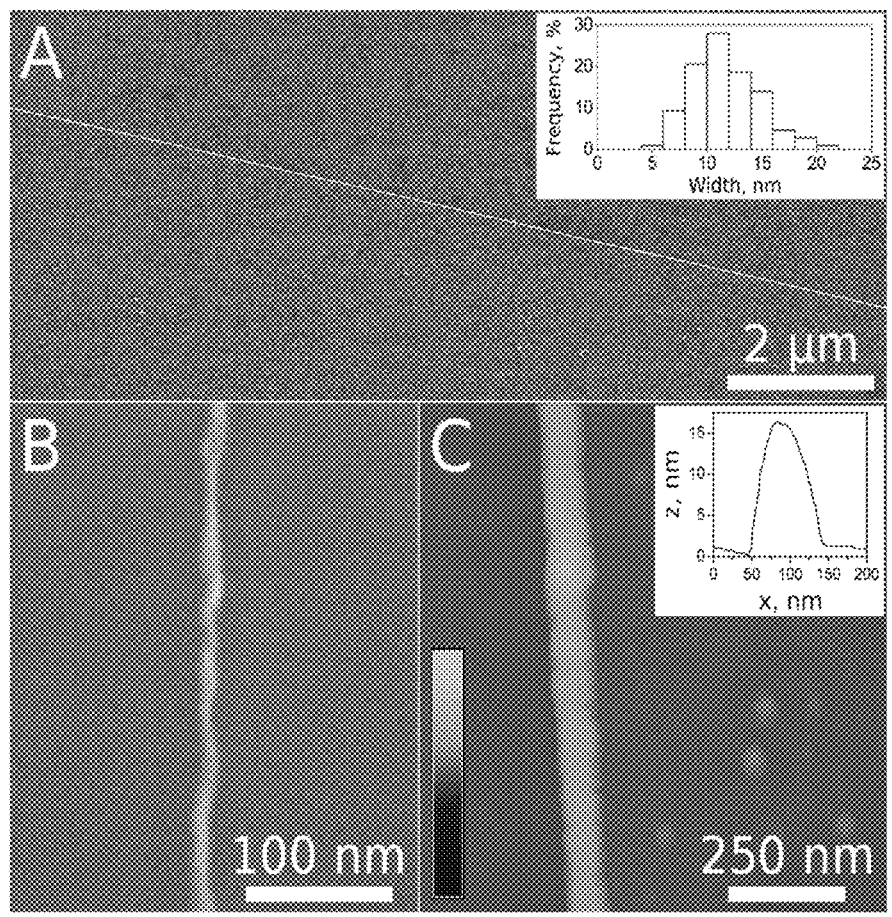

As set forth in Example 1, by using 15 nm thick platinum films (sputtered using Denton Desk V Sputter system) on Si/SiO$_2$ substrate, the fabrication sequence outlined in Example 1 resulted in 8.9±1.1 nm platinum nanowires (FIGS. 2J and 7). Conductivity of Pt nanowires was found to be (62±4)×10$^{-8}$ Ωm. Reactive ion etching (RIE) processes were performed using Trion RIE instrument. Applicants have observed that low pressure is desirable for noble removal, as it occurs mostly via physical sputtering. If an RIE machine is unable to keep stable RIE power at such low pressures, ICP power stabilization could be used (as was successfully tested with up to 20% RIE power).

The conditions are listed in Table 5 for platinum and gold etching (physical sputtering) used in platinum and gold nanowires fabrication, and in Table 6 for reactive etching of Si, SiO$_2$ and W used in fabrication of corresponding nanowires.

TABLE 5

Typical argon RIE conditions used for noble metal film (Pt or Au) etching in nanowires fabrication sequence.

|  | Argon RIE |
|---|---|
| Gas pressure, mTorr | 15 |
| RIE power, W | 100-150 |
| ICP power, W | 0 |
| Gas flow, sccm | 50-100 |
| Process time, s | 40-90 |

TABLE 6

Typical RIE conditions used for noble metal film etching in platinum nanowires fabrication sequence.

|  | Si pre-etch | Si inner/outer | SiO$_2$ | W inner/outer part |
|---|---|---|---|---|
| Gas pressure, mTorr | 100 | 100 | 100 | 20 |
| RIE power, W | 100 | 100 | 100 | 120 |
| ICP power, W | 0 | 0 | 0 | 0 |
| CF4 flow, sccm | 25 | 25 | 0 | 0 |
| CHF3 flow, sccm | 0 | 0 | 25 | 0 |
| O2 flow, sccm | 3 | 3 | 15 | 0 |
| SF6 flow, sccm | 0 | 0 | 0 | 25 |
| N2 flow, sccm | 0 | 0 | 0 | 5 |
| Process time, s | 90 | 70/60 | 40 | 50/75 |

E-beam lithography was performed with a JEOL 6500 SEM instrument using 950 PMMA A resist at an e-beam current of 300 pA. Typically, PMMA film was deposited by spin-coating at 3000 rpm for 40 s. For Si wires fabrication, PMMA film was deposited similarly but at 1000 rpm to get thicker resist film. Photolithography was performed with SUSS Mask Aligner MJB4 using S1813 photoresist. Photolithography masks were fabricated with DWL66 mask maker machine.

Similar fabrication starting from 10 nm sputtered W films resulted in W nanowires (FIG. 19, RIE conditions in Table 6). For W wires fabrication, Au was used as a sacrificial metal layer. First and second RIE times were different in order to compensate for RIE rate dependence on exposed sample area (Table 6).

Gold nanowires were also fabricated by a similar procedure (RIE conditions shown in Table 5). The fabrication procedure started from e-beam evaporated 10 nm Au film deposited onto 1 nm Cr adhesion layer on Si/SiO$_2$ substrates. SEM images of the fabricated Au nanowires are shown in FIG. 20.

Si nanowires were fabricated starting from silicon-on-insulator (SOI) wafers with 100 nm device layer, which was pre-etched to decrease the Si film thickness (RIE conditions used for Si etching are listed in Table 6). After pre-etch, a standard nanowire fabrication procedure was implemented. A thicker layer of PMMA was used as a lithographic mask. The fabrication resulted in 10 nm wide and 20 nm high nanowires (FIG. 21). First and second RIE step times were different to compensate for RIE rate dependence on exposed sample areas (Table 6).

In addition, SiO$_2$ wires were fabricated starting from clean Si/SiO$_2$ substrate (RIE conditions listed in Table 6). These nanowires were 10 nm in width and 20 nm in height. In addition, the Nanowires had outstandingly straight walls and generally higher quality (FIGS. 22-23). Without being bound by theory, these results indicate that the quality of nanowires can depends on the quality of starting films, with smoother films yielding higher quality nanowires.

Using SiO$_2$ nanowires as a model system, Applicants have demonstrated fabrication of crossbar-like structures of SiO$_2$ nanowires. Two orthogonal SiO$_2$ wire arrays were fabricated subsequently one on top of another (FIG. 24). The width of resulting nanowires in this particular case was 20 nm. The height of each individual wire (that is, everywhere except where wires intersected yielding twice this height) was 30 nm. Thus, intersecting wires and networks of nanowires could be fabricated using this method.

If etching is interrupted and the sample is taken out from the chamber and brought in contact with moist atmosphere during an RIE step, Applicants envision that another water meniscus can be formed on the side of partially etched wire and could protect the underlying material during a subsequent etch. In an experiment, SiO$_2$ wires fabrication procedure was modified as follows. During first or second RIE etch steps, the etching was stopped after some time (usually, 10 s) and the sample was exposed to moist air outside of RIE chamber. Next, the sample was loaded into RIE chamber again and another etching was performed (FIG. 25). This procedure was repeated up to 4 times in a row. In subsequent etches, "steps" were formed around the area where nanowire should be formed, effectively yielding wider nanowire with stepped walls (FIG. 26).

Example 3

Chemical Fabrication of Nanowires

Without being bound by theory, it is envisioned that the meniscus responsible for nanowires formation could be reacted with water-sensitive molecules and immobilized to yield another kind of nanowires which could be fabricated by this method. In a typical experiment, a Si/SiO$_2$ chip with Au mask patterned in such a way that the future wire position corresponds to the pattern edge was loaded in an airtight chamber. The chamber was then evacuated with mechanical and liquid nitrogen pumps. Next, TiCl$_4$ vapors were introduced into the chamber for 10 minutes. The remaining gas was then flushed with nitrogen. Next, the chamber was heated to 80° C. (to remove excess of adsorbed TiCl$_4$). The sample was then taken out and annealed at 300° C. in air at ambient pressure for 90 minutes. Then Au mask was etched with Au5 wet etchant. This resulted in the formation of TiO$_2$ ribbons that inherit the geometry of the water meniscus. The proposed mechanism for the formation of TiO$_2$ nanowires is illustrated in FIG. 27. SEM images of the formed TiO$_2$ nanowires are shown in FIG. 28. The proposed equation for the fabrication of TiO$_2$ nanowires by chemical conversion of meniscus water is as follows:

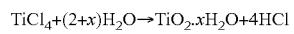

$$TiCl_4 + (2+x)H_2O \rightarrow TiO_2 \cdot xH_2O + 4HCl$$

Without further elaboration, it is believed that one skilled in the art can, using the description herein, utilize the present disclosure to its fullest extent. The embodiments described herein are to be construed as illustrative and not as constraining the remainder of the disclosure in any way whatsoever. While the embodiments have been shown and described, many variations and modifications thereof can be made by one skilled in the art without departing from the spirit and teachings of the invention. Accordingly, the scope of protection is not limited by the description set out above, but is only limited by the claims, including all equivalents of the subject matter of the claims. The disclosures of all patents, patent applications and publications cited herein are hereby incorporated herein by reference, to the extent that they provide procedural or other details consistent with and supplementary to those set forth herein.

What is claimed is:

1. A method of preparing graphene nanoribbons from a graphene film associated with a meniscus, wherein the method comprises:
   patterning the graphene film while the meniscus acts as a mask above a region of the graphene film,
   wherein the meniscus comprises a concave surface, and
   wherein the patterning results in formation of graphene nanoribbons from the meniscus-masked region of the graphene film.

2. The method of claim 1, wherein the meniscus-masked region is located near edges of the graphene film.

3. The method of claim 1, wherein patterning the graphene film separates the meniscus-masked region of the graphene film from the graphene film.

4. The method of claim 1, wherein patterning the graphene film comprises etching the graphene film.

5. The method of claim 4, wherein the etching occurs by a method selected from the group consisting of reactive ion etching, physical sputtering, gas phase chemical etching, and combinations thereof.

6. The method of claim 4, wherein the etching occurs in the presence of one or more gases.

7. The method of claim 6, wherein the one or more gases are selected from the group consisting of CF$_4$, CHF$_3$, SF$_6$, Cl$_2$, BCl$_3$, oxygen, argon, hydrogen, nitrogen, halogens, and combinations thereof.

8. The method of claim 6, wherein atoms from one or more of the gases functionalize edges of the formed graphene nanoribbons.

9. The method of claim 1, wherein the graphene nanoribbons have widths ranging from about 0.5 nm to about 250 nm.

10. The method of claim 1, wherein the meniscus is a liquid selected from the group consisting of water, organic solvents, polymers, salts, and combinations thereof.

11. The method of claim 1, wherein the graphene nanoribbons form by the following steps:

(a) associating a surface with a graphene film;
(b) forming a pattern on the graphene film, wherein the forming of the pattern comprises selectively covering regions of the graphene film with a first protective layer, wherein the selective covering leaves uncovered regions of graphene film on the surface;
(c) etching the uncovered regions of the graphene film on the surface, wherein the etching leads to formation of an etched pattern on the surface, and wherein the etched pattern comprises edges surrounded by graphene film;
(d) depositing a second protective layer on the etched pattern, wherein the second protective layer becomes associated with the graphene film surrounding the edges of the etched pattern;
(e) removing the first protective layer, wherein the removing of the first protective layer leads to formation of the meniscus-masked region between the second protective layer and the graphene film; and
(f) patterning the graphene film on the surface, wherein the patterning retains the meniscus-masked region of the graphene film on the surface, and wherein the meniscus masked region of the graphene film follows the edges of the etched pattern and forms graphene nanoribbons.

12. The method of claim 11, further comprising a step of removing the second protective layer from the surface.

13. The method of claim 12, wherein the second protective layer is removed from the surface by wet etching.

14. The method of claim 11, wherein the associating in step (a) comprises placing a pre-formed graphene film on the surface.

15. The method of claim 11, wherein the associating in step (a) comprises forming a graphene film on the surface.

16. The method of claim 15, wherein the graphene film is formed by chemical vapor deposition.

17. The method of claim 11, wherein the surface is a silicon wafer.

18. The method of claim 11, wherein the first protective layer is a polymer selected from the group consisting of poly(methacrylates), poly(esters), poly(ethers), poly(olefins), poly(styrenes), and combinations thereof.

19. The method of claim 11, wherein the first protective layer is poly(methyl methacrylate) (PMMA).

20. The method of claim 11, wherein the etching occurs by reactive ion etching.

21. The method of claim 11, wherein the second protective layer is a metal layer.

22. The method of claim 21, wherein the metal layer is selected from the group consisting of Pd, Pt, Cr, Al, Au, and combinations thereof.

23. The method of claim 11, wherein the second protective layer becomes associated with the graphene film surrounding the edges of the etched pattern through direct contact with the graphene film.

24. The method of claim 11, wherein the patterning of the graphene film occurs by etching.

25. The method of claim 11, wherein the patterning of the graphene film occurs by reactive ion etching.

26. A method of preparing wires from a film associated with a meniscus, wherein the method comprises:
patterning the film while the meniscus acts as a mask above a region of the film,
wherein the meniscus comprises a concave surface, and
wherein the patterning results in formation of a wire from the meniscus-masked region of the film.

27. The method of claim 26, wherein the meniscus-masked region is located near edges of the film.

28. The method of claim 26, wherein patterning the film separates the meniscus-masked region of the film from the film.

29. The method of claim 26, wherein patterning the film comprises etching the film.

30. The method of claim 29, wherein the etching occurs by a method selected from the group consisting of reactive ion etching, physical sputtering, gas phase chemical etching, and combinations thereof.

31. The method of claim 26, wherein the film is a metallic film.

32. The method of claim 26, wherein the film is selected from the group consisting of W, Au, Al, Cr, Pt, Cu, Ni, Si, TiN, $WS_2$, $WSe_2$, $MoS_2$, BN, GaN, AN, $TiO_2$, ZnO, $SiO_2$, $SiO_x$ (where x is less than 2 and greater than 0.5), and combinations thereof.

33. The method of claim 26, wherein the formed wire is a metal wire.

34. The method of claim 26, wherein the formed wire has a width ranging from about 5 nm to about 100 nm.

35. The method of claim 26, wherein the wires form by the following steps:
(a) associating a surface with a film;
(b) forming a pattern on the film, wherein the forming of the pattern comprises selectively covering regions of the film with a first protective layer, wherein the selective covering leaves uncovered regions of film on the surface;
(c) etching the uncovered regions of the film on the surface, wherein the etching leads to formation of an etched pattern on the surface, and wherein the etched pattern comprises edges surrounded by film;
(d) depositing a second protective layer on the etched pattern, wherein the second protective layer becomes associated with the film surrounding the edges of the etched pattern;
(e) removing the first protective layer, wherein the removing of the first protective layer leads to formation of the meniscus-masked region between the second protective layer and the film; and
(f) patterning the film on the surface, wherein the patterning retains the meniscus-masked region of the film on the surface, wherein the meniscus-masked region of the film represents the formed wire, and wherein the formed wire follows the edges of the etched pattern.

36. The method of claim 35, further comprising a step of removing the second protective layer from the surface.

37. The method of claim 36, wherein the second protective layer is removed from the surface by wet etching.

38. The method of claim 35, wherein the surface is a silicon wafer.

39. The method of claim 35, wherein the first protective layer is a polymer selected from the group consisting of poly(methacrylates), poly(esters), poly(ethers), poly(olefins), poly(styrenes), and combinations thereof.

40. The method of claim 35, wherein the first protective layer is poly(methyl methacrylate) (PMMA).

41. The method of claim 35, wherein the etching occurs by a method selected from the group consisting of reactive ion etching, physical sputtering, gas phase chemical etching, and combinations thereof.

42. The method of claim 35, wherein the etching occurs by reactive ion etching.

43. The method of claim 35, wherein the second protective layer is a metal layer.

44. The method of claim 43, wherein the metal layer is selected from the group consisting of Pd, Pt, Cr, Al, Au, and combinations thereof.

45. The method of claim 35, wherein the patterning of the film occurs by etching.

46. The method of claim 35, wherein the patterning of the film occurs by reactive ion etching.

47. The method of claim 35, wherein the patterning of the film is repeated a plurality of times to result in formation of a wire with a step-wise gradient.

48. The method of claim 35, wherein the wire comprises an element selected from the group consisting of W, Au, Pt, Si, $SiO_2$, and combinations thereof.

49. A method of preparing wires, wherein the method comprises:
 (a) depositing a hydrophilic material on a surface, wherein the hydrophilic material comprises a metal, and wherein the depositing leads to formation of a hydrophilic layer on the surface;
 (b) exposing the surface to a water-reactive material, wherein the exposing results in formation of a second layer that follows edges of the hydrophilic layer on the surface, and wherein the second layer represents the formed wire.

50. The method of claim 49, wherein the metal is selected from the group consisting of Pd, Pt, Cr, Al, Au, and combinations thereof.

51. The method of claim 49, wherein the hydrophilic layer is a metal layer.

52. The method of claim 51, wherein the metal layer is selected from the group consisting of Pd, Pt, Cr, Al, Au, and combinations thereof.

53. The method of claim 49, wherein the water-reactive material is selected from the group consisting of W, Au, Pt, Ti, $TiCl_4$, Si, $SiO_2$, Zn, and combinations thereof.

54. The method of claim 49, wherein the water-reactive material is $TiCl_4$.

55. The method of claim 49, further comprising a step of annealing the surface, wherein the annealing solidifies the wire.

56. The method of claim 55, wherein the annealing occurs at temperatures of at least about 100° C.

57. The method of claim 55, wherein the annealing occurs at about 300° C.

58. The method of claim 49, further comprising a step of removing the hydrophilic layer from the surface.

59. The method of claim 58, wherein the hydrophilic layer is removed from the surface by wet etching.

60. The method of claim 49, wherein the surface is a silicon wafer.

61. The method of claim 49, wherein the formed wire has a composition selected from the group consisting of W, Au, Pt, Ti, $TiCl_4$, Si, $SiO_2$, Zn, and combinations thereof.

62. The method of claim 49, wherein the formed wire has widths ranging from about 5 nm to about 100 nm.

63. The method of claim 49, wherein the hydrophilic material is $TiCl_4$, and wherein the formed wire is $TiO_2$.

* * * * *